(12) United States Patent
Yamazaki et al.

(10) Patent No.: US 12,382,669 B2
(45) Date of Patent: *Aug. 5, 2025

(54) MANUFACTURING METHOD OF SEMICONDUCTOR DEVICE INCLUDING MULITPLE OXIDES

(71) Applicant: SEMICONDUCTOR ENERGY LABORATORY CO., LTD., Atsugi (JP)

(72) Inventors: Shunpei Yamazaki, Tokyo (JP); Naoki Okuno, Kanagawa (JP); Tetsuya Kakehata, Kanagawa (JP); Hiroki Komagata, Kanagawa (JP); Yuji Egi, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/613,772

(22) Filed: Mar. 22, 2024

(65) Prior Publication Data

US 2024/0266222 A1    Aug. 8, 2024

Related U.S. Application Data

(63) Continuation of application No. 17/979,807, filed on Nov. 3, 2022, now Pat. No. 11,942,370, which is a
(Continued)

(30) Foreign Application Priority Data

Sep. 5, 2018   (JP) .................................. 2018-166318

(51) Int. Cl.
*H10D 30/67* (2025.01)
*H01L 21/02* (2006.01)
(Continued)

(52) U.S. Cl.
CPC .... *H10D 30/6757* (2025.01); *H01L 21/02274* (2013.01); *H01L 21/0228* (2013.01);
(Continued)

(58) Field of Classification Search
CPC ........... H01L 21/02274; H01L 21/0228; H01L 21/02554; H01L 21/02565;
(Continued)

(56) References Cited

U.S. PATENT DOCUMENTS 8,241,949 B2    8/2012  Miyanaga
8,952,378 B2    2/2015  Miyanaga
(Continued)

FOREIGN PATENT DOCUMENTS

CN    103339733 A    10/2013
EP      2669951 A    12/2013
(Continued)

OTHER PUBLICATIONS

International Search Report (Application No. PCT/IB2019/057308) Dated Nov. 26, 2019.
(Continued)

*Primary Examiner* — Cheung Lee
(74) *Attorney, Agent, or Firm* — Fish & Richardson P.C.

(57) ABSTRACT

A manufacturing method of a semiconductor device includes the forming a first oxide over a substrate; depositing a first insulator over the first oxide; forming an opening reaching the first oxide in the first insulator; depositing a first oxide film in contact with the first oxide and the first insulator in the opening; depositing a first insulating film over the first oxide film by a PEALD method; depositing a first conductive film over the first insulating film; and removing part of the first oxide film, part of the first insulating film, and part of the first conductive film until a top surface of the first insulator is exposed to form a second oxide, a second
(Continued)

insulator, and a first conductor. The deposition of the first insulating film is performed while the substrate is heated to higher than or equal to 300°.

11 Claims, 26 Drawing Sheets

Related U.S. Application Data continuation of application No. 17/271,716, filed as application No. PCT/IB2019/057308 on Aug. 30, 2019, now Pat. No. 11,508,850.

(51) Int. Cl.
*H10D 84/01* (2025.01)
*H10D 84/03* (2025.01)
*H10D 99/00* (2025.01)
*H10D 30/01* (2025.01)

(52) U.S. Cl.
CPC ....... *H01L 21/02565* (2013.01); *H10D 30/67* (2025.01); *H10D 84/0128* (2025.01); *H10D 84/038* (2025.01); *H10D 99/00* (2025.01); *H10D 30/031* (2025.01)

(58) Field of Classification Search
CPC ....... H01L 21/02631; H01L 21/823412; H01L 21/823437; H01L 27/1225; H01L 29/66742; H01L 29/66969; H01L 29/786; H01L 29/78648; H01L 29/7869; H01L 29/78696; H10B 12/05; H10B 41/70; H10D 30/501–509; H10D 30/674; H10D 30/6757; H10D 84/01; H10D 84/0128; H10D 84/038; H10D 30/6755
See application file for complete search history.

(56) References Cited

U.S. PATENT DOCUMENTS

| | | |
|---|---|---|
| 9,230,799 B2 | 1/2016 | Teramoto et al. |
| 9,882,059 B2 | 1/2018 | Yamazaki. et al. |
| 9,882,061 B2 | 1/2018 | Yamazaki. et al. |
| 10,256,291 B2 | 4/2019 | Miyanaga |
| 10,374,097 B2 | 8/2019 | Yamazaki et al. |
| 10,944,014 B2 | 3/2021 | Yamazaki et al. |
| 2011/0250748 A1 | 10/2011 | Fukuda et al. |
| 2014/0367699 A1 | 12/2014 | Teramoto et al. |
| 2015/0179803 A1 | 6/2015 | Yamazaki et al. |
| 2016/0172500 A1* | 6/2016 | Yamazaki ........... H01L 27/1225 257/43 |
| 2016/0276487 A1 | 9/2016 | Yamazaki et al. |
| 2017/0271516 A1 | 9/2017 | Onuki et al. |
| 2018/0151704 A1 | 5/2018 | Chen et al. |

FOREIGN PATENT DOCUMENTS

| | | |
|---|---|---|
| JP | 2011-040731 A | 2/2011 |
| JP | 2011-151383 A | 8/2011 |
| JP | 2012-156245 A | 8/2012 |
| JP | 2012-257187 A | 12/2012 |
| JP | 2015-135961 A | 7/2015 |
| JP | 2016-184635 A | 10/2016 |
| JP | 2016-219761 A | 12/2016 |
| JP | 2016-225602 A | 12/2016 |
| JP | 2017-174489 A | 9/2017 |
| KR | 2015-0072345 A | 6/2015 |
| KR | 2017-0108832 A | 9/2017 |
| TW | 201251005 | 12/2012 |
| TW | 201528510 | 7/2015 |
| TW | 201803131 | 1/2018 |
| WO | WO-2011/007682 | 1/2011 |
| WO | WO-2012/102237 | 8/2012 |

OTHER PUBLICATIONS

Written Opinion (Application No. PCT/IB2019/057308) Dated Nov. 26, 2019.
Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.
Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10, The Japan Society of Applied Physics.
International Search Report (Application No. PCT/IB2019/057133) Dated Nov. 19, 2019.
Written Opinion (Application No. PCT/IB2019/057133) Dated Nov. 19, 2019.

* cited by examiner

MANUFACTURING METHOD OF SEMICONDUCTOR DEVICE INCLUDING MULITPLE OXIDES

CROSS REFERENCE TO RELATED APPLICATIONS

This application is a continuation of U.S. application Ser. No. 17/979,807, filed Nov. 3, 2022, now allowed, which is incorporated by reference and is a continuation of U.S. application Ser. No. 17/271,716, filed Feb. 26, 2021, now U.S. Pat. No. 11,508,850, which is incorporated by reference and is a U.S. National Phase Application under 35 U.S.C. § 371 of International Application PCT/IB2019/057308, filed on Aug. 30, 2019, which is incorporated by reference and claims the benefit of a foreign priority application filed in Japan on Sep. 5, 2018, as Application No. 2018-166318.

TECHNICAL FIELD

One embodiment of the present invention relates to a semiconductor device and a method for manufacturing the semiconductor device. Alternatively, one embodiment of the present invention relates to a semiconductor wafer, a module, and an electronic device.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. It can be sometimes said that a display device (a liquid crystal display device, a light-emitting display device, and the like), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter.

BACKGROUND ART

In recent years, semiconductor devices have been developed and an LSI, a CPU, and a memory are mainly used. A CPU is an aggregation of semiconductor elements each provided with an electrode that is a connection terminal, which includes a semiconductor integrated circuit (including at least a transistor and a memory) separated from a semiconductor wafer.

A semiconductor circuit (IC chip) of LSIs, CPUs, memories, and the like is mounted on a circuit board, for example, a printed wiring board, to be used as one of components of a variety of electronic devices.

In addition, a technique for forming a transistor by using a semiconductor thin film formed over a substrate having an insulating surface has attracted attention. The transistor is used in a wide range of electronic devices such as an integrated circuit (IC) and an image display device (also simply referred to as a display device). A silicon-based semiconductor material is widely known as a material for a semiconductor thin film that can be used in a transistor, and as another material, an oxide semiconductor has attracted attention.

It is known that a transistor using an oxide semiconductor has an extremely low leakage current in a non-conduction state. For example, a low-power-consumption CPU utilizing a characteristic of a low leakage current of the transistor using an oxide semiconductor is disclosed (see Patent Document 1). Furthermore, a memory device that can retain stored contents for a long time by utilizing a characteristic of a low leakage current of a transistor using an oxide semiconductor has been disclosed, for example (see Patent Document 2).

In recent years, demand for an integrated circuit with higher density has risen with reductions in size and weight of electronic devices. Furthermore, the productivity of a semiconductor device including an integrated circuit is required to be improved.

REFERENCE

Patent Document

[Patent Document 1] Japanese Published Patent Application No. 2012-257187

[Patent Document 2] Japanese Published Patent Application No. 2011-151383

SUMMARY OF THE INVENTION

Problems to be Solved by the Invention

An object of one embodiment of the present invention is to provide a semiconductor device having favorable electrical characteristics. Another object of one embodiment of the present invention is to provide a semiconductor device having normally-off electrical characteristics. Another object of one embodiment of the present invention is to provide a semiconductor device having favorable reliability. Another object of one embodiment of the present invention is to provide a semiconductor device with a high on-state current. Another object of one embodiment of the present invention is to provide a semiconductor device having excellent frequency characteristics. Another object of one embodiment of the present invention is to provide a semiconductor device that can be miniaturized or highly integrated. Another object of one embodiment of the present invention is to provide a semiconductor device with high productivity.

Another object of one embodiment of the present invention is to provide a semiconductor device capable of retaining data for a long time. Another object of one embodiment of the present invention is to provide a semiconductor device capable of high-speed data writing. Another object of one embodiment of the present invention is to provide a semiconductor device with high design flexibility. Another object of one embodiment of the present invention is to provide a semiconductor device in which power consumption can be reduced. Another object of one embodiment of the present invention is to provide a novel semiconductor device.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

One embodiment of the present invention is a manufacturing method of a semiconductor device including a first conductor, first and second insulators, and first and second oxides, which includes the steps of forming the first oxide over a substrate; depositing the first insulator over the first oxide; forming an opening reaching the first oxide in the first insulator; depositing a first oxide film in contact with the first oxide and the first insulator in the opening; depositing a first insulating film over the first oxide film by a PEALD method; depositing a first conductive film over the first insulating film; and removing part of the first oxide film, part of the first insulating film, and part of the first conductive film until a top surface of the first insulator is exposed to form the second oxide, the second insulator, and the first conductor. The deposition of the first insulating film is performed while the substrate is heated to higher than or equal to 300° C., and a step of introducing a first gas containing silicon into a chamber and a step of introducing a second gas that contains oxygen radicals and does not contain hydrogen atoms into the chamber are included.

Furthermore, the first oxide, the first oxide film, and the first insulator are preferably irradiated with a microwave in the step of introducing the second gas.

Another embodiment of the present invention is a manufacturing method of a semiconductor device including a first conductor, first and second insulators, and first and second oxides, which includes the steps of forming the first oxide over a substrate; depositing the first insulator over the first oxide; forming an opening reaching the first oxide in the first insulator; depositing a first oxide film in contact with the first oxide and the first insulator in the opening; depositing a first insulating film over the first oxide film by a thermal ALD method; depositing a first conductive film over the first insulating film; and removing part of the first oxide film, part of the first insulating film, and part of the first conductive film until a top surface of the first insulator is exposed to form the second oxide, the second insulator, and the first conductor. The deposition of the first insulating film is performed while the substrate is heated to higher than or equal to 350° C., and a step of introducing a first gas containing silicon into a chamber and a step of introducing a second gas that contains at least one of ozone and oxygen and does not contain hydrogen atoms into the chamber are included.

In the above, the first oxide, the first oxide film, and the first insulator are preferably irradiated with a microwave before the first insulating film is deposited. In the above, plasma treatment is preferably performed on the first oxide, the first oxide film, and the first insulator in an atmosphere containing oxygen before the first insulating film is deposited.

In the above, it is preferable that after the second oxide, the second insulator, and the first conductor are formed, a third insulator be further deposited over the first insulator, the second oxide, the second insulator, and the first conductor, and a silicon nitride film be deposited over the third insulator by a PEALD method. In the above, the first oxide, the second oxide, and the first insulator are preferably irradiated with a microwave before the silicon nitride film is deposited.

Effect of the Invention

According to one embodiment of the present invention, a semiconductor device having favorable electrical characteristics can be provided. Alternatively, according to one embodiment of the present invention, a semiconductor device having normally-off electrical characteristics can be provided. Alternatively, according to one embodiment of the present invention, a semiconductor device having favorable reliability can be provided. Alternatively, according to one embodiment of the present invention, a semiconductor device with a high on-state current can be provided. Alternatively, according to one embodiment of the present invention, a semiconductor device having excellent frequency characteristics can be provided. Alternatively, according to one embodiment of the present invention, a semiconductor device that can be miniaturized or highly integrated can be provided. Alternatively, according to one embodiment of the present invention, a semiconductor device with high productivity can be provided.

Alternatively, a semiconductor device capable of retaining data for a long time can be provided. Alternatively, a semiconductor device capable of high-speed data writing can be provided. Alternatively, a semiconductor device having high design flexibility can be provided. Alternatively, a semiconductor device in which power consumption can be reduced can be provided. Alternatively, a novel semiconductor device can be provided.

Note that the descriptions of the effects do not disturb the existence of other effects. One embodiment of the present invention does not have to have all these effects. Other effects are apparent from the description of the specification, the drawings, the claims, and the like, and other effects can be derived from the description of the specification, the drawings, the claims, and the like.

BRIEF DESCRIPTION OF THE DRAWINGS

FIG. 24A to FIG. 24F are diagrams illustrating electronic devices of one embodiment of the present invention.

MODE FOR CARRYING OUT THE INVENTION

Figure 1A:
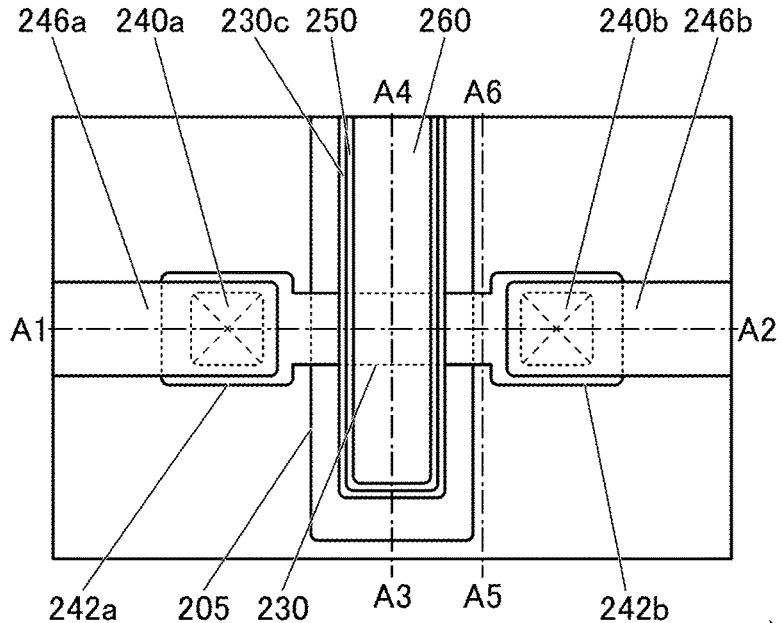
FIG. 1A is a top view of a semiconductor device of one embodiment of the present invention.

Embodiments are described below with reference to the drawings. Note that the embodiments can be implemented with many different modes, and it is readily understood by those skilled in the art that modes and details thereof can be changed in various ways without departing from the spirit and scope thereof. Thus, the present invention should not be interpreted as being limited to the description of the embodiments below.

In the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like shown in the drawings. For example, in an actual manufacturing process, a layer, a resist mask, or the like might be unintentionally reduced in size by treatment such as etching, which might not be reflected in the drawings for easy understanding. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

Furthermore, especially in a top view (also referred to as a plan view), a perspective view, or the like, some components might not be illustrated for easy understanding of the invention. In addition, some hidden lines and the like might not be shown.

The ordinal numbers such as "first" and "second" in this specification and the like are used for convenience and do not denote the order of steps or the stacking order of layers. Therefore, for example, the term "first" can be replaced with the term "second", "third", or the like as appropriate. In addition, the ordinal numbers in this specification and the like do not sometimes correspond to the ordinal numbers that are used to specify one embodiment of the present invention.

In this specification and the like, terms for describing arrangement, such as "over" and "below", are used for convenience to describe the positional relation between components with reference to drawings. The positional relation between components is changed as appropriate in accordance with a direction in which each component is described. Thus, without limitation to terms described in this specification, the description can be changed appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is disclosed in the drawings or the texts.

Here, X and Y each denote an object (e.g., a device, an element, a circuit, a wiring, an electrode, a terminal, a conductive film, or a layer).

Furthermore, functions of a source and a drain might be switched when a transistor of opposite polarity is employed or a direction of current flow is changed in circuit operation, for example. Therefore, the terms "source" and "drain" can sometimes be interchanged with each other in this specification and the like.

Note that in this specification and the like, depending on the transistor structure, a channel width in a region where a channel is actually formed (channel formation region) (hereinafter also referred to as an "effective channel width") is different from a channel width shown in a top view of a transistor (hereinafter also referred to as an "apparent channel width") in some cases. For example, when a gate covers a side surface of a semiconductor, an effective channel width is greater than an apparent channel width, and its influence cannot be ignored in some cases. For example, in a miniaturized transistor having a gate covering a side surface of a semiconductor, the proportion of a channel formation region formed in the side surface of the semiconductor is increased in some cases. In that case, the effective channel width is larger than the apparent channel width.

In such a case, the effective channel width is sometimes difficult to estimate by actual measurement. For example, estimation of an effective channel width from a design value requires assumption that the shape of a semiconductor is known. Accordingly, in the case where the shape of a semiconductor is not known accurately, it is difficult to measure the effective channel width accurately.

In this specification, the simple term "channel width" refers to apparent channel width in some cases. Alternatively, in this specification, the simple term "channel width" refers to effective channel width in some cases. Note that values of channel length, channel width, effective channel width, apparent channel width, and the like can be determined, for example, by analyzing a cross-sectional TEM image and the like.

Note that impurities in a semiconductor refer to, for example, elements other than the main components of a semiconductor. For example, an element with a concentration lower than 0.1 atomic % can be regarded as an impurity. When an impurity is contained, for example, DOS (Density of States) in a semiconductor may be increased or the crystallinity may be decreased. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also serves as an impurity in some cases. Also in the case of an oxide semiconductor, oxygen vacancies are formed by the mixing of impurities, for example. Furthermore, when the semiconductor is silicon, examples of an impurity that changes characteristics of the semiconductor include oxygen, Group 1 elements except hydrogen, Group 2 elements, Group 13 elements, and Group 15 elements.

Note that in this specification and the like, silicon oxynitride is a material that contains more oxygen than nitrogen in its composition. Moreover, silicon nitride oxide is a material that contains more nitrogen than oxygen in its composition.

In this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

In this specification and the like, "parallel" indicates a state where two straight lines are placed at an angle greater than or equal to −10° and less than or equal to 10°. Accordingly, the case where the angle is greater than or equal to −5° and less than or equal to 5° is also included. Furthermore, "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Accordingly, the case where the angle is greater than or equal to 85° and less than or equal to 95° is also included. Moreover, "substantially perpendicular" indicates a state where two straight lines are placed at an angle greater than or equal to 60° and less than or equal to 120°.

Note that in this specification, a barrier film means a film having a function of inhibiting transmission of oxygen and impurities such as water and hydrogen, and the barrier film having conductivity is sometimes referred to as a conductive barrier film.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS FET or an OS transistor can also be referred to as a transistor including an oxide or an oxide semiconductor.

In this specification and the like, "normally off" means that a current per micrometer of channel width flowing through a transistor when a potential is not applied to a gate or a ground potential is applied to the gate is lower than or equal to $1\times10^{-20}$ A at room temperature, lower than or equal to $1\times10^{-18}$ A at 85° C., or lower than or equal to $1\times10^{-16}$ A at 125° C.

Embodiment 1

An example of a semiconductor device including a transistor 200 of one embodiment of the present invention and a manufacturing method thereof are described below.

<Structure Example of Semiconductor Device>

Figure 1C:
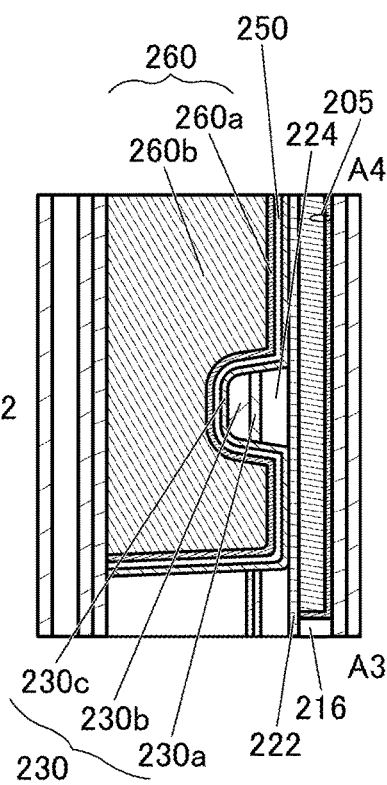
FIG. 1B and FIG. 1C are cross-sectional views of a semiconductor device of one embodiment of the present invention.
Figure 1B:
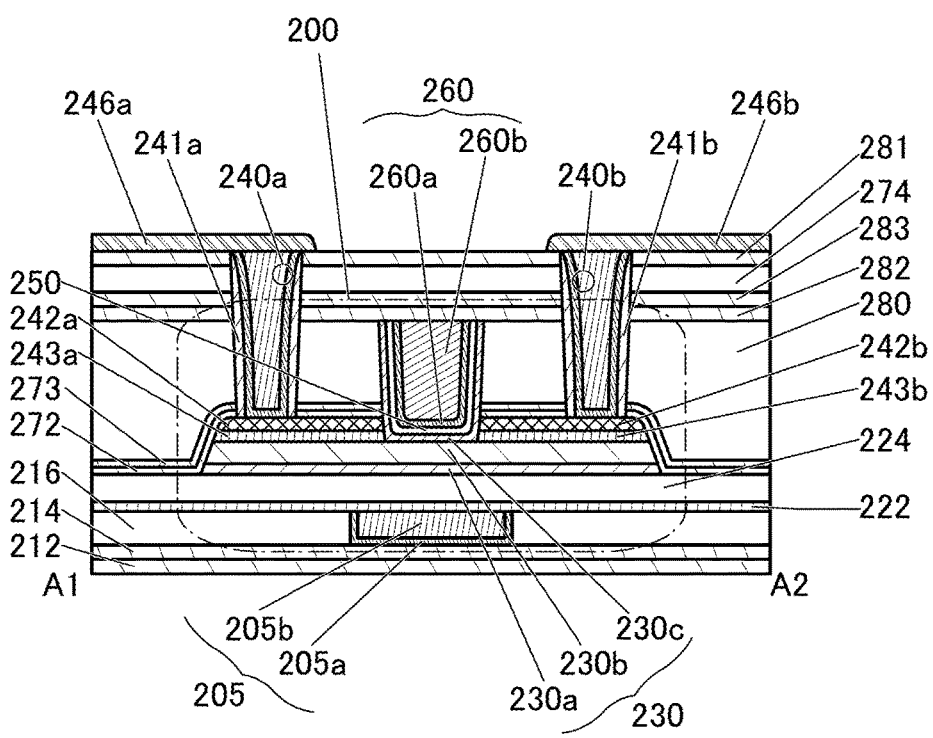

FIG. 1A, FIG. 1B, and FIG. 1C are a top view and cross-sectional views of the transistor 200 of one embodiment of the present invention and the periphery of the transistor 200.

FIG. 1A is a top view of a semiconductor device including the transistor 200. FIG. 1B and FIG. 1C are cross-sectional views of the semiconductor device. Here, FIG. 1B is a cross-sectional view of a portion indicated by the dashed-dotted line A1-A2 in FIG. 1A, and is a cross-sectional view in the channel length direction of the transistor 200. FIG. 1C is a cross-sectional view of a portion indicated by the dashed-dotted line A3-A4 in FIG. 1A, and is a cross-sectional view in the channel width direction of the transistor 200. Note that for clarity of the drawing, some components are not illustrated in the top view of FIG. 1A.

The semiconductor device of one embodiment of the present invention includes an insulator 212 over a substrate (not illustrated), an insulator 214 over the insulator 212, the transistor 200 over the insulator 214, an insulator 280 over the transistor 200, an insulator 282 over the insulator 280, an insulator 283 over the insulator 282, an insulator 274 over the insulator 283, and an insulator 281 over the insulator 274. The insulator 212, the insulator 214, the insulator 280, the insulator 282, the insulator 283, the insulator 274, and the insulator 281 function as interlayer films. A conductor 240 (a conductor 240a and a conductor 240b) that is electrically connected to the transistor 200 and functions as a plug is also included. Note that an insulator 241 (an insulator 241a and an insulator 241b) is provided in contact with a side surface of the conductor 240 functioning as a plug. A conductor 246 (a conductor 246a and a conductor 246b) that is electrically connected to the conductor 240 and functions as a wiring is provided over the insulator 281 and the conductor 240.

The insulator 241a is provided in contact with the inner wall of an opening in an insulator 272, an insulator 273, the insulator 280, the insulator 282, the insulator 283, the insulator 274, and the insulator 281; a first conductor of the conductor 240a is provided in contact with a side surface of the insulator 241a; and a second conductor of the conductor 240a is provided on the inner side thereof. The insulator 241b is provided in contact with the inner wall of an opening in the insulator 272, the insulator 273, the insulator 280, the insulator 282, the insulator 283, the insulator 274, and the insulator 281; a first conductor of the conductor 240b is provided in contact with a side surface of the insulator 241b; and a second conductor of the conductor 240b is provided on the inner side thereof. Here, the level of a top surface of the conductor 240 and the level of a top surface of the insulator 281 can be substantially the same. Note that although the transistor 200 has a structure in which the first conductor of the conductor 240 and the second conductor of the conductor 240 are stacked, the present invention is not limited thereto. For example, the conductor 240 may be provided as a single layer or to have a stacked-layer structure of three or more layers. In the case where a structure body has a stacked-layer structure, layers may be distinguished by ordinal numbers corresponding to the formation order.

[Transistor 200]

As illustrated in FIG. 1, the transistor 200 includes an insulator 216 over the insulator 214; a conductor 205 (a conductor 205a and a conductor 205b) disposed so as to be embedded in the insulator 216; an insulator 222 over the insulator 216 and the conductor 205; an insulator 224 over the insulator 222; an oxide 230a over the insulator 224; an oxide 230b over the oxide 230a; an oxide 243a and an oxide 243b over the oxide 230b; a conductor 242a over the oxide 243a; a conductor 242b over the oxide 243b; an oxide 230c over the oxide 230b; an insulator 250 over the oxide 230c; a conductor 260 (a conductor 260a and a conductor 260b) that is positioned over the insulator 250 and overlaps with the oxide 230c; an insulator 272 in contact with part of a top surface of the insulator 224, a side surface of the oxide 230a, a side surface of the oxide 230b, a side surface of the oxide 243a, a side surface of the oxide 243b, a side surface of the conductor 242a, a top surface of the conductor 242a, a side surface of the conductor 242b, and a top surface of the conductor 242b; and an insulator 273 over the insulator 272. The oxide 230c is in contact with a side surface of the oxide 243a, a side surface of the oxide 243b, a side surface of the conductor 242a, and a side surface of the conductor 242b. The conductor 260 includes the conductor 260a and the conductor 260b, and the conductor 260a is positioned so as to cover a bottom surface and a side surface of the conductor 260b. Here, as illustrated in FIG. 1B, the top surface of the conductor 260 is positioned to be substantially aligned with the top surface of the insulator 250 and the top surface of the oxide 230c. The insulator 282 is in contact with the top surface of each of the conductor 260, the oxide 230c, the insulator 250, and the insulator 280.

It is preferable that the insulator 212, the insulator 214, the insulator 222, the insulator 272, the insulator 273, the insulator 282, the insulator 283, and the insulator 281 have a function of inhibiting diffusion of hydrogen (e.g., at least one of a hydrogen atom, a hydrogen molecule, and the like). In addition, it is preferable that the insulator 212, the insulator 214, the insulator 222, the insulator 272, the insulator 273, the insulator 282, the insulator 283, and the insulator 281 have a function of inhibiting diffusion of oxygen (e.g., at least one of an oxygen atom, an oxygen molecule, and the like). For example, preferably, the insulator 212, the insulator 214, the insulator 222, the insulator 272, the insulator 273, the insulator 282, the insulator 283, and the insulator 281 each have lower permeability of one or both of oxygen and hydrogen than the insulator 224. Preferably, the insulator 212, the insulator 214, the insulator 222, the insulator 272, the insulator 273, the insulator 282, the insulator 283, and the insulator 281 each have lower permeability of one or both of oxygen and hydrogen than the insulator 250. Preferably, the insulator 212, the insulator 214, the insulator 222, the insulator 272, the insulator 273, the insulator 282, the insulator 283, and the insulator 281 each have lower permeability of one or both of oxygen and hydrogen than the insulator 280.

As illustrated in FIG. 1B, the insulator 272 is preferably in contact with the top surface and the side surface of the conductor 242a, the top surface and the side surface of the conductor 242b, the side surface of the oxide 243a, the side surface of the oxide 243b, the side surface of the oxide 230a, the side surface of the oxide 230b, and the top surface of the insulator 224. The insulator 273 is preferably provided over and in contact with the insulator 272. Thus, the insulator 280 is isolated from the insulator 224 and the oxide 230 by the insulator 272 and the insulator 273.

The oxide 230 preferably includes the oxide 230a over the insulator 224, the oxide 230b over the oxide 230a, and the oxide 230c that is placed over the oxide 230b and is at least partly in contact with the top surface of the oxide 230b.

Note that the transistor 200 has a structure in which three layers of the oxide 230a, the oxide 230b, and the oxide 230c are stacked in a channel formation region and its vicinity; however, the present invention is not limited thereto. For example, a single layer of the oxide 230b, a two-layer structure of the oxide 230b and the oxide 230a, a two-layer structure of the oxide 230b and the oxide 230c, or a stacked-layer structure of four or more layers may be provided. For example, a four-layer structure including the oxide 230c with a two-layer structure may be provided. Although the transistor 200 described here has a structure in which the conductor 260 has a stacked-layer structure of two layers, the present invention is not limited thereto. For example, the conductor 260 may have a single-layer structure or a stacked-layer structure of three or more layers.

Here, the conductor 260 functions as a gate of the transistor, and the conductor 242a and the conductor 242b function as a source electrode and a drain electrode. In the transistor 200, the conductor 260 functioning as the gate is formed in a self-aligned manner to fill an opening formed in the insulator 280 and the like. When the conductor 260 is formed in such a manner, the conductor 260 can be surely positioned in a region between the conductor 242a and the conductor 242b without position alignment of the conductor 260.

In the transistor 200, as the oxide 230 (the oxide 230a, the oxide 230b, and the oxide 230c), which includes the channel formation region, a metal oxide functioning as an oxide semiconductor (hereinafter also referred to as an oxide semiconductor) is preferably used. For example, a metal oxide having an energy gap of 2 eV or more, preferably 2.5 eV or more is preferably used as the metal oxide functioning as an oxide semiconductor. With the use of a metal oxide having such a wide energy gap, the leakage current in a non-conduction state (off-state current) of the transistor 200 can be extremely low. With the use of such a transistor, a semiconductor device with low power consumption can be provided.

For example, for the oxide 230, a metal oxide such as an In-M-Zn oxide (an element M is one or more selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. Furthermore, an In-M oxide, an In—Zn oxide, or an M-Zn oxide may be used as the oxide 230.

The oxide 230 includes the oxide 230a, the oxide 230b over the oxide 230a, and the oxide 230c over the oxide 230b. Including the oxide 230a below the oxide 230b makes it possible to inhibit diffusion of impurities into the oxide 230b from the components formed below the oxide 230a. Moreover, including the oxide 230c over the oxide 230b makes it possible to inhibit diffusion of impurities into the oxide 230b from the components formed above the oxide 230c.

Note that the oxide 230 preferably has a stacked-layer structure using oxides that differ in the atomic ratio of metal atoms. Specifically, the atomic proportion of the element M in the constituent elements in the metal oxide used as the oxide 230a is preferably greater than the atomic proportion of the element M in the constituent elements in the metal oxide used as the oxide 230b. Moreover, the atomic ratio of the element M to In in the metal oxide used as the oxide 230a is preferably greater than the atomic ratio of the element M to In in the metal oxide used as the oxide 230b. Furthermore, the atomic ratio of In to the element M in the metal oxide used as the oxide 230b is preferably greater than the atomic ratio of In to the element M in the metal oxide used as the oxide 230a. A metal oxide that can be used as the oxide 230a or the oxide 230b can be used as the oxide 230c.

Specifically, as the oxide 230a, a metal oxide with In:Ga:Zn=1:3:4 [atomic ratio] or 1:1:0.5 [atomic ratio] is used. As the oxide 230b, a metal oxide with In:Ga:Zn=4:2:3 [atomic ratio] or 1:1:1 [atomic ratio] is used. As the oxide 230c, a metal oxide with In:Ga:Zn=1:3:4 [atomic ratio], Ga:Zn=2:1 [atomic ratio], or Ga:Zn=2:5 [atomic ratio] is used. Specific examples of the oxide 230c having a stacked-layer structure include a stacked-layer structure of In:Ga:Zn=4:2:3 [atomic ratio] and In:Ga:Zn=1:3:4 [atomic ratio], a stacked-layer structure of Ga:Zn=2:1 [atomic ratio] and In:Ga:Zn=4:2:3 [atomic ratio], a stacked-layer structure of Ga:Zn=2:5 [atomic ratio] and In:Ga:Zn=4:2:3 [atomic ratio] and, and a stacked-layer structure of gallium oxide and In:Ga:Zn=4:2:3 [atomic ratio].

The oxide 230b preferably has crystallinity. For example, a CAAC-OS (c-axis aligned crystalline oxide semiconductor) described later is preferably used. An oxide having crystallinity, such as a CAAC-OS, has a dense structure with small amounts of impurities and defects (e.g., oxygen vacancies) and high crystallinity. This can inhibit oxygen extraction from the oxide 230b by the source electrode or the drain electrode. This can reduce oxygen extraction from the oxide 230b even when heat treatment is performed; thus, the transistor 200 is stable with respect to high temperatures in a manufacturing process (what is called thermal budget).

The energy of the conduction band minimum of each of the oxide 230a and the oxide 230c is preferably higher than the energy of the conduction band minimum of the oxide 230b. In other words, the electron affinity of each of the oxide 230a and the oxide 230c is preferably smaller than the electron affinity of the oxide 230b.

Here, electron affinity or conduction band minimum Ec can be obtained from an energy gap Eg and an ionization potential Ip, which is a difference between a vacuum level and an energy of valence band maximum Ev. The ionization potential Ip can be measured using, for example, an ultraviolet photoelectron spectroscopy (UPS) apparatus. The energy gap Eg can be measured using, for example, a spectroscopic ellipsometer.

Furthermore, the energy level of the conduction band minimum is gradually varied at junction regions of the oxide 230a, the oxide 230b, and the oxide 230c. In other words, the energy level of the conduction band minimum at the junction regions of the oxide 230a, the oxide 230b, and the oxide 230c is continuously varied or continuously connected. To obtain this, the density of defect states in mixed layers formed at an interface between the oxide 230a and the oxide 230b and an interface between the oxide 230b and the oxide 230c is preferably made low.

Moreover, the oxide 230b serves as a main carrier path. When the oxide 230a and the oxide 230c have the above structure, the density of defect states at the interface between the oxide 230a and the oxide 230b and the interface between the oxide 230b and the oxide 230c can be made low. Thus, the influence of interface scattering on carrier conduction is small, and the transistor 200 can have high on-state current and excellent frequency characteristics.

A transistor using an oxide semiconductor is likely to have normally-on characteristics when the carrier concentration is extremely high with respect to an increase in the gate voltage due to an increase in donor concentration in the channel formation region of the oxide semiconductor. A donor in the oxide semiconductor is formed mainly because hydrogen is trapped by an oxygen vacancy ($V_O$) in the oxide semiconductor. Note that in the following, hydrogen trapped by oxygen vacancies is sometimes referred to as $V_OH$.

Note that it is difficult to quantitatively evaluate $V_OH$ that is physical quantity relating to the donor concentration in the oxide semiconductor. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Furthermore, hydrogen in the oxide semiconductor reacts with oxygen, which is bonded to a metal atom, to be water, and thus forms an oxygen vacancy in some cases. Thus, the number of oxygen vacancies in the oxide semiconductor is increased, and accordingly, $V_OH$ might be increased. Moreover, hydrogen in an oxide semiconductor is easily transferred by a stress such as heat or an electric field; thus, a large amount of hydrogen in an oxide semiconductor might reduce the reliability of a transistor.

As described above, when the hydrogen concentration (H concentration) in the oxide semiconductor becomes high, the transistor is likely to have normally-on characteristics, and thus a semiconductor device having favorable electrical characteristics and reliability cannot be formed.

As illustrated in FIG. 1, in the transistor 200, the insulator 250 is formed on and in contact with the oxide 230. Here, as the insulator 250, an insulator containing silicon, such as silicon oxide, is preferably used. In the case where such an insulator 250 is formed, silicon hydride such as $SiH_4$ is used as a source gas in many cases. When such a source gas is decomposed in deposition, a large amount of hydrogen having high reactivity (e.g., hydrogen radicals) is generated, so that $V_OH$ is formed in the oxide 230 in some cases. Moreover, a large amount of hydrogen is taken in the deposited insulator 250, so that the hydrogen is diffused into the oxide 230 by heat treatment or the like in the step of manufacturing the transistor 200 in some cases. As described above, the hydrogen concentration in the oxide semiconductor might become high due to the deposition step of the gate insulating film.

In contrast, in the transistor 200 described in this embodiment, the gate insulating film (the insulator 250) is deposited by an ALD (Atomic Layer Deposition) method, so that the hydrogen concentration in the channel formation region of the oxide semiconductor can be reduced.

In an ALD method, deposition is performed by introducing a first source gas for reaction (hereinafter referred to as precursors and also referred to as metal precursors) and a second source gas (hereinafter referred to as reactants and also referred to as nonmetal precursors) alternately into a chamber, and repeating the introduction of these source gases. An ALD method makes it possible to deposit a film by a single layer of atoms when deposition is performed by alternate introduction of source gases as described above, using self-regulating characteristics of the atoms. Hence, deposition by an ALD method enables deposition of an extremely thin film, deposition on a component with a large aspect ratio, deposition of a film with a small number of detects such as pinholes, deposition with excellent coverage, and deposition at low temperature.

Note that an ALD method is a method in which deposition is performed through reaction of precursors and reactants using energy of heat or the like. Among ALD methods, an ALD method in which treatment is performed by introducing plasma-excited reactants into a chamber is sometimes referred to as a PEALD (Plasma Enhanced ALD) method. In contrast to the PEALD method, an ALD method in which reaction between the precursors and the reactants is performed using only thermal energy is sometimes referred to as a thermal ALD method.

A mechanism of lowering the hydrogen concentration in the channel formation region of the oxide semiconductor by depositing the insulator 250, which is an oxide containing silicon, over the oxide 230 by an ALD method is described below with reference to FIG. 2 and FIG. 3.

Figure 2:
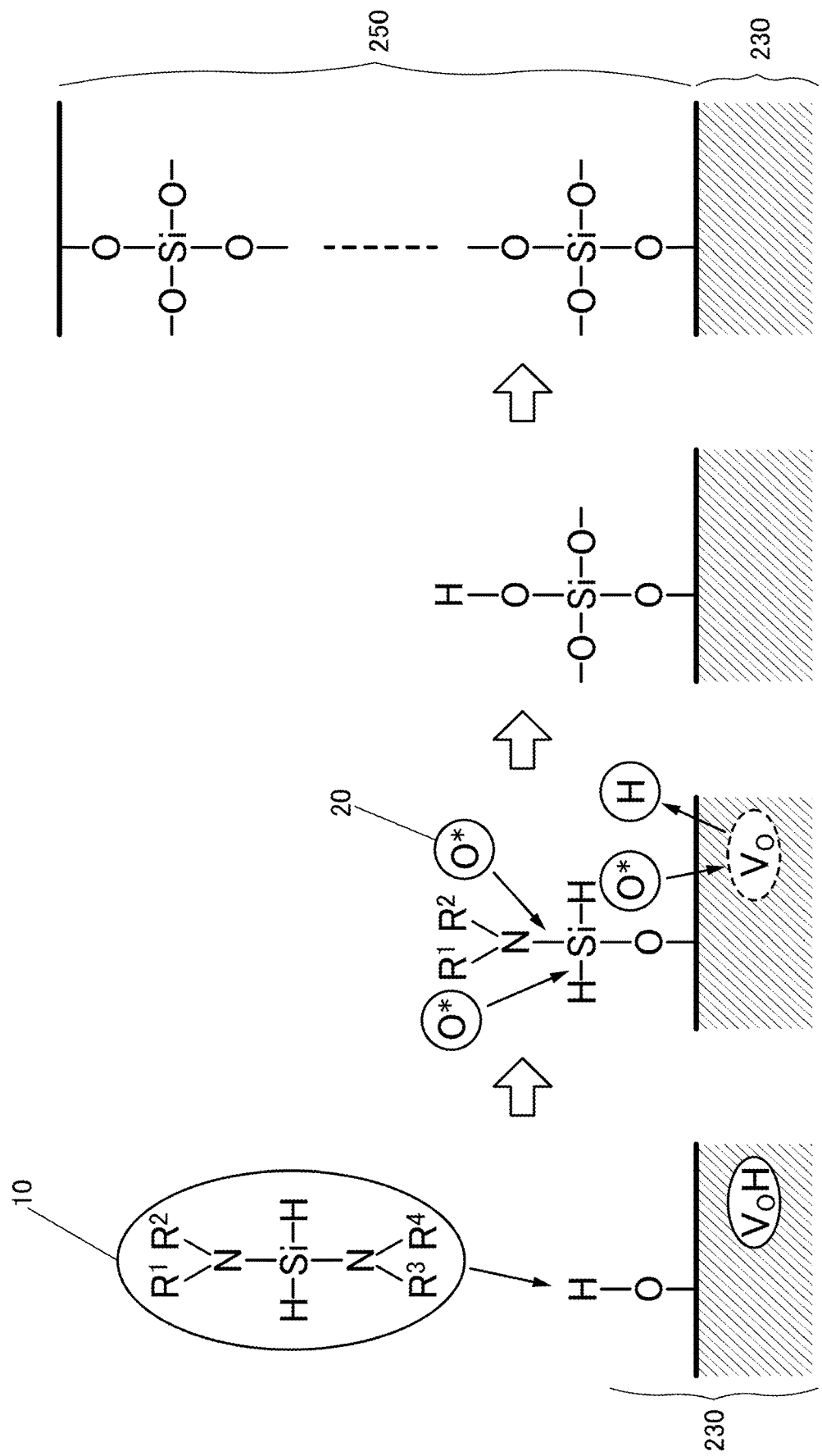
FIG. 2 are cross-sectional views illustrating a model of a manufacturing method of a semiconductor device of one embodiment of the present invention.

First, as illustrated in FIG. 2, precursors 10 are introduced into a chamber as the first source gas. One of amino groups and an OH group of a surface of the oxide 230 react to each other, so that the introduced precursors 10 are adsorbed onto the surface of the oxide 230. When the precursors 10 are adsorbed onto the surface of the oxide 230, the self-limiting mechanism of surface chemical reaction works, and thus, further adsorption of the precursors 10 onto the layer of the precursors 10 on the surface of the oxide 230 does not occur.

By-products ($HNR^3R^4$) released from the precursors 10 due to the above reaction contain hydrogen atoms. However, the by-products are not decomposed by hydrogen radicals or the like having high reactivity because the reaction in the step of introducing the precursors 10 progresses by thermal energy. Thus, in the step of introducing the precursors 10, a large number of hydrogen radicals or the like is not generated in the chamber.

Note that each of $R^1$, $R^2$, $R^3$, and $R^4$ included in the precursor 10 represents a functional group and is hydrogen or a hydrocarbon group such as an alkyl group, for example. Note that $R^1$, $R^2$, $R^3$, and $R^4$ may have different structures; alternatively, two or more of $R^1$, $R^2$, $R^3$, and $R^4$ may have the same structure. Although an aminosilane compound in which Si is bonded to two N is shown as the precursor 10 in FIG. 2; however, the precursor 10 is not limited thereto. The number of N bonded to Si in the precursor 10 may be one or three or more. For example, 2DEAS (Bis(diethylamino) silane), BEMAS (Bis(ethylmethylamino)silane), BTBAS (Bis(tert-butylamino)silane), 3DMAS (Tris(dimethylamino) silane), 4DMAS (Tetrakis(dimethylamino)silane), and the like may be used as the precursors 10. Note that the precursors 10 are not limited to the aminosilane compound, and a compound containing silicon can be selected as appropriate in the range in which the surface chemical reaction having the self-limiting mechanism can be achieved.

During the ALD deposition, the temperature of the substrate over which the transistor 200 is formed is set in a proper range of substrate temperatures at which the self-limiting mechanism of surface chemical reaction works (also referred to as an ALD window). The ALD Window is determined by the temperature characteristics, vapor pressure, decomposition temperature, and the like of the precursors 10 and is set to higher than or equal to 100° C. and lower than or equal to 500° C., preferably higher than or equal to 200° C. and lower than or equal to 400° C.

When the source gases are introduced, an inert gas such as nitrogen ($N_2$) or argon (Ar) may be introduced as a carrier gas with the source gases into the chamber. With the use of the carrier gas, the source gases can be inhibited from being adsorbed onto an inner side of a pipe or an inner side of a valve and can be introduced into the chamber, even in the case where the volatility of the source gases is low or the vapor pressure is low. Furthermore, uniformity of the formed film can be improved. Note that the carrier gas may be introduced during not only the introduction of the source gases but the entire ALD deposition.

Next, an excess number of precursors 10 and the by-products in the chamber are expelled from the chamber (also referred to as a purge). The purge may be performed while the carrier gas is introduced or may be performed by vacuum evacuation without the introduction of the carrier gas.

Next, as illustrated in FIG. 2, reactants 20 are introduced into the chamber as the second source gas. The introduced reactants 20 function as an oxidizer, and thus silicon bonded to the surface of the oxide 230 is oxidized. At this time, the reactants 20 cut Si—H bonds or Si—N bonds but do not cut Si—O bonds. Here, $CO_2$, $H_2O$, NOx, and the like are generated as by-products.

As illustrated in FIG. 2, the reactants 20 oxidize not only silicon on the surface of the oxide 230 but also the oxide 230, and $V_OH$ is released in some cases. Accordingly, oxygen vacancies $V_O$ in the oxide 230 are filled with oxygen, so that the hydrogen concentration in the oxide 230 can be lowered. Furthermore, the atmosphere in the chamber is an oxidizing atmosphere due to the reactants 20, hydrogen released from the oxide 230 is released as $H_2O$ that is the by-products. Note that, although oxygen radicals O* are shown as the reactants 20 in FIG. 2, the reactants 20 are not limited to this.

In the case where the insulator 250 is deposited by a PEALD method, oxygen radicals are used as the reactants 20. Oxygen radicals can be obtained by making an oxygen gas ($O_2$) in a plasma state. Note that in oxygen plasma, oxygen is contained in a state of molecules (e.g., $O_2$ or $O_3$), radicals, ions, or the like. For example, oxygen plasma containing oxygen radicals can be generated by applying a high-frequency wave such as RF (Radio Frequency) or a microwave to an oxygen gas.

The second source gas containing the reactants 20 preferably do not contain hydrogen atoms, molecules containing hydrogen atoms, or the like. When hydrogen atoms and molecules containing hydrogen atoms are exposed to plasma, a large number of hydrogen radicals having high reactivity is generated, so that the atmosphere in the chamber becomes a reduction atmosphere. When the atmosphere in the chamber becomes a reduction atmosphere, oxygen in the oxide 230 is extracted, so that $V_OH$ is formed. Thus, the atmosphere in the chamber is preferably an oxidizing atmosphere due to the reactants 20 containing oxygen radicals.

In the case where the insulator 250 is deposited by a PEALD method, the carrier concentration in the oxide 230 can be lowered by setting the substrate temperature higher than 200° C., preferably higher than or equal to 300° C., further preferably higher than or equal to 350° C. because the reactants 20 have high reactivity. Moreover, when the insulator 250 is deposited at the substrate temperature, an increase in concentration of hydrogen contained in the oxide 230 can be inhibited.

The oxide 230 may be irradiated with a high-frequency wave such as RF or a microwave. Accordingly, as shown in FIG. 2, H can be released from $V_OH$ in the oxide 230. Furthermore, since the atmosphere in the chamber is an oxidizing atmosphere, oxygen vacancies $V_O$ in the oxide 230 can be filled with the reactants 20.

In the case where the insulator 250 is deposited by a thermal ALD method, an ozone gas ($O_3$) is used as the reactants 20. An ozone gas ($O_3$) can be generated using an oxygen gas ($O_2$) as a source material by an ozone generating apparatus. In this case, an ozone gas ($O_3$) and an oxygen gas ($O_2$) are sometimes contained in the reactants 20. As in the PEALD method, the second source gas containing the reactants 20 preferably does not contain hydrogen atoms, molecules containing hydrogen atoms, or the like.

In the case where the insulator 250 is deposited by the thermal ALD method, the carrier concentration in the oxide 230 can be lowered by setting the substrate temperature higher than 300° C., preferably higher than or equal to 350° C. because the reactants 20 have lower reactivity than that in the case of the PEALD method. Moreover, when the insulator 250 is deposited at the substrate temperature, an increase in concentration of hydrogen contained in the oxide 230 can be inhibited.

Next, a purge is performed, so that an excess number of reactants 20 and by-products such as $CO_2$, $H_2O$, and $NO_x$ in the chamber are expelled from the chamber. The purge may be performed while the carrier gas is introduced or may be performed by vacuum evacuation without the introduction of the carrier gas. In such a manner, a single layer of silicon oxide can be formed on the surface of the oxide 230 as shown in FIG. 2.

By introducing the precursors 10 and introducing the reactants 20 while a purge is performed therebetween in a similar manner, one more single layer of silicon oxide can be deposited. By repeating introduction of the precursors 10 and introduction of the reactants 20 while purges are performed therebetween in a similar manner, a single layer of silicon oxide can be deposited one by one. This cycle is repeated a plurality of times until the film has a desirable thickness, so that the insulator 250 can be formed over the oxide 230 as shown in FIG. 2.

The thickness of the insulator 250, which functions as a gate insulating film of the miniaturized transistor 200, needs to be extremely small (e.g., approximately 5 nm to 30 nm) and have a small variation. Regarding this, the thickness of the insulator 250 can be adjusted by the number of times of repeating the cycle and thus, a precise thickness adjustment is possible. Thus, the accuracy of the gate insulating film required by the miniaturized transistor 200 can be achieved. Furthermore, as illustrated in FIG. 1, the insulator 250 needs to be formed on a bottom surface and a side surface of the opening formed in the insulator 280 and the like so as to have favorable coverage. One single layer of silicon oxide can be deposited one by one on the bottom surface and the side surface of the opening as shown in FIG. 2, whereby the insulator 250 can be formed in the opening with favorable coverage.

For example, in the case where the insulator 250 is deposited by a PECVD (Plasma Enhanced CVD) method, silicon hydride such as $SiH_4$ is decomposed in plasma, a large number of hydrogen radicals is generated. Oxygen in the oxide 230 is extracted by reduction reaction of hydrogen radicals to form $V_OH$, so that the hydrogen concentration in the oxide 230 increases. However, as described in this embodiment, when the insulator 250 is deposited by an ALD method, hydrogen radicals are hardly generated in both of the introduction of the precursors 10 and the introduction of the reactants 20. Thus, the use of the ALD method for depositing the gate insulating film inhibits an increase in hydrogen concentration in the oxide semiconductor. Accordingly, the carrier concentration in the oxide semiconductor can be lower than or equal to $1.0 \times 10^{16}/cm^3$, preferably lower than $1.0 \times 10^{13}/cm^3$. A transistor using such an oxide semiconductor can have normally-off characteristics, and a semiconductor device having favorable electrical characteristics and reliability can be formed.

Figure 3:
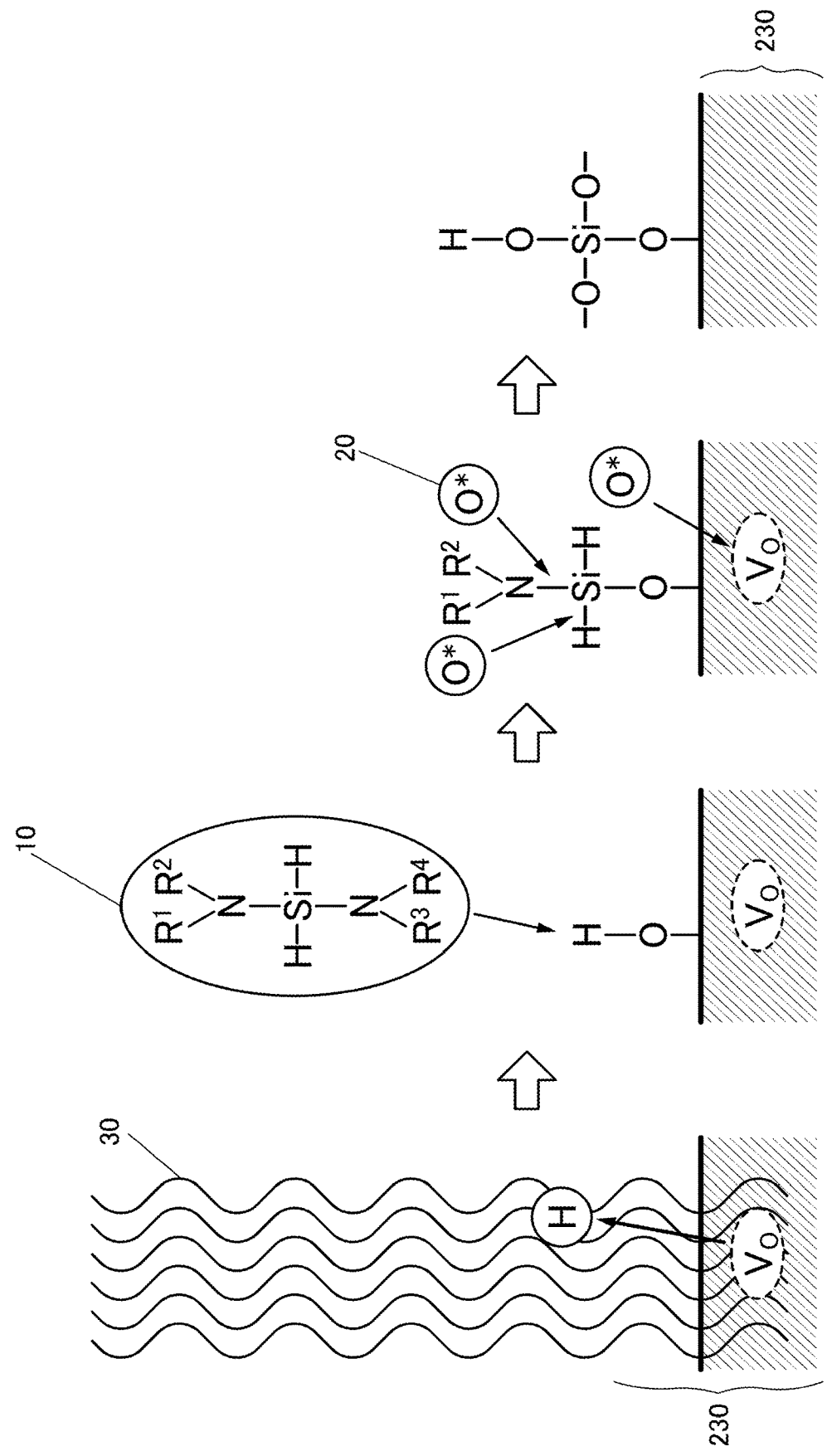
FIG. 3 are cross-sectional views illustrating a model of a manufacturing method of a semiconductor device of one embodiment of the present invention.

Furthermore, before the introduction of the precursors 10, the oxide 230 may be irradiated with an electromagnetic wave 30 as shown in FIG. 3. Here, as the electromagnetic wave 30, a microwave or a high-frequency wave such as RF is used. The emitted electromagnetic wave 30 penetrates into the oxide 230, $V_OH$ in the oxide 230 is divided, so that hydrogen H is removed from the oxide 230 and oxygen vacancies $V_O$ remain in the oxide 230. Thus is, a reaction "$V_OH \rightarrow H\uparrow + V_O$" occurs in the oxide 230, so that the hydrogen concentration in the oxide 230 is lowered. Some hydrogen H generated at this time is bonded to oxygen to be $H_2O$, and removed from the oxide 230 in some cases. Some hydrogen H is trapped by the conductor 242 (also referred to as gettering) in some cases.

Next, as illustrated in FIG. 3, the introduction of the precursors 10 is performed in a manner similar to the above, and then a purge is performed.

Next, as illustrated in FIG. 3, the introduction of the reactants 20 is performed in a manner similar to the above. Here, the oxygen vacancies $V_O$ in the oxide 230 can be filled with the reactants 20 (e.g., oxygen radicals). Thus, by the method shown in FIG. 3, the hydrogen concentration in the oxide 230 can be lowered and oxygen vacancies that are sources of forming $V_OH$ can be reduced.

In the case where the reactants 20 are introduced by a PEALD method, the oxide 230 may be irradiated with a microwave or a high-frequency wave such as RF that is applied to make an oxygen gas ($O_2$) or an ozone gas ($O_3$) in a plasma state. Accordingly, an effect similar to the irradiation of the electromagnetic wave 30 shown in FIG. 3 can be obtained, and thus the introduction of the reactants 20 and removal of $V_OH$ can be performed concurrently. Note that in the step of introducing the reactants 20 shown in FIG. 2, similarly, the oxide 230 may be irradiated with the electromagnetic wave 30 (a microwave or a high-frequency wave such as RF).

Hereinafter, the insulator 250 can be deposited over the oxide 230 by a method similar to the method shown in FIG. 2.

$V_OH$ functioning as a donor in the oxide semiconductor can be reduced as described above, so that the carrier concentration in the oxide semiconductor can be lower than or equal to $1.0\times10^{16}/cm^3$, preferably lower than $1.0\times10^{13}/cm^3$. A transistor using such an oxide semiconductor can have normally-off characteristics, and thus a semiconductor device having favorable electrical characteristics and reliability can be formed.

Note that although the introduction of the reactants 20 and the removal of oxygen vacancies $V_O$ are performed at the same time in FIG. 3, this embodiment is not limited to this. Oxygen radicals may be formed by making an oxygen gas in a plasma state by the electromagnetic wave 30 at the time of the irradiation of the electromagnetic wave 30 shown in FIG. 3. That is, at the same time as the irradiation of the electromagnetic wave 30, plasma treatment may be performed in an atmosphere containing oxygen. Oxygen vacancies $V_O$ in the oxide 230 that are formed by the irradiation of the electromagnetic wave 30 can be filled with the formed oxygen radicals. Accordingly, with the irradiation of the electromagnetic wave 30, $V_OH$ and oxygen vacancies $V_O$ in the oxide 230 can be reduced.

For making oxygen in a plasma state, an apparatus including a power source for generating high-density plasma using a microwave is preferably used, for example. Alternatively, a power source may be provided to apply RF to the substrate side. The use of high-density plasma enables high-density oxygen radicals to be produced, and RF application to the substrate side allows the oxygen radicals generated by the high-density plasma to be efficiently introduced into the oxide 230.

Note that although the introduction of the precursors 10 is performed before the introduction of the reactants 20 in the steps shown in FIG. 2 and FIG. 3; however, this embodiment is not limited to this. For example, the introduction of the reactants 20 may be performed before the introduction of the precursors 10 shown in FIG. 2 and FIG. 3. As another example, the introduction of the reactants 20 and the purge may be repeated a plurality of times before the introduction of the precursors 10. With such a structure, a larger amount of oxygen can be supplied to the oxide 230 that is a base of the insulator 250. A semiconductor device formed by such a method can have favorable characteristics and obtain high reliability.

In addition, although the structure in which one-time introduction of the precursors 10 and one-time introduction of the reactants 20 are repeated is shown in the steps shown in FIG. 2 and FIG. 3, this embodiment is not limited to this. For example, in the cycle shown in each of FIG. 2 and FIG. 3, the introduction of the reactants 20 and the purge may be repeated a plurality of times. In the case where the introduction of the reactants 20 and the purge are repeated a plurality of times, the repeatedly introduced reactants 20 are not necessarily the same kind.

In this manner, the introduction of the reactants 20 and the purge in the chamber are repeated a plurality of times in a short time, whereby excess hydrogen atoms, carbon atoms, chlorine atoms, and the like can be more certainly removed from the precursors adsorbed onto the surface of the oxide 230 and released to the outside of the chamber. Hydrogen atoms are not taken in the oxide 230 and the insulator 250 during deposition in such a manner, so that the hydrogen concentration in the oxide 230 can be lowered.

As illustrated in FIG. 1B, the oxide 243 (the oxide 243a and the oxide 243b) may be positioned between the oxide 230b and the conductor 242 (the conductor 242a and the conductor 242b) which functions as the source electrode or the drain electrode. This structure in which the conductor 242 and the oxide 230 are not in contact with each other can inhibit the conductor 242 from absorbing oxygen in the oxide 230. That is, preventing oxidation of the conductor 242 can inhibit the decrease in conductivity of the conductor 242. Thus, the oxide 243 preferably has a function of inhibiting oxidation of the conductor 242.

Accordingly, the oxide 243 preferably has a function of inhibiting transmission of oxygen. It is preferable to provide the oxide 243 having a function of inhibiting transmission of oxygen between the oxide 230b and the conductor 242, which functions as the source electrode and the drain electrode, in which case the electrical resistance between the conductor 242 and the oxide 230b is reduced. Such a structure improves the electrical characteristics of the transistor 200 and the reliability of the transistor 200.

A metal oxide containing the element M may be used as the oxide 243. In particular, aluminum, gallium, yttrium, or tin is preferably used as the element M. The concentration of the element M in the oxide 243 is preferably higher than that in the oxide 230b. Alternatively, gallium oxide may be used as the oxide 243. A metal oxide such as an In-M-Zn oxide may be used as the oxide 243. Specifically, the atomic ratio of the element M to In in the metal oxide used as the oxide 243 is preferably greater than the atomic ratio of the element M to In in the metal oxide used as the oxide 230b. The thickness of the oxide 243 is preferably larger than or equal to 0.5 nm and smaller than or equal to 5 nm, further preferably larger than or equal to 1 nm and smaller than or equal to 3 nm. The oxide 243 preferably has crystallinity. In the case where the oxide 243 has crystallinity, release of oxygen from the oxide 230 can be favorably suppressed. When the oxide 243 has a hexagonal crystal structure, for example, release of oxygen from the oxide 230 can sometimes be inhibited.

Note that the oxide 243 is not necessarily provided. For example, in the case where the oxidization of the conductor 242 is inhibited and the conductivity of the conductor 242 is sufficiently high even when the conductor 242 is in contact with the oxide 230b, the conductor 242a and the conductor 242b may be provided on and in contact with the oxide 230b without the oxide 243 being provided.

As illustrated in FIG. 1B and FIG. 1C, the transistor 200 of one embodiment of the present invention has a structure in which the insulator 282 and the insulator 250 are in direct contact with each other. With such a structure, oxygen contained in the insulator 280 is less likely to be absorbed into the conductor 260. Therefore, oxygen contained in the insulator 280 can be supplied to the oxide 230a and the oxide 230b efficiently through the oxide 230c; hence, oxygen vacancies in the oxide 230a and the oxide 230b can be reduced and the electrical characteristics and the reliability of the transistor 200 can be improved. In addition, the mixing of impurities such as hydrogen contained in the insulator 280 into the insulator 250 can be inhibited, which can reduce the adverse effects on the electrical characteristics and the reliability of the transistor 200. For the insulator 282, silicon nitride, silicon nitride oxide, aluminum oxide, or hafnium oxide can be used.

The insulator 272 and the insulator 273 preferably have a function of inhibiting transmission of oxygen and impurities such as hydrogen and water.

Figure 4A:
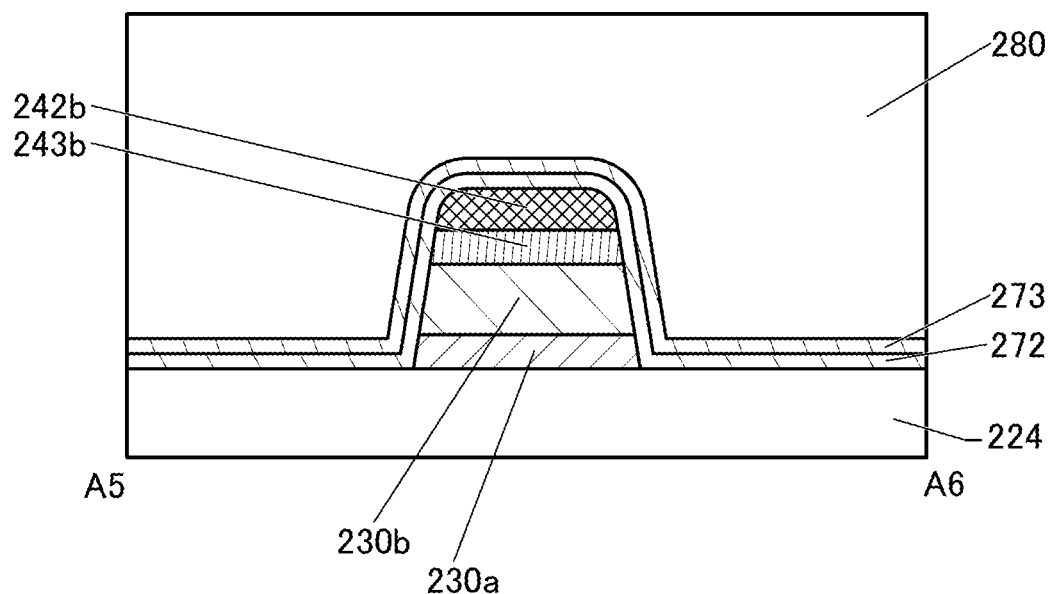
FIG. 4A and FIG. 4B are cross-sectional views of the semiconductor device of one embodiment of the present invention.

FIG. 4A is an enlarged view of a cross section of a portion indicated by the dashed-dotted line A5-A6 in FIG. 1A, and is also a cross-sectional view in the channel width direction of a source region or a drain region of the transistor 200. As illustrated in FIG. 4A, the top surface of the conductor 242$b$, the side surface of the conductor 242$b$, the side surface of the oxide 243$b$, the side surface of the oxide 230$a$, and the side surface of the oxide 230$b$ are covered with the insulator 272 and the insulator 273, thereby inhibiting diffusion of oxygen and impurities such as hydrogen and water into the conductor 242$b$ from the side surface direction of the conductor 242$b$ and the top surface direction of the conductor 242$b$. Furthermore, the bottom surface of the conductor 242$b$ is in contact with the oxide 243$b$, and oxygen in the oxide 230$b$ is blocked by the oxide 243$b$ and thus inhibited from being diffused into the conductor 242$b$. Hence, diffusion of oxygen into the conductor 242$b$ from the periphery of the conductor 242$b$ can be inhibited, so that oxidation of the conductor 242$b$ can be inhibited. Note that a similar effect can also be obtained with the conductor 242$a$. Impurities such as hydrogen and water can be inhibited from being diffused into the oxide 230$a$ and the oxide 230$b$ from the side surface direction of the oxide 230$a$ and the side surface direction of the oxide 230$b$. For the insulator 272, aluminum oxide, hafnium oxide, gallium oxide, indium gallium zinc oxide, a silicon oxide film, a silicon nitride film, or a silicon nitride oxide film can be used, for example. For the insulator 273, aluminum oxide or hafnium oxide can be used, for example.

Figure 4B:
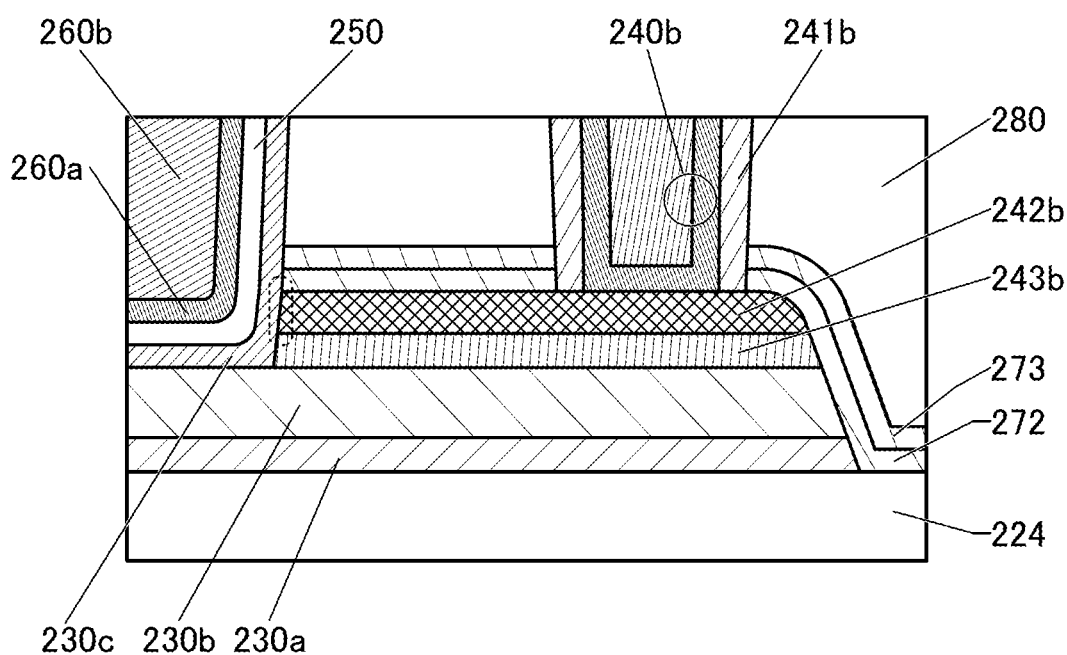

FIG. 4B is an enlarged view of the right half of the transistor 200 in FIG. 1B. The oxide 230$c$ is in contact with the left side surface of the conductor 242$b$ (the portion surrounded by a dotted line in FIG. 4B), thereby inhibiting diffusion of oxygen and impurities such as hydrogen and water from the insulator 250 into the conductor 242$b$. Moreover, the insulator 272 is in contact with the right side surface of the conductor 242$b$, thereby inhibiting diffusion of oxygen and impurities such as hydrogen and water from the insulator 280 into the conductor 242$b$. Note that a similar effect can also be obtained with the conductor 242$a$.

The above-described structure in which the conductor 242 is surrounded by insulator 272, the oxide 230$c$, and the oxide 243$b$, each of which has a function of inhibiting transmission of oxygen and impurities such as hydrogen and water, can inhibit oxidation of the conductor 242, whereby the electronic characteristics of the transistor 200 and the reliability of the transistor 200 can be improved.

As illustrated in FIG. 1C, when the bottom surface of the insulator 224 is used as a reference, the level of the bottom surface of the conductor 260 in a region where the oxide 230$a$ and the oxide 230$b$ do not overlap with the conductor 260 is preferably placed lower than the level of a bottom surface of the oxide 230$b$. The difference between the level of the bottom surface of the conductor 260 in the region where the oxide 230$b$ does not overlap with the conductor 260 and the level of the bottom surface of the oxide 230$b$ is set greater than or equal to 0 nm and less than or equal to 100 nm, preferably greater than or equal to 3 nm and less than or equal to 50 nm, further preferably greater than or equal to 5 nm and less than or equal to 20 nm.

As described above, the conductor 260, which functions as the gate, covers the side surface and the top surface of the oxide 230$b$ of the channel formation region, with the oxide 230$c$ and the insulator 250 positioned therebetween; this structure enables the electric field of the conductor 260 to easily affect the entire oxide 230$b$ of the channel formation region. Thus, the on-state current of the transistor 200 can be increased and the frequency characteristics of the transistor 200 can be improved.

Thus, a semiconductor device having normally-off electrical characteristics can be provided. Alternatively, a semiconductor device having reduced variations in electrical characteristics, stable electrical characteristics, and improved reliability can be provided. Alternatively, a semiconductor device having high on-state current can be provided. Alternatively, a semiconductor device that includes a transistor having excellent frequency characteristics can be provided. Alternatively, a semiconductor device that includes a transistor having a low off-state current can be provided.

The detailed structure of the semiconductor device including the transistor 200 of one embodiment of the present invention is described below.

The conductor 205 is provided to overlap with the oxide 230 and the conductor 260. Furthermore, the conductor 205 is preferably embedded in the insulator 216. Part of the conductor 205 may be embedded in the insulator 214 in some cases.

Here, the conductor 260 sometimes functions as a first gate (also referred to as a top gate). The conductor 205 functions as a second gate (also referred to as a bottom gate) in some cases. In that case, Vth of the transistor 200 can be controlled by changing a potential applied to the conductor 205 independently of a potential applied to the conductor 260. In particular, by applying a negative potential to the conductor 205, Vth of the transistor 200 can be higher than 0 V, and the off-state current can be reduced. Thus, drain current when a potential applied to the conductor 260 is 0 V can be lower in the case where a negative potential is applied to the conductor 205 than in the case where the negative potential is not applied to the conductor 205.

As illustrated in FIG. 1A, the conductor 205 is preferably provided to be larger than a region of the oxide 230 that does not overlap with the conductor 242$a$ or the conductor 242$b$. As illustrated in FIG. 1C, it is particularly preferable that the conductor 205 extend to a region outside an end portion of the oxide 230 that intersects with the channel width direction. That is, the conductor 205 and the conductor 260 preferably overlap with each other with the insulators therebetween on an outer side of the side surface of the oxide 230 in the channel width direction. A large conductor 205 can sometimes reduce local charging (referred to as charge up) in treatment using plasma of a fabrication step after the formation of the conductor 205. Note that one embodiment of the present invention is not limited thereto. The conductor 205 overlaps with at least the oxide 230 positioned between the conductor 242$a$ and the conductor 242$b$.

With the above structure, the channel formation region can be electrically surrounded by the electric field of the conductor 260 having a function of the first gate and the electric field of the conductor 205 having a function of the second gate. In this specification, a transistor structure in which a channel formation region is electrically surrounded by electric fields of the first gate and the second gate is referred to as a surrounded channel (S-channel) structure.

The conductor 205$a$ is preferably a conductor that inhibits the transmission of oxygen and impurities such as water or hydrogen. For example, titanium, titanium nitride, tantalum, or tantalum nitride can be used. Moreover, the conductor 205b is preferably formed using a conductive material containing tungsten, copper, or aluminum as its main component. Although the conductor 205 is illustrated as having two layers, a multilayer structure with three or more layers may be employed.

Here, it is preferable that as an oxide semiconductor, an insulator or a conductor positioned below the oxide semiconductor, and an insulator or a conductor positioned over the oxide semiconductor, different kinds of films be successively deposited without being exposed to the air, in which case a substantially highly purified intrinsic oxide semiconductor film where the concentration of impurities (in particular, hydrogen and water) is reduced can be formed.

For example, insulating films to be the insulator 222 and the insulator 224 positioned over the insulator 216 and the conductor 205, an oxide film to be the oxide 230a, an oxide film to be the oxide 230b, an oxide film to be the oxide 243, and a conductive film to be the conductor 242 are successively deposited in this order using a deposition apparatus including six treatment chambers.

The insulator 212, the insulator 214, the insulator 272, the insulator 273, the insulator 282, the insulator 283, and the insulator 281 preferably function as barrier insulating films that inhibit impurities such as water and hydrogen from entering the transistor 200 from the substrate side or from above. Thus, for each of the insulator 212, the insulator 214, the insulator 272, the insulator 273, the insulator 282, the insulator 283, and the insulator 281, an insulating material having a function of inhibiting diffusion of impurities such as hydrogen atoms, hydrogen molecules, water molecules, nitrogen atoms, nitrogen molecules, nitrogen oxide molecules (e.g., $N_2O$, $NO$, or $NO_2$), or copper atoms (through which the impurities are less likely to pass) is preferably used. Alternatively, it is preferable to use an insulating material having a function of inhibiting diffusion of oxygen (e.g., at least one of an oxygen atom, an oxygen molecule, and the like) (through which the above oxygen is less likely to pass).

For example, it is preferable that the insulator 212, the insulator 283, and the insulator 281 be formed using silicon nitride or the like, and the insulator 214, the insulator 272, the insulator 273, and the insulator 283 be formed using aluminum oxide or the like. Accordingly, impurities such as water or hydrogen can be inhibited from being diffused to the transistor 200 side from the substrate side through the insulator 212 and the insulator 214. Alternatively, oxygen contained in the insulator 224 or the like can be inhibited from being diffused to the substrate side through the insulator 212 and the insulator 214. Impurities such as water or hydrogen can be inhibited from being diffused into the transistor 200 side through the insulator 273 from the insulator 280, the conductor 246, and the like, which are provided above the insulator 273. In this manner, the transistor 200 is preferably surrounded by the insulator 212, the insulator 214, the insulator 272, the insulator 273, the insulator 282, the insulator 283, and the insulator 281 having a function of inhibiting diffusion of oxygen and impurities such as water or hydrogen.

The resistivities of the insulator 212, the insulator 283, and the insulator 281 are preferably low in some cases. For example, by setting the resistivities of the insulator 212, the insulator 283, and the insulator 281 to approximately $1\times10^{13}$ $\Omega$cm, the insulator 212, the insulator 283, and the insulator 281 can sometimes reduce charge up of the conductor 205, the conductor 242, or the conductor 260 in treatment using plasma or the like in the manufacturing process of a semiconductor device. The resistivities of the insulator 212, the insulator 283, and the insulator 281 are preferably higher than or equal to $1\times10^{10}$ $\Omega$cm and lower than or equal to $1\times10^{15}$ $\Omega$cm.

The insulator 216, the insulator 280, and the insulator 274 preferably have a lower permittivity than the insulator 214. When a material with a low permittivity is used as an interlayer film, the parasitic capacitance generated between wirings can be reduced. As the insulator 216, the insulator 280, and the insulator 274, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide is used as appropriate, for example.

The insulator 222 and the insulator 224 have a function of a gate insulator.

Here, it is preferable that the insulator 224 in contact with the oxide 230 release oxygen by heating. In this specification, oxygen that is released by heating is referred to as excess oxygen in some cases. For example, silicon oxide, silicon oxynitride, or the like is used as appropriate for the insulator 224. When an insulator containing oxygen is provided in contact with the oxide 230, oxygen vacancies in the oxide 230 can be reduced and the reliability of the transistor 200 can be improved.

As the insulator 224, specifically, an oxide material from which part of oxygen is released by heating is preferably used. An oxide that releases oxygen by heating is an oxide film in which the number of released oxygen molecules is greater than or equal to $1.0\times10^{18}$ molecules/cm$^3$, preferably greater than or equal to $1.0\times10^{19}$ molecules/cm$^3$, further preferably greater than or equal to $2.0\times10^{19}$ molecules/cm$^3$ or greater than or equal to $3.0\times10^{20}$ molecules/cm$^3$ in thermal desorption spectroscopy analysis (TDS analysis). Note that the temperature of the film surface in the TDS analysis is preferably within the range of 100° C. to 700° C., or 100° C. to 400° C.

The insulator 222 preferably functions as a barrier insulating film that inhibits impurities such as water or hydrogen from being mixed in the transistor 200 from the substrate side. For example, the insulator 222 preferably has lower hydrogen permeability than the insulator 224. Surrounding the insulator 224, the oxide 230, and the like by the insulator 222 and the insulator 272 can inhibit entry of impurities such as water or hydrogen into the transistor 200 from the outside.

Furthermore, it is preferable that the insulator 222 have a function of inhibiting diffusion of oxygen (e.g., at least one of an oxygen atom, an oxygen molecule, and the like) (through which the above oxygen is less likely to pass). For example, the insulator 222 preferably has lower oxygen permeability than the insulator 224. The insulator 222 preferably has a function of inhibiting diffusion of oxygen or impurities, in which case diffusion of oxygen contained in the oxide 230 into a layer under the insulator 222 can be reduced. Moreover, the conductor 205 can be inhibited from reacting with oxygen contained in the insulator 224 and the oxide 230.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. When the insulator 222 is formed using such a material, the insulator 222 functions as a layer that inhibits release of oxygen from the oxide 230 and mixing of impurities such as hydrogen from the periphery of the transistor 200 into the oxide 230.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

Alternatively, for example, a single layer or stacked layers of an insulator containing what is called a high-k material, such as aluminum oxide, hafnium oxide, tantalum oxide, zirconium oxide, lead zirconate titanate (PZT), strontium titanate ($SrTiO_3$), or $(Ba,Sr)TiO_3$ (BST), may be used as the insulator 222. With miniaturization and high integration of transistors, a problem such as leakage current may arise because of a thinner gate insulator. When a high-k material is used as an insulator functioning as the gate insulator, a gate potential during operation of the transistor can be lowered while the physical thickness of the gate insulator is kept.

Note that the insulator 222 and the insulator 224 may each have a stacked-layer structure of two or more layers. In such cases, without limitation to a stacked-layer structure formed of the same material, a stacked-layer structure formed of different materials may be employed.

The oxide 243 is provided over the oxide 230b, and the conductor 242 (the conductor 242a and the conductor 242b) functioning as the source electrode and the drain electrode is provided over the oxide 243. The thickness of the conductor 242 is greater than or equal to 1 nm and less than or equal to 50 nm, preferably greater than or equal to 2 nm and less than or equal to 25 nm, for example.

For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten nitride, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

The insulator 250 functions as a gate insulator. The insulator 250 is preferably placed in contact with the top surface of the oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

Like the insulator 224, the insulator 250 is preferably formed using an insulator from which oxygen is released by heating. When an insulator from which oxygen is released by heating is provided as the insulator 250 in contact with the top surface of the oxide 230c, oxygen can be efficiently supplied to the channel formation region of the oxide 230b. Furthermore, as in the insulator 224, the concentration of impurities such as water or hydrogen in the insulator 250 is preferably reduced. The thickness of the insulator 250 is preferably greater than or equal to 1 nm and less than or equal to 20 nm.

Furthermore, a metal oxide may be provided between the insulator 250 and the conductor 260. The metal oxide preferably inhibits diffusion of oxygen from the insulator 250 into the conductor 260. Providing the metal oxide that inhibits diffusion of oxygen inhibits diffusion of oxygen from the insulator 250 to the conductor 260. That is, a reduction in the amount of oxygen supplied to the oxide 230 can be inhibited. In addition, oxidation of the conductor 260 due to oxygen from the insulator 250 can be inhibited.

The metal oxide has a function of part of the gate insulator in some cases. Therefore, when silicon oxide, silicon oxynitride, or the like is used for the insulator 250, a metal oxide that is a high-k material with a high relative permittivity is preferably used as the metal oxide. When the gate insulator has a stacked-layer structure of the insulator 250 and the metal oxide, the stacked-layer structure can be thermally stable and have a high relative permittivity. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

Specifically, it is possible to use a metal oxide containing one kind or two or more kinds selected from hafnium, aluminum, gallium, yttrium, zirconium, tungsten, titanium, tantalum, nickel, germanium, magnesium, and the like. It is particularly preferable to use an insulator containing an oxide of one or both of aluminum and hafnium, such as aluminum oxide, hafnium oxide, or an oxide containing aluminum and hafnium (hafnium aluminate).

Alternatively, the metal oxide has a function of part of the gate in some cases. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate, a conductive material containing oxygen and a metal element contained in a metal oxide where the channel is formed. Alternatively, a conductive material containing the above metal element and nitrogen may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide where the channel is formed can be trapped in some cases. Alternatively, hydrogen entering from an external insulator or the like can be trapped in some cases.

Although the conductor 260 has a two-layer structure in FIG. 1, a single-layer structure or a stacked-layer structure of three or more layers may be employed.

For the conductor 260a, it is preferable to use a conductive material having a function of inhibiting diffusion of impurities such as hydrogen atoms, hydrogen molecules, water molecules, nitrogen atoms, nitrogen molecules, nitrogen oxide molecules ($N_2O$, NO, $NO_2$, and the like), and copper atoms. Alternatively, it is preferable to use a conductive material having a function of inhibiting diffusion of oxygen (e.g., at least one of an oxygen atom, an oxygen molecule, and the like).

In addition, when the conductor 260a has a function of inhibiting diffusion of oxygen, the conductivity of the conductor 260b can be inhibited from being lowered because of oxidation due to oxygen contained in the insulator 250. As a conductive material having a function of inhibiting diffusion of oxygen, for example, tantalum, tantalum nitride, ruthenium, ruthenium oxide, or the like is preferably used.

Moreover, a conductive material containing tungsten, copper, or aluminum as its main component is preferably used for the conductor 260b. The conductor 260 also functions as a wiring and thus is preferably formed using a conductor having high conductivity. For example, a conductive material containing tungsten, copper, or aluminum as its main component can be used. The conductor 260b may have a stacked-layer structure, for example, a stacked-layer structure of any of the above conductive materials and titanium or titanium nitride.

For example, for the insulator 280, silicon oxide, silicon oxynitride, silicon nitride oxide, silicon oxide to which fluorine is added, silicon oxide to which carbon is added, silicon oxide to which carbon and nitrogen are added, porous silicon oxide, or the like is preferably included. In particular, silicon oxide and silicon oxynitride, which have thermal stability, are preferable. Materials such as silicon oxide, silicon oxynitride, and porous silicon oxide, in each of which a region containing oxygen released by heating can be easily formed, are particularly preferable.

The concentration of impurities such as water or hydrogen in the insulator 280 is preferably reduced. In addition, the top surface of the insulator 280 may be planarized.

The insulator 282 or the insulator 283 preferably functions as barrier insulating films that inhibit impurities such as water and hydrogen from entering the insulator 280 from above. The insulator 282 or the insulator 283 preferably functions as barrier insulating films for inhibiting transmission of oxygen. As insulator 282 and the insulator 283, for example, an insulator such as aluminum oxide, silicon nitride, or silicon nitride oxide may be used. The insulator 282 may be formed using aluminum oxide, which has high blocking property against oxygen and the insulator 283 may be formed from silicon nitride, which has high blocking property against hydrogen, for example.

The insulator 274 functioning as an interlayer film is preferably provided over the insulator 282. In the insulator 274, as in the insulator 224 and the like, the concentration of impurities such as water or hydrogen in the film is preferably lowered.

For the conductor 240a and the conductor 240b, a conductive material containing tungsten, copper, or aluminum as its main component is preferably used. The conductor 240a and the conductor 240b may each have a stacked-layer structure.

In the case where the conductor 240 has a stacked-layer structure, a conductive material having a function of inhibiting transmission of impurities such as water or hydrogen is preferably used for a conductor in contact with the insulator 281, the insulator 274, the insulator 282, the insulator 280, the insulator 273, and the insulator 272. For example, tantalum, tantalum nitride, titanium, titanium nitride, ruthenium, ruthenium oxide, or the like is preferably used. A single layer or a stacked layer of the conductive material having a function of inhibiting transmission of impurities such as water or hydrogen may be used. The use of the conductive material can prevent oxygen added to the insulator 280 from being absorbed by the conductor 240a and the conductor 240b. Moreover, impurities such as water or hydrogen can be inhibited from being mixed in the oxide 230 through the conductor 240a and the conductor 240b from a layer above the insulator 281.

As the insulator 241a and the insulator 241b, an insulator such as silicon nitride, aluminum oxide, or silicon nitride oxide is used, for example. Since the insulator 241a and the insulator 241b are provided in contact with the insulator 272 and the insulator 273, impurities such as water or hydrogen can be inhibited from being mixed into the oxide 230 through the conductor 240a and the conductor 240b from the insulator 280 or the like. Silicon nitride is particularly preferable because of its high blocking property against hydrogen. In addition, oxygen contained in the insulator 280 can be prevented from being absorbed by the conductor 240a and the conductor 240b.

The conductor 246 (the conductor 246a and the conductor 246b) functioning as a wiring may be provided in contact with a top surface of the conductor 240a and a top surface of the conductor 240b. The conductor 246 is preferably formed using a conductive material containing tungsten, copper, or aluminum as its main component. Furthermore, the conductor may have a stacked-layer structure and may be a stack of titanium or titanium nitride and any of the above conductive materials, for example. Note that the conductor may be formed to be embedded in an opening provided in an insulator.

<Constituent Material of Semiconductor Device>

Constituent materials that can be used for the semiconductor device are described below.

<Substrate>

As a substrate where the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate using silicon or germanium as a material and a compound semiconductor substrate including silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

<Insulator>

Examples of an insulator include an oxide, a nitride, an oxynitride, a nitride oxide, a metal oxide, a metal oxynitride, and a metal nitride oxide, each of which has an insulating property.

As miniaturization and high integration of transistors progress, for example, a problem such as leakage current may arise because of a thinner gate insulator. When a high-k material is used as the insulator functioning as a gate insulator, the voltage during operation of the transistor can be lowered while the physical thickness of the gate insulator is maintained. In contrast, when a material with a low relative permittivity is used as the insulator functioning as an interlayer film, parasitic capacitance generated between wirings can be reduced. Thus, a material is preferably selected depending on the function of an insulator.

Examples of the insulator with a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low relative permittivity include silicon oxide, silicon oxynitride, silicon nitride oxide, silicon oxide to which fluorine is added, silicon oxide to which carbon is added, silicon oxide to which carbon and nitrogen are added, porous silicon oxide, and a resin.

When a transistor using an oxide semiconductor is surrounded by an insulator having a function of inhibiting transmission of oxygen and impurities such as hydrogen, the electrical characteristics of the transistor can be stable. As the insulator having a function of inhibiting transmission of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, aluminum titanium nitride, titanium nitride, silicon nitride oxide, or silicon nitride can be used.

The insulator functioning as the gate insulator is preferably an insulator including a region containing oxygen released by heating. For example, when a structure is employed in which silicon oxide or silicon oxynitride including a region containing oxygen released by heating is in contact with the oxide 230, oxygen vacancies included in the oxide 230 can be filled.

<Conductor>

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten nitride, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. A semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide is used as the channel formation region of the transistor, a stacked-layer structure in which a material containing the above metal element and a conductive material containing oxygen are combined is preferably used as the conductor functioning as the gate. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate, a conductive material containing oxygen and a metal element contained in a metal oxide where the channel is formed. Alternatively, a conductive material containing the above metal element and nitrogen may be used. For example, a conductive material containing nitrogen, such as titanium nitride or tantalum nitride, may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide where the channel is formed can be trapped in some cases. Alternatively, hydrogen entering from an external insulator or the like can be trapped in some cases.

<Metal Oxide>

As the oxide 230, a metal oxide functioning as an oxide semiconductor is preferably used. A metal oxide that can be used as the oxide 230 according to the present invention is described below.

The metal oxide preferably contains at least indium or zinc. In particular, indium and zinc are preferably contained. Furthermore, aluminum, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, tin, or the like. Other elements that can be used as the element M include boron, titanium, iron, nickel, germanium, zirconium, molybdenum, lanthanum, cerium, neodymium, hafnium, tantalum, tungsten, and magnesium. Note that it is sometimes acceptable to use a plurality of the above-described elements in combination as the element M.

Note that in this specification and the like, a metal oxide containing nitrogen is also collectively referred to as a metal oxide in some cases. A metal oxide containing nitrogen may be referred to as a metal oxynitride.

[Structure of Metal Oxide]

Oxide semiconductors (metal oxides) can be classified into a single crystal oxide semiconductor and a non-single-crystal oxide semiconductor. Examples of the non-single-crystal oxide semiconductors include a CAAC-OS, a polycrystalline oxide semiconductor, an nc-OS, an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) is difficult to observe even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Furthermore, entry of impurities, formation of defects, or the like might decrease the crystallinity of a metal oxide, which means that the CAAC-OS is a metal oxide having small amounts of impurities and defects (e.g., oxygen vacancies ($V_O$)). Thus, a metal oxide including a CAAC-OS is physically stable. Therefore, the metal oxide including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that indium-gallium-zinc oxide (hereinafter referred to as IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity compared with the nc-OS and the CAAC-OS.

An oxide semiconductor (metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

Note that there is no particular limitation on a structure of an oxide semiconductor (metal oxide) in the semiconductor device of one embodiment of the present invention; however, the oxide semiconductor preferably has crystallinity. For example, the oxide 230 can have a CAAC-OS structure and the oxide 243 can have a hexagonal crystal structure. The semiconductor device can have high reliability when the oxide 230 and the oxide 243 have the above crystal structures. Moreover, the oxide 230a, the oxide 230c, and the oxide 243 can have substantially the same composition.

[Impurities]

Here, the influence of each impurity in the metal oxide is described.

When the metal oxide contains an alkali metal or an alkaline earth metal, defect states are formed and carriers are generated in some cases. Thus, a transistor using a metal oxide that contains an alkali metal or an alkaline earth metal for its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide (the concentration obtained by secondary ion mass spectrometry (SIMS)) is set lower than or equal to $1\times10^{18}$ atoms/cm$^3$, preferably lower than or equal to $2\times10^{16}$ atoms/cm$^3$.

Hydrogen contained in a metal oxide reacts with oxygen bonded to a metal atom to be water, and thus forms an oxygen vacancy in some cases. When hydrogen enters the oxygen vacancy, an electron which is a carrier is generated in some cases. Furthermore, in some cases, bonding of part of hydrogen to oxygen bonded to a metal atom causes generation of an electron serving as a carrier. Thus, a transistor using a metal oxide containing hydrogen is likely to have normally-on characteristics.

Accordingly, hydrogen in the metal oxide is preferably reduced as much as possible. Specifically, the hydrogen concentration of the metal oxide obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide in which the impurities are sufficiently reduced is used in a channel formation region of a transistor, stable electrical characteristics can be given.

Note that as a metal oxide used as a semiconductor of a transistor, a thin film having high crystallinity is preferably used. With the use of the thin film, the stability or reliability of the transistor can be improved. Examples of the thin film include a thin film of a single-crystal metal oxide and a thin film of a polycrystalline metal oxide. However, to form the thin film of a single-crystal metal oxide or the thin film of a polycrystalline metal oxide over a substrate, a high-temperature process or a laser heating process is needed. Thus, manufacturing cost is increased, and throughput is decreased.

<Manufacturing Method of Semiconductor Device>

Next, a manufacturing method of a semiconductor device including the transistor 200 according to the present invention, which is illustrated in FIG. 1, is described with reference to FIG. 5 to FIG. 14. In FIG. 5 to FIG. 14, A in each drawing is a top view. Moreover, B of each drawing is a cross-sectional view corresponding to a portion indicated by the dashed-dotted line A1-A2 in A, and is also a cross-sectional view of the transistor 200 in the channel length direction. Furthermore, C of each drawing is a cross-sectional view corresponding to a portion indicated by the dashed-dotted line A3-A4 in A, and is also a cross-sectional view in the channel width direction of the transistor 200. Note that for simplification of the drawing, some components are not illustrated in the top view of A of each drawing.

First, a substrate (not illustrated) is prepared, and the insulator 212 is deposited over the substrate. The insulator 212 can be deposited by a sputtering method, a chemical vapor deposition (CVD) method, a molecular beam epitaxy (MBE) method, a pulsed laser deposition (PLD) method, an ALD method, or the like.

Note that the CVD method can be classified into a plasma enhanced CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method is a deposition method that does not use plasma and thus enables less plasma damage to an object to be processed. For example, a wiring, an electrode, an element (a transistor, a capacitor, or the like), or the like included in a semiconductor device might be charged up by receiving electric charge from plasma. In that case, accumulated electric charge might break the wiring, the electrode, the element, or the like included in the semiconductor device. In contrast, such plasma damage does not occur in the case of a thermal CVD method, which does not use plasma, and thus the yield of the semiconductor device can be increased. In addition, a thermal CVD method does not cause plasma damage during deposition, so that a film with few defects can be obtained.

In an ALD method, one atomic layer can be deposited at a time using self-regulating characteristics of atoms. Hence, an ALD method has effects such as deposition of an extremely thin film, deposition on a component with a high aspect ratio, deposition of a film with a small number of defects such as pinholes, deposition with excellent coverage, and low-temperature deposition. An ALD method includes a PEALD (plasma-enhanced ALD) method, which is a deposition method using plasma. The use of plasma is sometimes preferable because deposition at lower temperature is possible. Note that a precursor used in the ALD method sometimes contains impurities such as carbon. Thus, in some cases, a film provided by the ALD method contains impurities such as carbon in a larger amount than a film provided by another deposition method. Note that impurities can be quantified by X-ray photoelectron spectroscopy (XPS).

Unlike a deposition method in which particles ejected from a target or the like are deposited, a CVD method and an ALD method are deposition methods in which a film is deposited by reaction at a surface of an object. Thus, a CVD method and an ALD method are deposition methods that enable favorable step coverage almost regardless of the shape of an object. In particular, an ALD method has excellent step coverage and excellent thickness uniformity and thus is suitable for covering a surface of an opening with a high aspect ratio, for example. On the other hand, an ALD method has a relatively low deposition rate, and thus is preferably used in combination with another deposition method with a high deposition rate, such as a CVD method, in some cases.

Each of a CVD method and an ALD method enables the composition of a film that is to be deposited to be controlled with a flow rate ratio of source gases. For example, by each of a CVD method and an ALD method, a film with a certain composition can be deposited depending on the flow rate ratio of the source gases. Moreover, with each of a CVD method and an ALD method, by changing the flow rate ratio of the source gases while depositing the film, a film whose composition is continuously changed can be deposited. In the case where the film is deposited while changing the flow rate ratio of the source gases, as compared to the case where the film is deposited using a plurality of deposition chambers, the time taken for the deposition can be shortened because the time taken for transfer and pressure adjustment is omitted. Thus, the productivity of the semiconductor device can be increased in some cases.

In this embodiment, for the insulator 212, silicon nitride is deposited by a CVD method. When an insulator through which copper is less likely to pass, such as silicon nitride, is used for the insulator 212 in such a manner, even in the case where a metal that is likely to diffuse, such as copper, is used for a conductor in a layer (not illustrated) below the insulator 212, diffusion of the metal into a layer above the insulator 212 through the insulator 212 can be inhibited. The use of an insulator through which impurities such as water and hydrogen are less likely to pass, such as silicon nitride, can inhibit diffusion of impurities such as water and hydrogen from a layer under the insulator 212.

Next, the insulator 214 is deposited over the insulator 212. The insulator 214 can be deposited by a sputtering method, a CVD method, an MBE method, a PLD method, an ALD method, or the like. In this embodiment, aluminum oxide is used for the insulator 214.

Next, the insulator 216 is deposited over the insulator 214. The insulator 216 can be deposited by a sputtering method, a CVD method, an MBE method, a PLD method, an ALD method, or the like.

Then, an opening reaching the insulator 214 is formed in the insulator 216. A groove and a slit, for example, are included in the category of the opening. A region where an opening is formed may be referred to as an opening portion. Wet etching can be used for the formation of the opening; however, dry etching is preferably used for microfabrication. As the insulator 214, it is preferable to select an insulator that functions as an etching stopper film used in forming the groove by etching the insulator 216. For example, in the case where a silicon oxide film is used as the insulator 216 in which the groove is to be formed, a silicon nitride film, an aluminum oxide film, or a hafnium oxide film is preferably used as the insulator 214.

After the formation of the opening, a conductive film to be the conductor 205a is deposited. The conductive film preferably includes a conductor that has a function of inhibiting transmission of oxygen. For example, tantalum nitride, tungsten nitride, or titanium nitride can be used. Alternatively, a stacked-layer film with tantalum, tungsten, titanium, molybdenum, aluminum, copper, or a molybdenum-tungsten alloy can be used. The conductive film to be the conductor 205a can be deposited by a sputtering method, a CVD method, an MBE method, a PLD method, an ALD method, or the like.

In this embodiment, the conductive film to be the conductor 205a has a multilayer First, tantalum nitride is deposited by a sputtering method, and titanium nitride is structure. stacked over the tantalum nitride. When such metal nitrides are used for a lower layer of the conductor 205b, even in the case where a metal that is likely to diffuse, such as copper, is used for a conductive film to be a conductor 205b described below, outward diffusion of the metal from the conductor 205a can be inhibited.

Next, a conductive film to be the conductor 205b is deposited. The conductive film can be deposited by a plating method, a sputtering method, a CVD method, an MBE method, a PLD method, an ALD method, or the like. In this embodiment, for the conductive film to be the conductor 205b, a low-resistance conductive material such as copper is deposited.

Next, CMP treatment (Chemical Mechanical Polishing) is performed, thereby removing part of the conductive film to be the conductor 205a and part of the conductive film to be the conductor 205b to expose the insulator 216. As a result, the conductor 205a and the conductor 205b remain only in the opening portion. Thus, the conductor 205 whose top surface is flat can be formed. Note that the insulator 216 is partly removed by the CMP treatment in some cases (see FIG. 5).

Although the conductor 205 is embedded in the opening in the insulator 216 in the above description, this embodiment is not limited to this structure. For example, the surface of the conductor 205 may be exposed in the following manner: the conductor 205 is formed over the insulator 214, the insulator 216 is formed over the conductor 205, and the insulator 216 is subjected to the CMP treatment so that the insulator 216 is partly removed.

Next, the insulator 222 is deposited over the insulator 216 and the conductor 205. An insulator containing an oxide of one or both of aluminum and hafnium is preferably deposited as the insulator 222. Note that as the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, hydrogen and water contained in components provided around the transistor 200 are inhibited from diffusing into the transistor 200 through the insulator 222, and generation of oxygen vacancies in the oxide 230 can be inhibited.

The insulator 222 can be deposited by a sputtering method, a CVD method, an MBE method, a PLD method, an ALD method, or the like.

Then, an insulating film 224A is deposited over the insulator 222. The insulating film 224A can be deposited by a sputtering method, a CVD method, an MBE method, a PLD method, an ALD method, or the like.

Sequentially, heat treatment is preferably performed. The heat treatment is performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen atmosphere, an inert gas atmosphere, or an atmosphere containing an oxidizing gas at 10 ppm or more, 1% or more, or 10% or more. Alternatively, the heat treatment may be performed under reduced pressure. Alternatively, the heat treatment may be performed in such a manner that heat treatment is performed in a nitrogen atmosphere or an inert gas atmosphere, and then another heat treatment is performed in an atmosphere containing an oxidizing gas at 10 ppm or more, 1% or more, or 10% or more in order to compensate for released oxygen.

In this embodiment, treatment is performed at 400° C. in a nitrogen atmosphere for one hour, and treatment is successively performed at 400° C. in an oxygen atmosphere for one hour. By the heat treatment, impurities such as water and hydrogen contained in the insulating film 224A can be removed.

Heat treatment may be performed after the insulator 222 is deposited. For the heat treatment, the above-described heat treatment conditions can be used.

Here, in order to form an excess-oxygen region in the insulating film 224A, plasma treatment with oxygen may be performed under reduced pressure. For the plasma treatment with oxygen, an apparatus including a power source for generating high-density plasma using a microwave is preferably used, for example. Alternatively, a power source may be provided to apply a high-frequency wave such as RF to the substrate side. The use of high-density plasma enables high-density oxygen radicals to be produced, and RF application to the substrate side allows the oxygen radicals generated by the high-density plasma to be efficiently introduced into the insulating film 224A. Alternatively, after plasma treatment with an inert gas is performed using this apparatus, plasma treatment with oxygen may be performed to compensate for released oxygen. Note that impurities such as water and hydrogen contained in the insulating film 224A can be removed by selecting the conditions for the plasma treatment appropriately. In that case, the heat treatment does not need to be performed.

Here, aluminum oxide may be deposited over the insulating film 224A by a sputtering method, for example, and then CMP may be performed until the insulating film 224A is reached. The CMP can planarize the surface of the insulating film 224A and smooth the surface of the insulating film 224A. When the CMP is performed on the aluminum oxide placed over the insulating film 224A, it is easy to detect the endpoint of CMP. Part of the insulating film 224A may be polished by the CMP so that the thickness of the insulating film 224A may be reduced; the thickness of the insulating film 224A is adjusted at the time of the deposition. Planarizing and smoothing the surface of the insulating film 224A can sometimes prevent a decrease in the coverage with an oxide deposited later and a decrease in the yield of the semiconductor device. The deposition of aluminum oxide over the insulating film 224A by a sputtering method is preferred because oxygen can be added to the insulating film 224A.

Figure 5A:
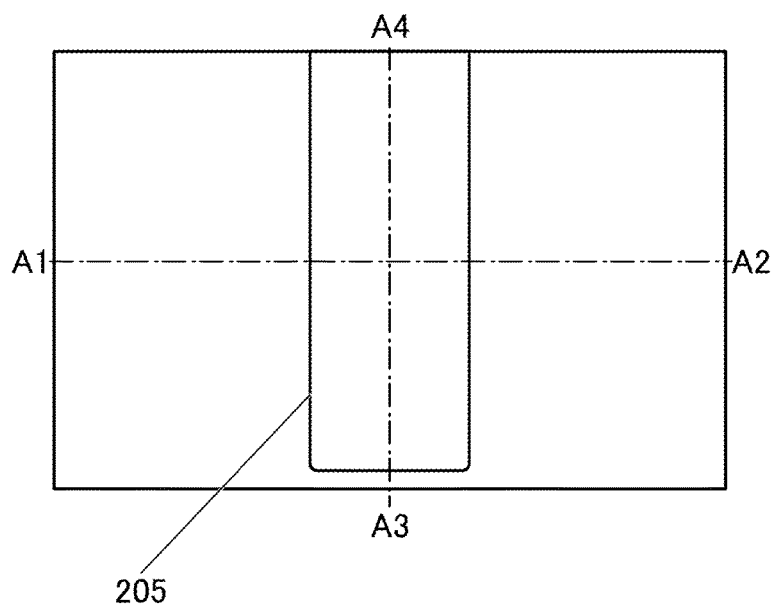
FIG. 5A is a top view illustrating a manufacturing method of a semiconductor device of one embodiment of the present invention.
Figure 5C:
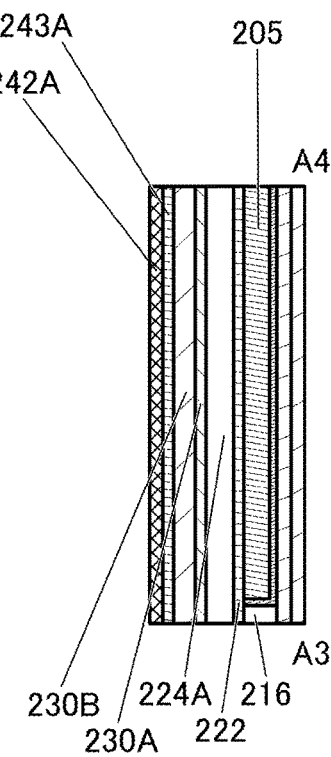
FIG. 5B and FIG. 5C are cross-sectional views illustrating a manufacturing method of a semiconductor device of one embodiment of the present invention.
Figure 5B:
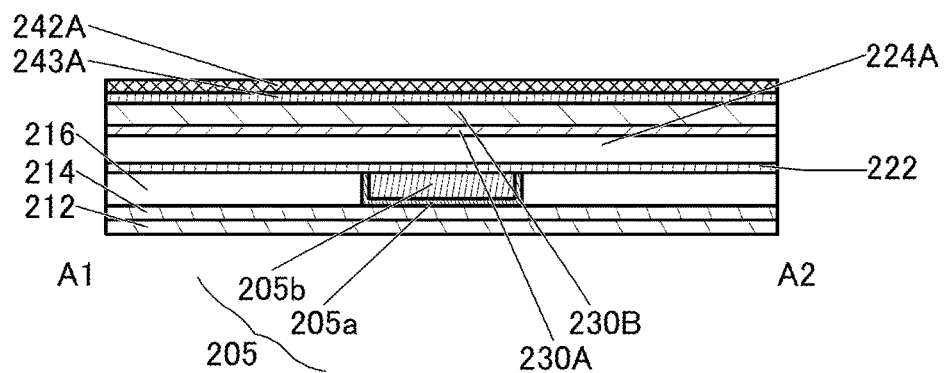

Next, an oxide film 230A and an oxide film 230B are deposited in this order over the insulating film 224A (see FIG. 5). Note that the oxide films are preferably deposited successively without being exposed to an air atmosphere. By the deposition without exposure to the air, impurities or moisture from the atmospheric environment can be prevented from being attached onto the oxide film 230A and the oxide film 230B, so that the vicinity of the interface between the oxide film 230A and the oxide film 230B can be kept clean.

The oxide film 230A and the oxide film 230B can be deposited by a sputtering method, a CVD method, an MBE method, a PLD method, an ALD method, or the like.

For example, in the case where the oxide film 230A and the oxide film 230B are deposited by a sputtering method, oxygen or a mixed gas of oxygen and a rare gas is used as a sputtering gas. Increasing the proportion of oxygen contained in the sputtering gas can increase the amount of excess oxygen in the deposited oxide films. In the case where the above oxide films are deposited by a sputtering method, a target of the above-described In-M-Zn oxide can be used.

In particular, at the time of depositing the oxide film 230A, part of oxygen contained in the sputtering gas is supplied to the insulating film 224A in some cases. Therefore, the proportion of oxygen contained in the sputtering gas for the oxide film 230A is preferably 70% or higher, further preferably 80% or higher, still further preferably 100%.

In the case where the oxide film 230B is formed by a sputtering method, when the proportion of oxygen contained in the sputtering gas is higher than or equal to 1% and lower than or equal to 30%, preferably higher than or equal to 5% and lower than or equal to 20% during the deposition, an oxygen-deficient oxide semiconductor is formed. A transistor in which an oxygen-deficient oxide semiconductor is used for its channel formation region can have relatively high field-effect mobility. Furthermore, when the deposition is performed while the substrate is heated, the crystallinity of the oxide film can be improved. Note that one embodiment of the present invention is not limited thereto. In the case where the oxide film 230B is formed by a sputtering method and the proportion of oxygen contained in the sputtering gas for deposition is higher than 30% and lower than or equal to 100%, preferably higher than or equal to 70% and lower than or equal to 100%, an oxygen-excess oxide semiconductor is formed. In a transistor using an oxygen-excess oxide semiconductor for its channel formation region, relatively high reliability can be obtained.

In this embodiment, the oxide film 230A is deposited by a sputtering method using a target with In:Ga:Zn=1:1:0.5 [atomic ratio] (2:2:1 [atomic ratio]) or 1:3:4 [atomic ratio]. The oxide film 230B is deposited by a sputtering method using a target with In:Ga:Zn=4:2:4.1 [atomic ratio] or 1:1:1 [atomic ratio]. Note that each of the oxide films is formed to have characteristics required for the oxide 230 by selecting the deposition condition and the atomic ratio as appropriate.

Next, heat treatment may be performed. For the heat treatment, the above-described heat treatment conditions can be used. Through the heat treatment, impurities such as water and hydrogen in the oxide film 230A and the oxide film 230B can be removed, for example. In this embodiment, treatment is performed at 400° C. in a nitrogen atmosphere for one hour, and treatment is successively performed at 400° C. in an oxygen atmosphere for one hour.

Next, a conductive film 243A is deposited over the oxide film 230B (see FIG. 5). The oxide film 243A can be deposited by a sputtering method, a CVD method, an MBE method, a PLD method, an ALD method, or the like. The atomic ratio of Ga to In in the oxide film 243A is preferably greater than the atomic ratio of Ga to In in the oxide film 230B. In this embodiment, the oxide film 243A is formed by a sputtering method using a target with In:Ga:Zn=1:3:4 [atomic ratio].

Then, a conductive film 242A is deposited over the oxide film 243A (see FIG. 5). The conductive film 242A can be deposited by a sputtering method, a CVD method, an MBE method, a PLD method, an ALD method, or the like (see FIG. 5).

Figure 6A:
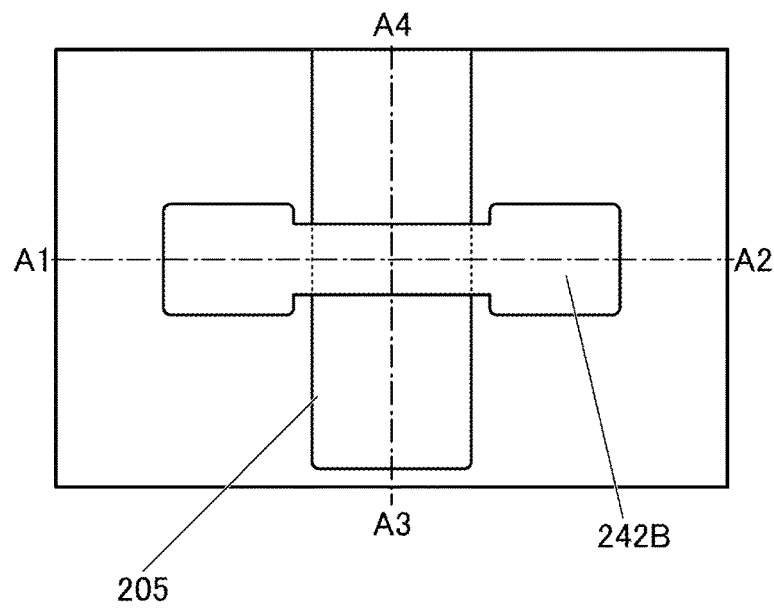
FIG. 6A is a top view illustrating a manufacturing method of a semiconductor device of one embodiment of the present invention.
Figure 6C:
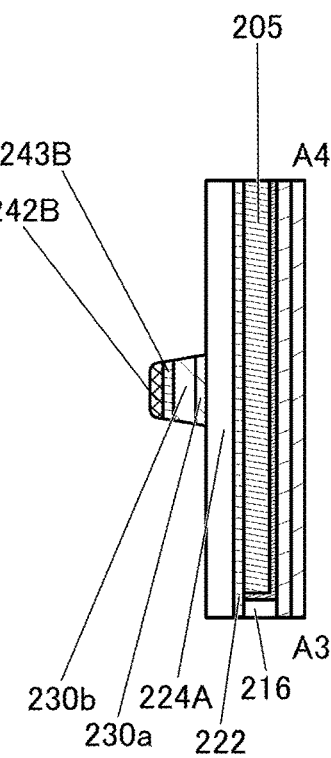
FIG. 6B and FIG. 6C are cross-sectional views illustrating a manufacturing method of a semiconductor device of one embodiment of the present invention.
Figure 6B:
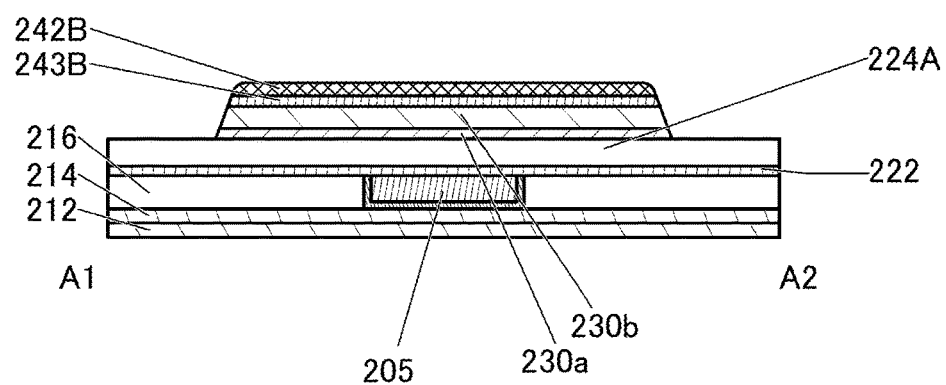

Next, the oxide film 230A, the oxide film 230B, the oxide film 243A, and the conductive film 242A are processed into island shapes by a lithography method to form the oxide 230a, the oxide 230b, an oxide layer 243B, and a conductor layer 242B (see FIG. 6). A dry etching method or a wet etching method can be used for the processing. Processing by a dry etching method is suitable for microfabrication. Note that although not illustrated, in this step, the thickness of the region of the insulating film 224A that does not overlap with the oxide 230a is reduced in some cases.

Note that in the lithography method, first, a resist is exposed to light through a mask. Next, a region exposed to light is removed or left using a developer, so that a resist mask is formed. Then, etching treatment through the resist mask is conducted, whereby a conductor, a semiconductor, an insulator, or the like can be processed into a desired shape. The resist mask is formed by, for example, exposure of the resist to KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that a mask is unnecessary in the case of using an electron beam or an ion beam. Note that the resist mask can be removed by dry etching treatment such as ashing, wet etching treatment, wet etching treatment after dry etching treatment, or dry etching treatment after wet etching treatment.

In addition, a hard mask formed of an insulator or a conductor may be used instead of the resist mask. In the case where a hard mask is used, a hard mask with a desired shape can be formed by forming an insulating film or a conductive film to be the hard mask material over the conductive film 242A, forming a resist mask thereover, and then etching the hard mask material. The etching of the conductive film 242A and the like may be performed after removing the resist mask or with the resist mask remaining. In the latter case, the resist mask sometimes disappears during the etching. The hard mask may be removed by etching after the etching of the conductive film 242A and the like. Meanwhile, the hard mask is not necessarily removed when the hard mask material does not affect subsequent steps or can be utilized in the subsequent steps.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency power is applied to one of the parallel plate electrodes. Alternatively, a structure may be employed in which different high-frequency powers are applied to one of the parallel plate electrodes. Alternatively, a structure may be employed in which high-frequency powers with the same frequency are applied to the parallel plate electrodes. Alternatively, a structure may be employed in which high-frequency powers with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

Here, the oxide 230a, the oxide 230b, the oxide layer 243B, and the conductor layer 242B are formed to at least partly overlap with the conductor 205. It is preferable that the side surfaces of the oxide 230a, the oxide 230b, the oxide layer 243B, and the conductor layer 242B be substantially perpendicular to a top surface of the insulator 222. When the side surfaces of the oxide 230a, the oxide 230b, the oxide layer 243B, and the conductor layer 242B are substantially perpendicular to the top surface of the insulator 222, a plurality of transistors 200 can be provided in a smaller area and at a higher density. Alternatively, a structure may be employed in which an angle formed by the oxide 230a, the oxide 230b, the oxide layer 243B, and the conductor layer 242B and the top surface of the insulator 222 is an acute angle. In that case, the angle formed by the side surfaces of the oxide 230a, the oxide 230b, the oxide layer 243B, and the conductor layer 242B and the top surface of the insulator 222 is preferably greater than or equal to 60° and less than 70°. With such a shape, in later steps, the coverage with the insulator 272 and the like can be improved, so that defects such as a void can be reduced.

There is a curved surface between the side surface of the conductor layer 242B and the top surface of the conductor layer 242B. That is, an end portion of the side surface and an end portion of the top surface are preferably curved (hereinafter such a curved shape is also referred to as a rounded shape). The radius of curvature of the curved surface at an end portion of the conductor layer 242B is greater than or equal to 3 nm and less than or equal to 10 nm, preferably greater than or equal to 5 nm and less than or equal to 6 nm, for example. When the end portions are not angular, coverage with films in later deposition steps is improved.

Figure 7A:
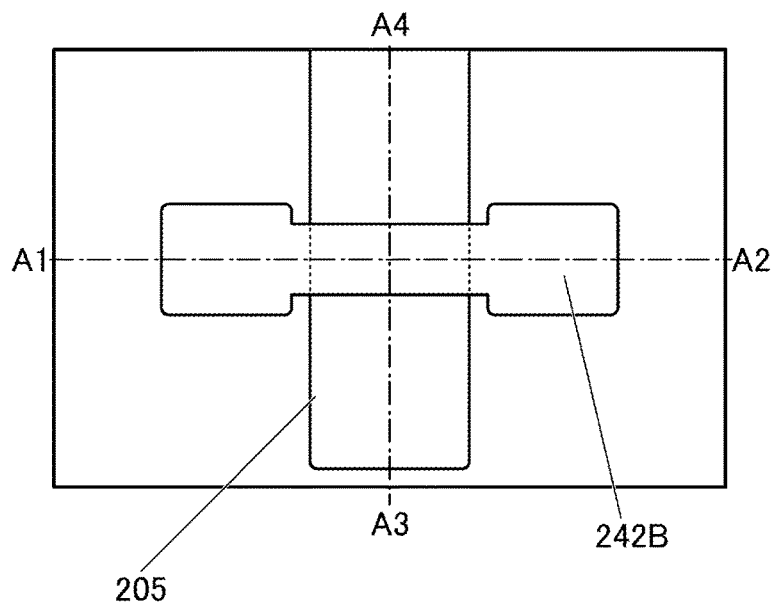
FIG. 7A is a top view illustrating a manufacturing method of a semiconductor device of one embodiment of the present invention.
Figure 7C:
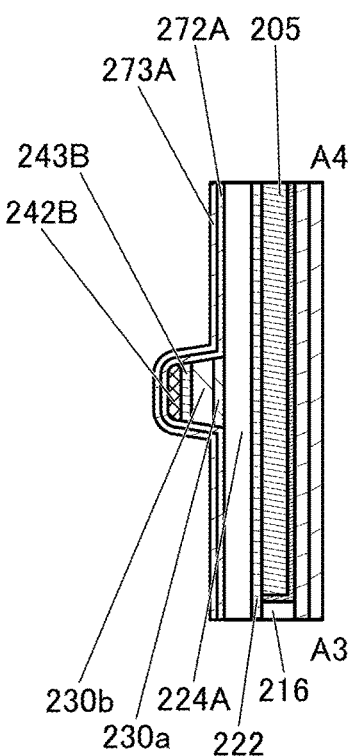
FIG. 7B and FIG. 7C are cross-sectional views illustrating a manufacturing method of a semiconductor device of one embodiment of the present invention.
Figure 7B:
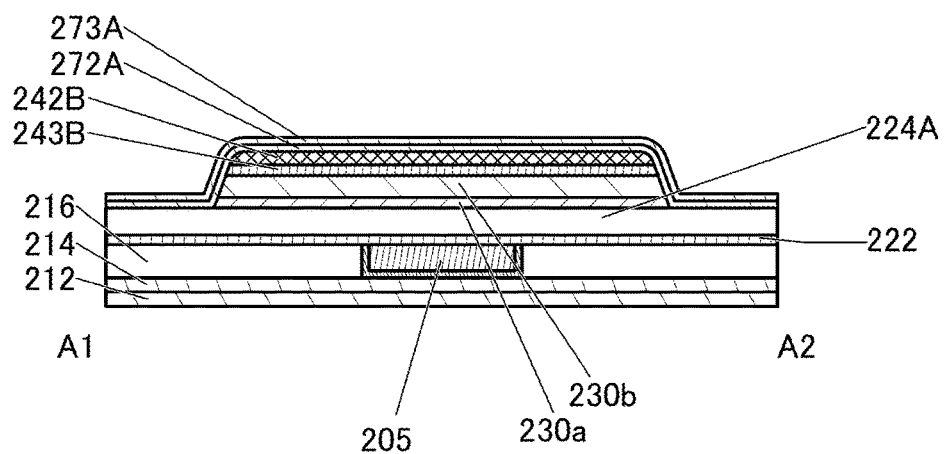

Next, an insulating film 272A is deposited over the insulating film 224A, the oxide 230a, the oxide 230b, the oxide layer 243B, and the conductor layer 242B (see FIG. 7).

The insulating film 272A can be deposited by a sputtering method, a CVD method, an MBE method, a PLD method, an ALD method, or the like. As the insulating film 272A, an insulating film having a function of inhibiting transmission of oxygen is preferably used. For example, aluminum oxide, silicon nitride, silicon oxide, or gallium oxide may be deposited by a sputtering method or an ALD method.

Then, an insulating film 273A is deposited over the insulating film 272A (see FIG. 7). The insulating film 273A can be deposited by a sputtering method, a CVD method, an MBE method, a PLD method, an ALD method, or the like. For example, aluminum oxide is preferably deposited by an ALD method. In this embodiment, aluminum oxide is deposited by an ALD method. Note that it is possible to employ a structure in which the insulating film 273A is not deposited.

Next, an insulating film to be the insulator 280 is deposited over the insulating film 273A. The insulating film to be the insulator 280 can be deposited by a sputtering method, a CVD method, an MBE method, a PLD method, an ALD method, or the like. For example, as the insulator 280, a silicon oxide film is formed by a sputtering method, and a silicon oxide film may be formed thereover by a PEALD method or a thermal ALD method. Here, when the insulator 280 is deposited by a PEALD method or a thermal ALD method, the hydrogen concentration in the insulator 280 can be lowered as shown in FIG. 2 and FIG. 3.

Figure 8A:
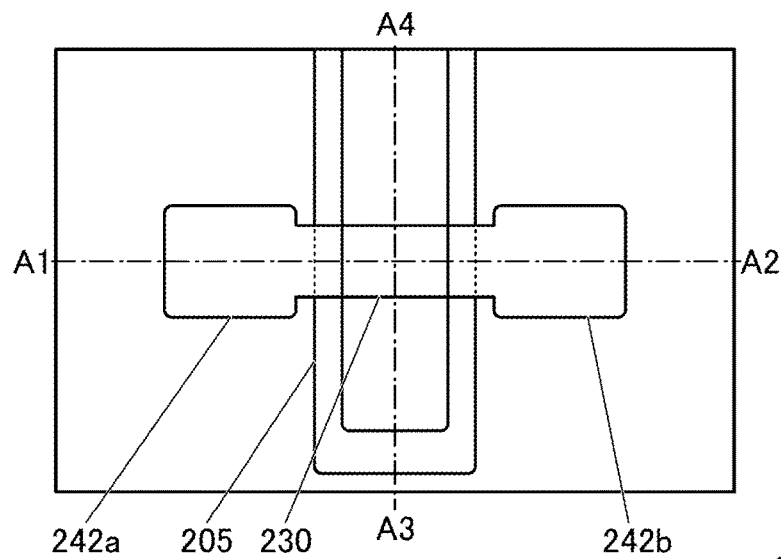
FIG. 8A is a top view illustrating a manufacturing method of a semiconductor device of one embodiment of the present invention.
Figure 8C:
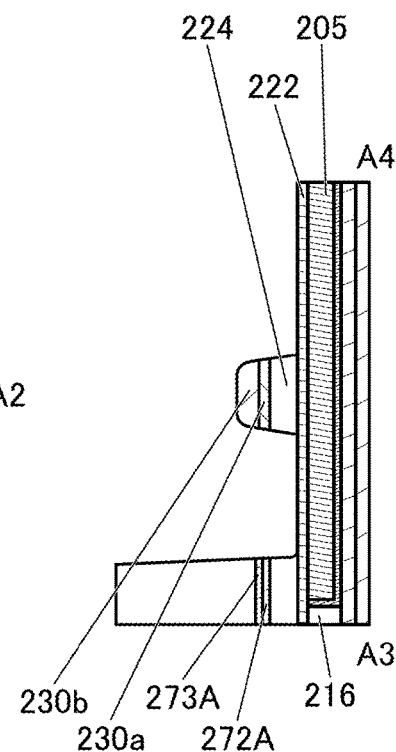
FIG. 8B and FIG. 8C are cross-sectional views illustrating a manufacturing method of a semiconductor device of one embodiment of the present invention.
Figure 8B:
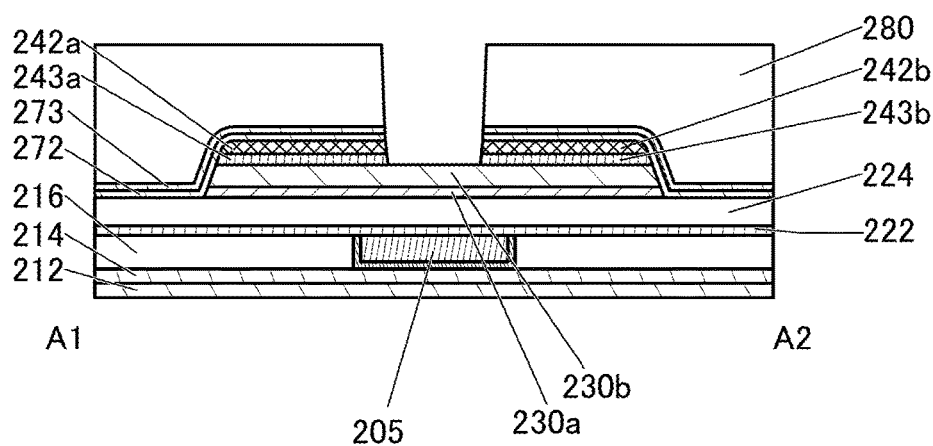

Next, the insulating film to be the insulator 280 is subjected to CMP treatment, so that the insulator 280 having a flat top surface is formed (see FIG. 8).

Then, part of the insulator 280, part of the insulating film 273A, part of the insulating film 272A, the oxide layer 243B, and part of the conductor layer 242B are processed to form an opening reaching the oxide 230b. The opening is preferably formed to overlap with the conductor 205. By formation of the opening, the oxide 243a, the oxide 243b, the conductor 242a, the conductor 242b, the insulator 272, the insulator 273, and the insulator 224 are formed (see FIG. 8).

Part of the insulator 280, part of the insulating film 273A, part of the insulating film 272A, the oxide layer 243B, and part of the conductor layer 242B may be processed under different conditions. For example, part of the insulator 280 may be processed by a dry etching method, part of the insulating film 273A may be processed by a wet etching method, and part of the insulating film 272A, the oxide layer 243B, and part of the conductor layer 242B may be processed by a dry etching method.

In some cases, the treatment such as the dry etching performed thus far causes the attachment or diffusion of impurities due to an etching gas or the like to a surface or an inside of the oxide 230a, the oxide 230b, or the like. Examples of the impurities include fluorine and chlorine.

In order to remove the above impurities and the like, cleaning is performed. Examples of the cleaning method include wet cleaning using a cleaning solution or the like, plasma treatment using plasma, and cleaning by heat treatment, and any of these cleanings may be performed in appropriate combination.

The wet cleaning may be performed using an aqueous solution in which oxalic acid, phosphoric acid, ammonia water, hydrofluoric acid, or the like is diluted with carbonated water or pure water. Alternatively, ultrasonic cleaning using pure water or carbonated water may be performed.

After the etching or the cleaning, heat treatment may be performed. The heat treatment may be performed at a temperature higher than or equal to 100° C. and lower than or equal to 400° C. Note that the heat treatment is performed in a nitrogen gas or inert gas atmosphere, or an atmosphere containing an oxidizing gas at 10 ppm or more, 1% or more, or 10% or more. For example, the heat treatment may be performed in an oxygen atmosphere. This provides oxygen to the oxide 230a and the oxide 230b, and reduces oxygen vacancies $V_O$. Alternatively, the heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

Figure 9A:
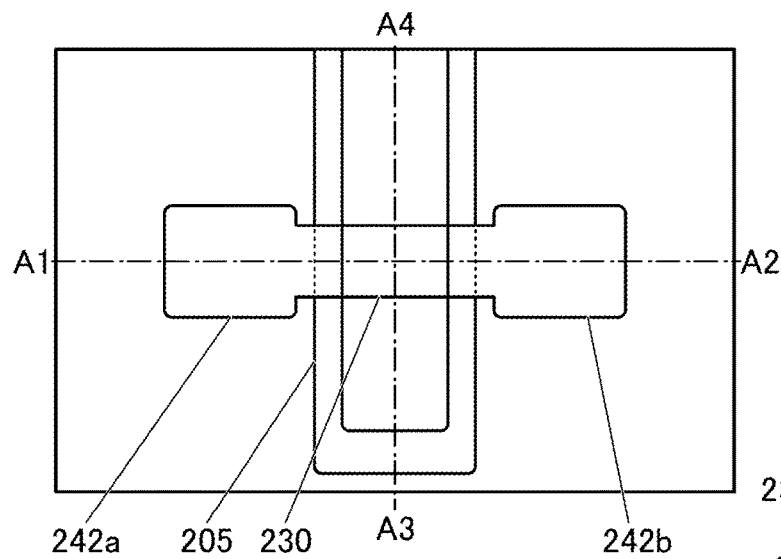
FIG. 9A is a top view illustrating a manufacturing method of a semiconductor device of one embodiment of the present invention.
Figure 9C:
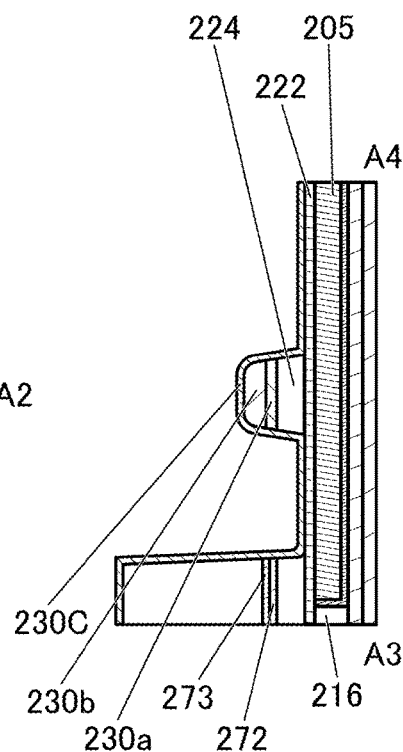
FIG. 9B and FIG. 9C are cross-sectional views illustrating a manufacturing method of a semiconductor device of one embodiment of the present invention.
Figure 9B:
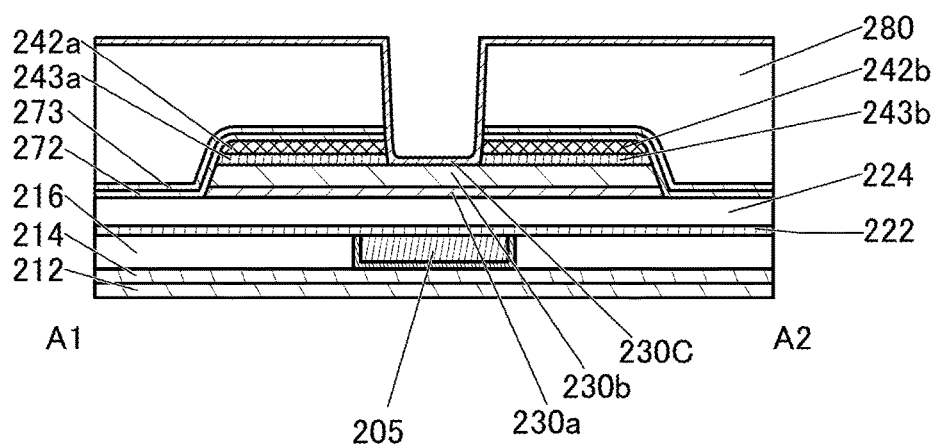

Next, heat treatment may be performed, the heat treatment may be performed under reduced pressure, and an oxide film 230C may be successively deposited without exposure to the air (see FIG. 9). Preferably, the heat treatment is performed in an atmosphere containing oxygen.

The treatment can remove moisture and hydrogen adsorbed onto the surface of the oxide 230b and the like, and further can reduce the moisture concentration and the hydrogen concentration of the oxide 230a and the oxide 230b. The heat treatment is preferably performed at a temperature higher than or equal to 100° C. and lower than or equal to 400° C., further preferably performed at a temperature higher than or equal to 150° C. and lower than or equal to 350° C. In this embodiment, the heat treatment is performed at 200° C. under reduced pressure.

Here, it is preferable that the oxide film 230C be provided in contact with at least part of the side surface of the oxide 230a, part of the side surface and part of the top surface of the oxide 230b, part of the side surface of the oxide 243, part of the side surface of the conductor 242, the side surface of the insulator 272, the side surface of the insulator 273, and the side surface of the insulator 280. When the conductor 242 is surrounded by the oxide 243, the insulator 272, and the oxide film 230C, a decrease in the conductivity of the conductor 242 due to oxidation can be inhibited in subsequent steps.

The oxide film 230C can be deposited by a sputtering method, a CVD method, an MBE method, a PLD method, an ALD method, or the like. The atomic ratio of Ga to In in the oxide film 230C is preferably greater than the atomic ratio of Ga to In in the oxide film 230B. In this embodiment, the oxide film 230C is deposited by a sputtering method using a target with In:Ga:Zn=1:3:4 [atomic ratio].

The oxide film 230C may have a stacked-layer structure. For example, the oxide film 230C may be deposited by a sputtering method using a target of In:Ga:Zn=4:2:4.1 [atomic ratio] and successively deposited using a target of In:Ga:Zn=1:3:4 [atomic ratio].

In the deposition of the oxide film 230C, part of oxygen contained in the sputtering gas is sometimes supplied to the oxide 230a and the oxide 230b. When the oxide film 230C is deposited, part of oxygen contained in the sputtering gas is supplied to the insulator 280 in some cases. Therefore, the proportion of oxygen contained in the sputtering gas for the oxide film 230C is preferably higher than or equal to 70%, further preferably higher than or equal to 80%, still further preferably 100%.

Next, heat treatment may be performed. The heat treatment may be performed under reduced pressure, and irradiation with an electromagnetic wave 290 or deposition of an insulating film 250A may be successively performed without exposure to the air. The heat treatment can remove moisture and hydrogen adsorbed onto the surface of the oxide film 230C and the like, and further can reduce the moisture concentration and the hydrogen concentration of the oxide 230a, the oxide 230b, and the oxide film 230C. The heat treatment is preferably performed at a temperature higher than or equal to 100° C. and lower than or equal to 400° C. In this embodiment, the heat treatment is performed at 200° C.

Figure 10A:
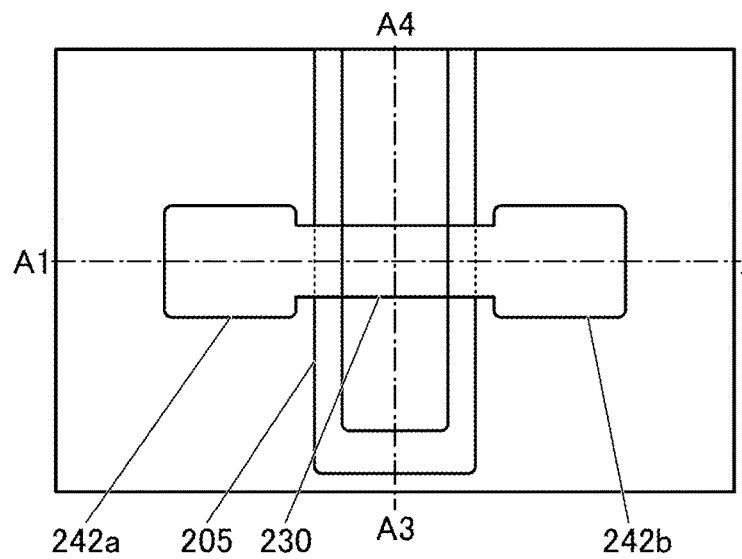
FIG. 10A is a top view illustrating a manufacturing method of a semiconductor device of one embodiment of the present invention.
Figure 10C:
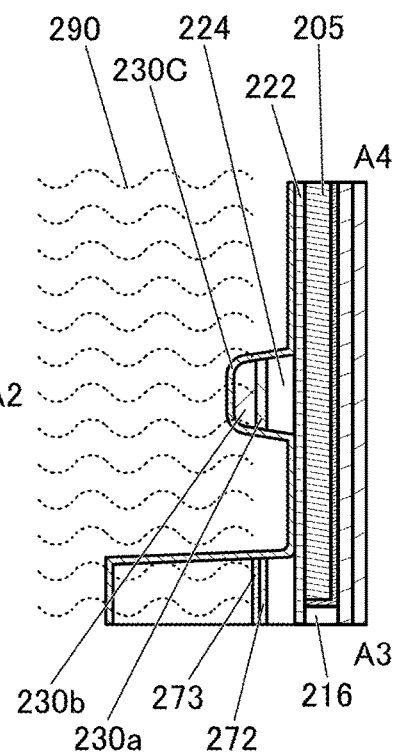
FIG. 10B and FIG. 10C are cross-sectional views illustrating a manufacturing method of a semiconductor device of one embodiment of the present invention.
Figure 10B:
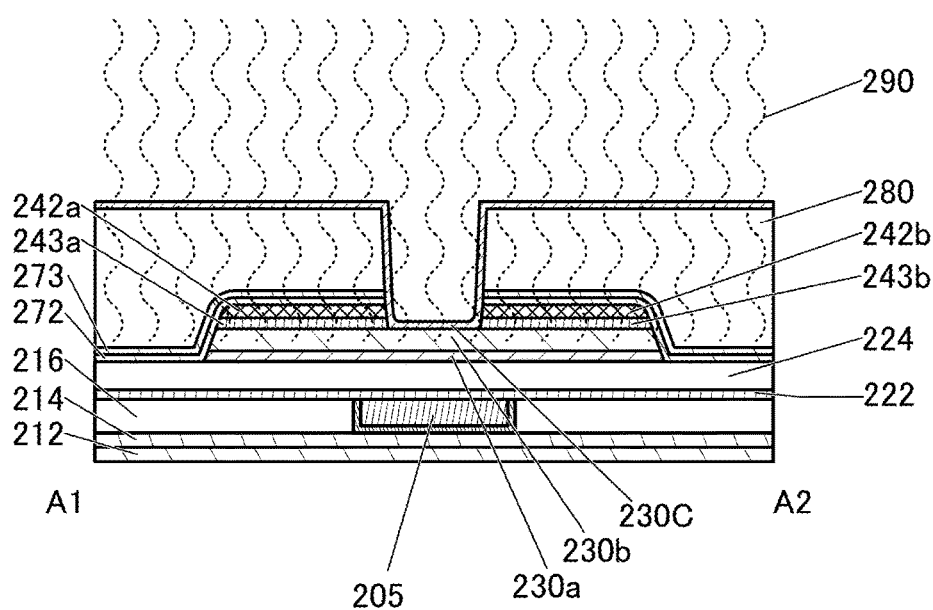

Next, as shown in FIG. 3, the oxide 230C, the insulator 280, the oxide 230b, and the oxide 230a may be irradiated with the electromagnetic wave 290 (see FIG. 10). Here, a microwave or a high-frequency wave such as RF may be used as the electromagnetic wave 290. The emitted electromagnetic wave 290 penetrates the oxide 230C, the insulator 280, the oxide 230b, and the oxide 230a, so that $V_OH$ in these is removed. Some hydrogen generated at this time is bonded to oxygen to be $H_2O$, and removed from the oxide 230 and the insulator 280, in some cases. Some hydrogen may be gettered by the conductor 242. The irradiation with the electromagnetic wave 290 can reduce the hydrogen concentrations in the oxide 230C, the insulator 280, the oxide 230b, and the oxide 230a.

Moreover, in the irradiation with the electromagnetic wave 290, an oxygen gas may be made in a plasma state by the electromagnetic wave 290 to form oxygen radicals. That is, plasma treatment may be performed on the oxide 230C, the insulator 280, the oxide 230b, and the oxide 230a in an atmosphere containing oxygen. Oxygen vacancies $V_O$ that are formed in the oxide 230C, the insulator 280, the oxide 230b, and the oxide 230a by the irradiation with the electromagnetic wave 290 can be filled with the formed oxygen radicals. Thus, during the irradiation with the electromagnetic wave 290, $V_OH$ and oxygen vacancies $V_O$ in the oxide 230C, the insulator 280, the oxide 230b, and the oxide 230a can be reduced.

Figure 11A:
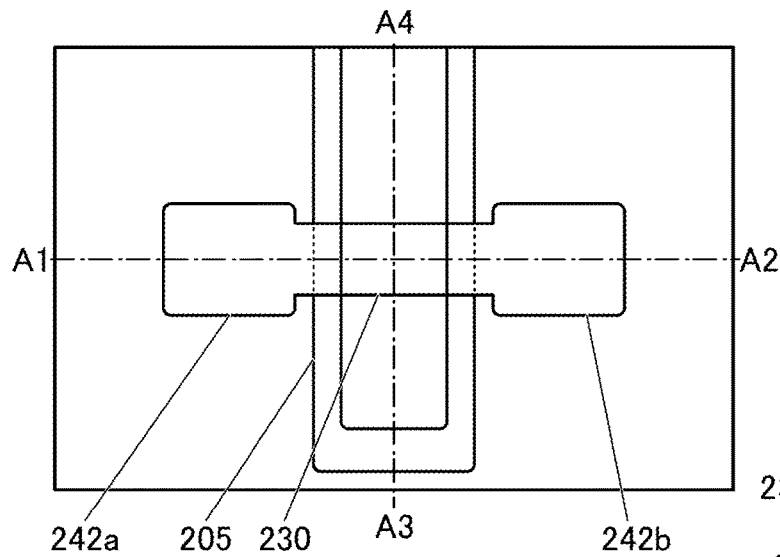
FIG. 11A is a top view illustrating a manufacturing method of a semiconductor device of one embodiment of the present invention.
Figure 11C:
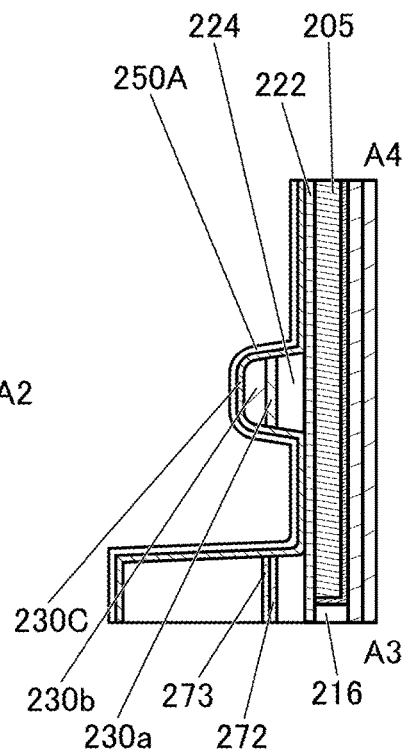
FIG. 11B and FIG. 11C are cross-sectional views illustrating a manufacturing method of a semiconductor device of one embodiment of the present invention.
Figure 11B:
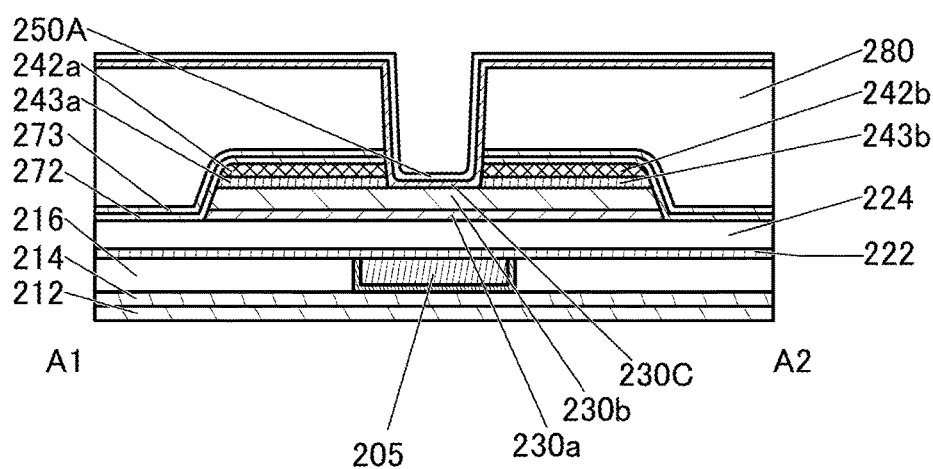
Figure 12A:
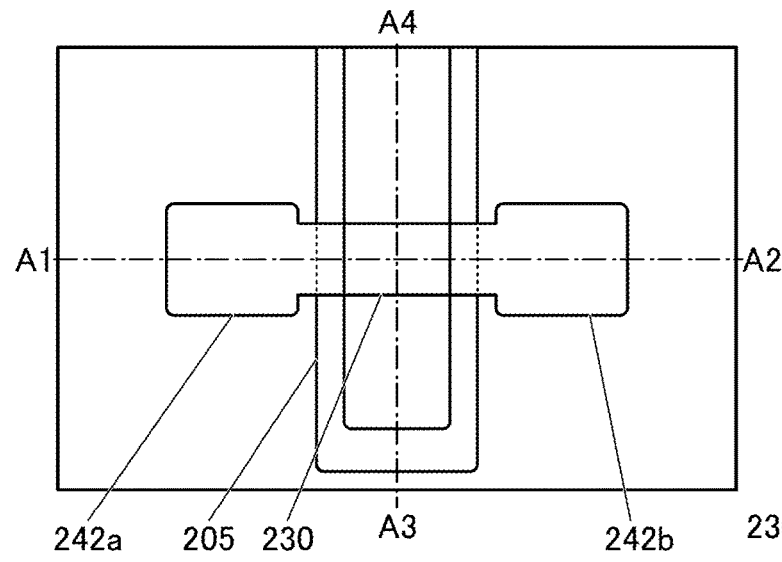
FIG. 12A is a top view illustrating a manufacturing method of a semiconductor device of one embodiment of the present invention.
Figure 12C:
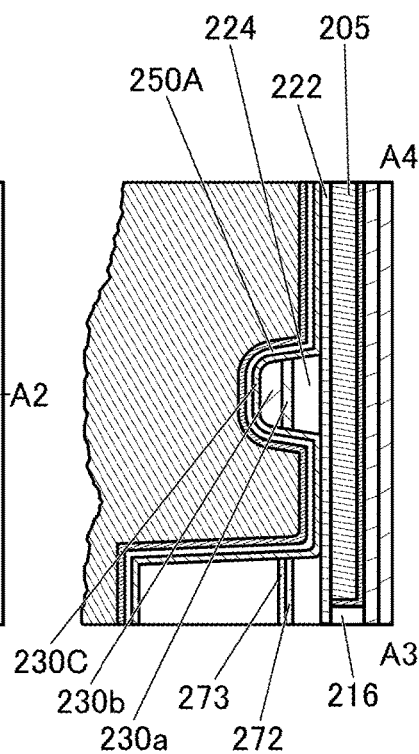
FIG. 12B and FIG. 12C are cross-sectional views illustrating a manufacturing method of a semiconductor device of one embodiment of the present invention.
Figure 12B:
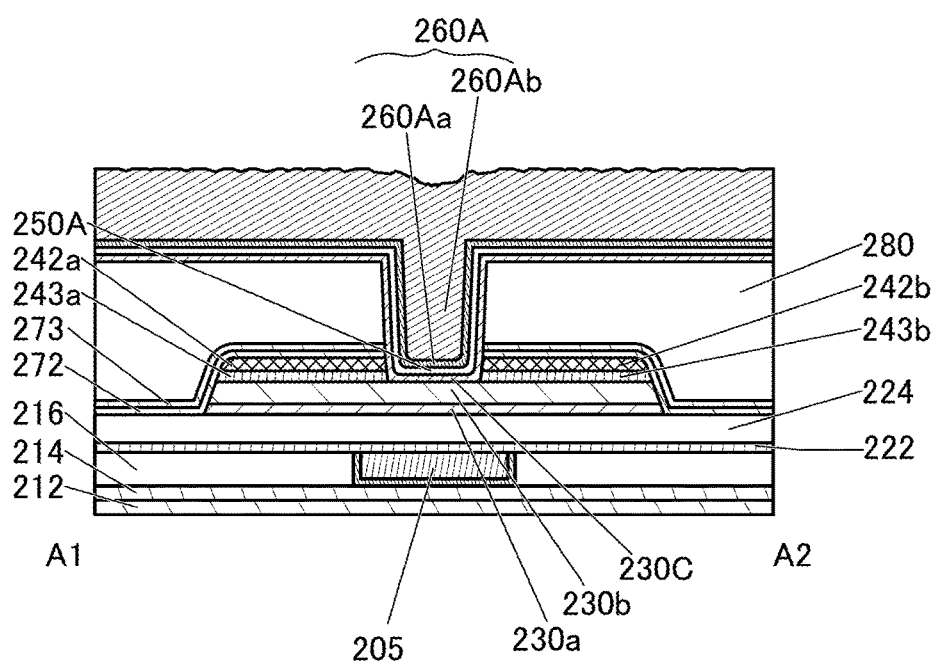

Next, the insulating film 250A is formed over the oxide 230C (see FIG. 11). At this time, the insulating film 250A is preferably deposited successively after the irradiation with the electromagnetic wave 290 without exposure to the air. As shown in FIG. 2 and FIG. 3, the insulating film 250A is preferably deposited by an ALD method such as a PEALD method or a thermal ALD method. As the insulating film 250A, silicon oxide or silicon oxynitride is preferably deposited. In the case where the insulating film 250A is deposited by a PEALD method and the substrate temperature is made to be higher than 200° C., preferably higher than or equal to 300° C., further preferably higher than or equal to 350° C., the concentration of hydrogen contained in the insulating film 250A, the insulator 280, and the oxide 230 can be lowered. In the case where the insulating film 250A is deposited by a thermal ALD method and the substrate temperature is made to be higher than 300° C., preferably higher than or equal to 350° C., the concentration of hydrogen contained in the insulating film 250A, the insulator 280, and the oxide 230 can be lowered.

Figure 15A:
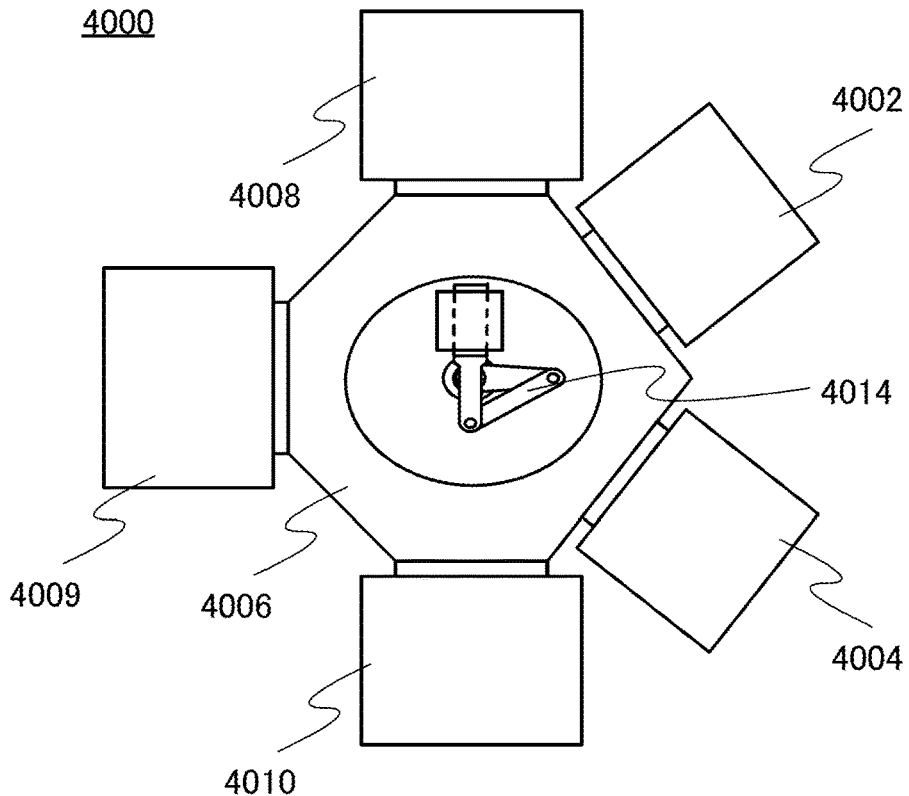
FIG. 15A is a top view illustrating a deposition apparatus of one embodiment of the present invention.
Figure 15B:
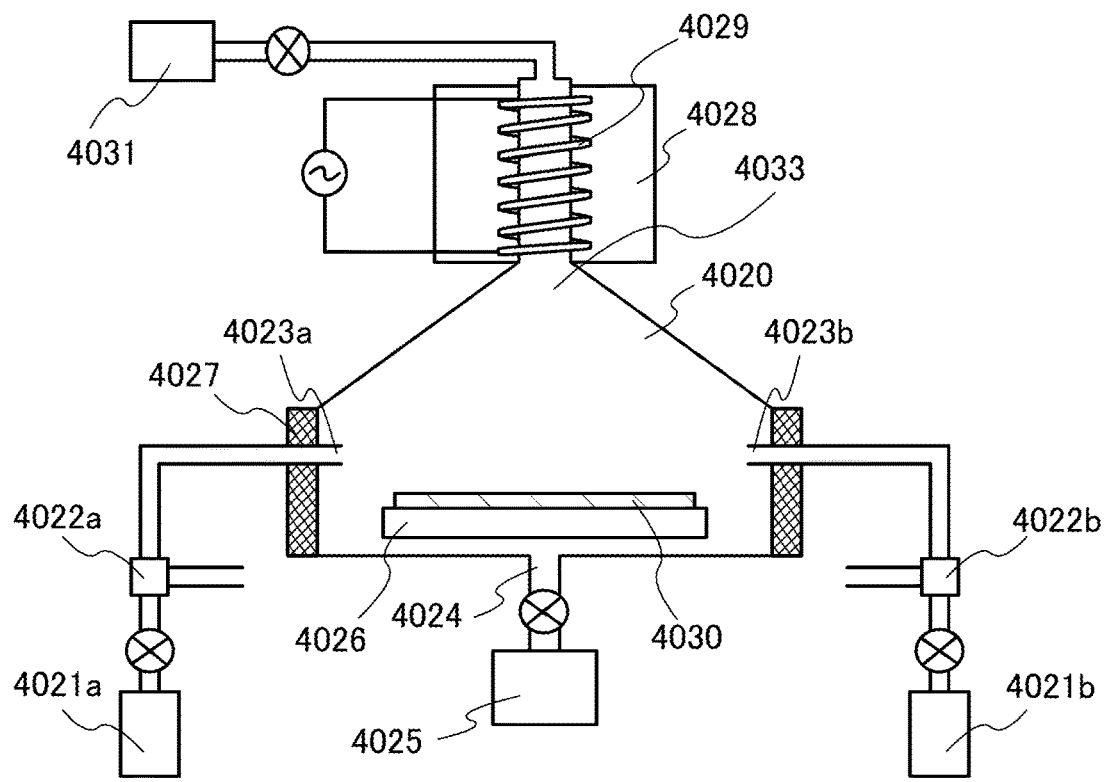
FIG. 15B is a cross-sectional view illustrating a deposition apparatus of one embodiment of the present invention.

Here, the structure of a deposition apparatus 4000 is described with reference to FIG. 15A and FIG. 15B as an example of an apparatus with which deposition can be performed by an ALD method. FIG. 15A is a schematic view of the multi-chamber type deposition apparatus 4000, and FIG. 15B is a cross-sectional view of an ALD apparatus that can be used for the deposition apparatus 4000.

<Structure Example of Deposition Apparatus>

The deposition apparatus 4000 includes a carrying-in/out chamber 4002, a carrying-in/out chamber 4004, a transfer chamber 4006, a deposition chamber 4008, a deposition chamber 4009, a deposition chamber 4010, and a transfer arm 4014. Here, the carrying-in/out chamber 4002, the carrying-in/out chamber 4004, and the deposition chambers 4008 to 4010 are each independently connected to the transfer chamber 4006. Thus, successive deposition can be performed in the deposition chambers 4008 to 4010 without exposure to the air, whereby entry of impurities into a film can be prevented. Moreover, contamination of an interface between a substrate and a film and interfaces between films can be reduced, so that clean interfaces can be obtained.

Note that in order to prevent attachment of moisture and the like, the carrying-in/out chamber 4002, the carrying-in/out chamber 4004, the transfer chamber 4006, and the deposition chambers 4008 to 4010 are preferably filled with an inert gas (such as a nitrogen gas) whose dew point is controlled, and desirably maintain reduced pressure.

An ALD apparatus can be used as the deposition chambers 4008 to 4010. Alternatively, a structure may be employed in which a deposition apparatus other than an ALD apparatus is used as any of the deposition chambers 4008 to 4010. Examples of the deposition apparatus that can be used as any of the deposition chambers 4008 to 4010 include a sputtering apparatus, a plasma CVD (PECVD: Plasma Enhanced CVD) apparatus, a thermal CVD (TCVD) apparatus, a photo CVD apparatus, a metal CVD (MCVD) apparatus, and a metal organic CVD (MOCVD) apparatus. An apparatus having a function other than a deposition apparatus may be provided in one or more of the deposition chambers 4008 to 4010. Examples of the apparatus include a heating apparatus (typically, a vacuum heating apparatus) and a plasma generation apparatus (typically, a μ-wave plasma generation apparatus).

For example, in the case where the deposition chamber 4008 is a sputtering apparatus, the deposition chamber 4009 is an ALD apparatus, and the deposition chamber 4010 is a metal CVD apparatus, a metal oxide can be formed in the deposition chamber 4008, an insulating film functioning as a gate insulating film can be formed in the deposition chamber 4009, and a conductive film functioning as a gate electrode can be formed in the deposition chamber 4010. At that time, the metal oxide, the insulating film thereover, and the conductive film thereover can be formed successively without exposure to the air.

Although the deposition apparatus 4000 has a structure including the carrying-in/out chamber 4002, the carrying-in/out chamber 4004, and the deposition chambers 4008 to 4010, the present invention is not limited thereto. The number of the deposition chambers in the deposition apparatus 4000 may be four or more. The number of the deposition chambers in the deposition apparatus 4000 may be two or one. The deposition apparatus 4000 may be of a single-wafer type or may be of a batch type, in which case deposition is performed on a plurality of substrates at a time.

<ALD Apparatus>

Next, a structure of an ALD apparatus that can be used as the deposition apparatus 4000 is described with reference to FIG. 15B. The ALD apparatus includes a deposition chamber (a chamber 4020), a source material supply portion 4021 (a source material supply portion 4021a and source material supply portion 4021b), a source material supply portion 4031, high-speed valves 4022a and 4022b that are introduction amount controllers, a source material introduction port 4023 (source material introduction ports 4023a and 4023b), a source material introduction port 4033, a source material exhaust port 4024, and an evacuation unit 4025. The source material introduction ports 4023a, 4023b, and 4033 provided in the chamber 4020 are connected to the source material supply portions 4021a, 4021b, and 4031, respectively, through supply tubes and valves, and the source material exhaust port 4024 is connected to the evacuation unit 4025 through an exhaust tube, a valve, and a pressure controller.

A plasma generation apparatus 4028 is connected to the chamber 4020 as illustrated in FIG. 15B, whereby deposition can be performed by a PEALD method as well as a thermal ALD method. It is preferable that the plasma generation apparatus 4028 be an inductively coupled plasma (ICP)-type plasma generation apparatus using a coil 4029 connected to a high-frequency power source. The high-frequency power source is capable of outputting power with a frequency higher than or equal to 10 kHz and lower than or equal to 100 MHz, preferably higher than or equal to 1 MHz and lower than or equal to 60 MHz, more preferably higher than or equal to 10 MHz and lower than or equal to 60 MHz. For example, power with a frequency of 13.56 MHz, 60 MHz can be output. In the ICP-type plasma generation apparatus, plasma can be generated apart from a substrate. When plasma is generated in this manner, plasma damage on the substrate can be reduced.

A PEALD method enables deposition without decreasing the deposition rate even at low temperatures, and thus is preferably used for a single-wafer type deposition apparatus with low deposition efficiency.

A substrate holder 4026 exists in the chamber, and a substrate 4030 is put over the substrate holder 4026. The substrate holder 4026 may be provided with a mechanism to which a constant potential or a high-frequency wave is applied. Alternatively, the substrate holder 4026 may be floating or grounded. A heater 4027, which is provided on an outside wall of the chamber, can control the temperature inside the chamber 4020 and the temperatures of the substrate holder 4026, the surface of the substrate 4030, and the like. The heater 4027 is preferably capable of controlling the temperature of the surface of the substrate 4030 to higher than or equal to 100° C. and lower than or equal to 500° C., preferably higher than or equal to 200° C. and lower than or equal to 400° C., and is capable of setting the temperature of the heater 4027 itself to higher than or equal to 100° C. and lower than or equal to 500° C.

In the source material supply portions 4021a, 4021b, and 4031, a source gas is formed from a solid source material or a liquid source material using a vaporizer, a heating unit, or the like. Alternatively, the source material supply portions 4021a, 4021b, and 4031 may supply a source gas.

Although FIG. 15B illustrates the example in which two source material supply portions 4021 and one source material supply portion 4031 are provided, this embodiment is not limited thereto. One or three or more source material supply portions 4021 may be provided. In addition, two or more source material supply portions 4031 may be provided. The high-speed valves 4022a and 4022b can be precisely controlled by time and are configured to control supply of a source gas from the source material supply portion 4021a and supply of a source gas from the source material supply portion 4021b.

In the deposition apparatus illustrated in FIG. 15B, a thin film is formed over a substrate surface in such a manner that after the substrate 4030 is transferred onto the substrate holder 4026 and the chamber 4020 is sealed, the substrate 4030 is set to a desired temperature (e.g., higher than or equal to 100° C. and lower than or equal to 500° C., preferably higher than or equal to 200° C. and lower than or equal to 400° C.) by the heater 4027, and supply of the source gas from the source material supply portion 4021a, evacuation with the evacuation unit 4025, supply of the source gas from the source material supply portion 4031, and evacuation with the evacuation unit 4025 are repeated. Furthermore, in the deposition of the thin film, supply of a source gas supplied from the source material supply portion 4021b and evacuation with the evacuation unit 4025 may further be performed. The temperature of the heater 4027 is determined as appropriate depending on the kind of the film to be formed, the source gas, a desired film quality, and heat resistances of a substrate and a film and an element that are provided thereover. For example, the deposition may be performed when the temperature of the heater 4027 is set to higher than or equal to 200° C. and lower than or equal to 300° C. or higher than or equal to 300° C. and lower than or equal to 500° C.

When deposition is performed while the substrate 4030 is heated by the heater 4027, heat treatment for the substrate 4030 that is necessary in a later step can be omitted. That is, with the use of the chamber 4020 or the deposition apparatus 4000 provided with the heater 4027, formation of a film over the substrate 4030 can also serve as heat treatment for the substrate 4030.

In the deposition apparatus illustrated in FIG. 15B, silicon oxide or the like shown in FIG. 2 and FIG. 3 can be deposited by appropriate selection of source materials (e.g., a volatile organic metal compound) used in the source material supply portions 4021 and 4031. In the case where silicon oxide is deposited, precursors containing silicon are supplied from the first source material supply portion 4021. The above-described precursors can be used as the precursors containing silicon. Reactants are supplied from the source material supply portion 4031. An oxidizer containing at least one of ozone and oxygen can be used as the reactants. The oxidizer preferably does not contain hydrogen.

FIG. 16 illustrates a different structure of an ALD apparatus that can be used for the deposition apparatus 4000. Note that detailed description on structures and functions similar to those of the ALD apparatus in FIG. 15B are omitted in some cases.

Figure 16A:
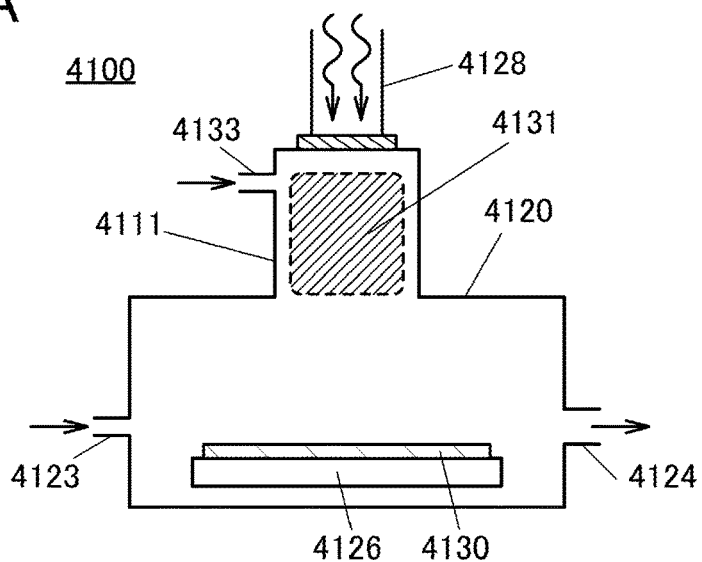
FIG. 16A to FIG. 16C are cross-sectional views illustrating a deposition apparatus of one embodiment of the present invention.

FIG. 16A is a schematic view illustrating one embodiment of a PEALD apparatus. A PEALD ALD apparatus 4100 is provided with a reaction chamber 4120 and a plasma generation chamber 4111 above the reaction chamber 4120. The reaction chamber 4120 can be referred to as a chamber. Alternatively, the reaction chamber 4120 and the plasma generation chamber 4111 can be collectively referred to as a chamber. The reaction chamber 4120 includes a source material introduction port 4123 and a source material exhaust port 4124, and the plasma generation chamber 4111 includes a source material introduction port 4133. Furthermore, by plasma generation apparatus 4128, a high-frequency wave such as RF or a microwave can be applied to a gas introduced into the generation chamber 4111, so that plasma 4131 can be generated in the plasma generation chamber 4111. In the case where the plasma 4131 is generated using a microwave, a microwave with a frequency of 2.45 GHz is typically used. Such plasma generated by the microwave is referred to as ECR (Electron Cyclotron Resonance) plasma in some cases. A substrate holder 4126 is included in the reaction chamber 4120, and a substrate 4130 is provided thereover. A source gas introduced from the source material introduction port 4123 is decomposed by heat from a heater provided in the reaction chamber 4120 and is deposited over the substrate 4130. A source gas introduced from the source material introduction port 4133 turns into a plasma state by the plasma generation apparatus 4128. The source gas in the plasma state is recombined with electrons and other molecules to be in a radical state before it reaches the surface of the substrate 4130, and reaches the substrate 4130. An ALD apparatus that performs deposition using a radical in such a manner may also be referred to as a radical ALD (Radical-Enhanced ALD) apparatus. In the PEALD apparatus 4100, the plasma generation chamber 4111 is provided above the reaction chamber 4120; however, this embodiment is not limited to this structure. The plasma generation chamber 4111 may be provided in contact with a side surface of the reaction chamber 4120.

Figure 16B:
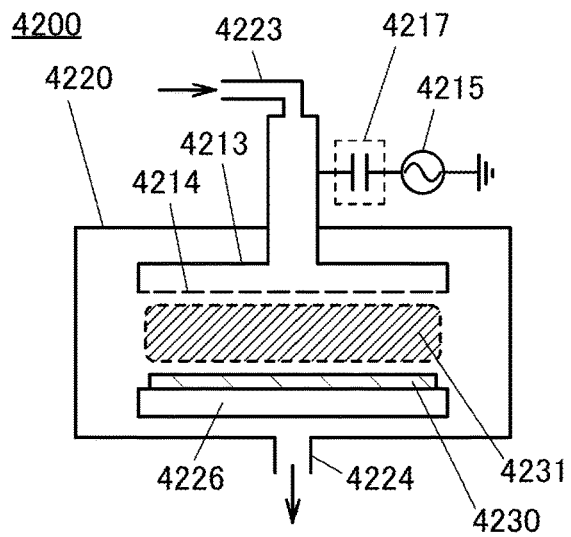

FIG. 16B is a schematic view illustrating one embodiment of a PEALD apparatus. A PEALD apparatus 4200 includes a chamber 4220. The chamber 4220 includes an electrode 4213, a source material exhaust port 4224, and a substrate holder 4226, and a substrate 4230 is put thereover. The electrode 4213 includes a source material introduction port 4223 and a shower head 4214 that supplies the introduced source gas into the chamber 4220. A power source 4215 capable of applying a high-frequency wave through a capacitor 4217 is connected to the electrode 4213. The substrate holder 4226 may be provided with a mechanism to which a constant potential or a high-frequency wave is applied. Alternatively, the substrate holder 4226 may be floating or grounded. The electrode 4213 and the substrate holder 4226 function as an upper electrode and a lower electrode for generating plasma 4231, respectively. A source gas introduced from the source material introduction port 4223 is decomposed by heat from a heater provided in the chamber 4220 and is deposited over the substrate 4230. Alternatively, the source gas introduced from the source material introduction port 4223 becomes in a plasma state between the electrode 4213 and the substrate holder 4226. The source gas in the plasma state enters the substrate 4230 owing to a potential difference (also referred to as an ion sheath) generated between the plasma 4231 and the substrate 4230.

Figure 16C:
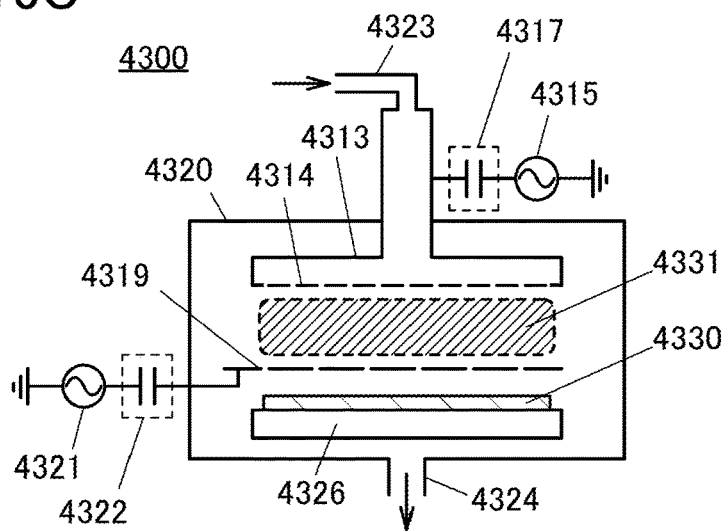

FIG. 16C is a schematic view illustrating one embodiment of a PEALD apparatus that is different from that in FIG. 16B. A PEALD apparatus 4300 includes a chamber 4320. The chamber 4320 includes an electrode 4313, a source material exhaust port 4324, and a substrate holder 4326, and a substrate 4330 is provided thereover. The electrode 4313 includes a source material introduction port 4323 and a shower head 4314 that supplies the introduced source gas into the chamber 4320. A power source 4315 capable of applying a high-frequency wave through a capacitor 4317 is connected to the electrode 4313. The substrate holder 4326 may be provided with a mechanism to which a constant potential or a high-frequency wave is applied. Alternatively, the substrate holder 4326 may be floating or grounded. The electrode 4313 and the substrate holder 4326 function as an upper electrode and a lower electrode for generating plasma 4331, respectively. The PEALD apparatus 4300 is different from the PEALD apparatus 4200 in that a mesh 4319 to which a power source 4321 capable of applying a high-frequency wave through a capacitor 4322 is connected is provided between the electrode 4313 and the substrate holder 4326. With the mesh 4319, the plasma 4231 can be away from the substrate 4130. A source gas introduced from the source material introduction port 4323 is decomposed by heat from a heater provided in the chamber 4320 and is deposited over the substrate 4330. Alternatively, the source gas introduced from the source material introduction port 4323 becomes in a plasma state between the electrode 4313 and the substrate holder 4326. Charge of the source gas in the plasma state is removed by the mesh 4319 and the source gas reaches the substrate 4130 while being in an electrically neutral state such as a radical. Therefore, it is possible to perform deposition with small damage due to entering of ions or plasma.

<Deposition Sequence>

Figure 17A:
FIG. 17A and FIG. 17B are diagrams illustrating a deposition method of one embodiment of the present invention.

FIG. 17A shows a deposition sequence using the ALD apparatus illustrated in FIG. 15B. First, the substrate 4030 is set on the substrate holder 4026 in the chamber 4020 (S101). Next, the temperature of the heater 4027 is adjusted (S102). Then, the substrate 4030 is held on the substrate holder 4026 so that the temperature of the substrate 4030 becomes uniform in the substrate surface (S103). Next, precursors and reactants are alternately introduced into the chamber 4020 with the purges interposed therebetween, so that deposition is performed over the substrate 4030 (S104). In addition, treatment for setting the inside of the chamber 4020 in an oxygen atmosphere may be performed between S103 and S104. The inside of the chamber 4020 is set in an oxygen atmosphere after setting and holding the substrate 4030, whereby oxygen can be added to the substrate 4030 and the film provided over the substrate 4030 in some cases. Furthermore, hydrogen can be released from the substrate 4030 before deposition and the film provided over the substrate 4030 in some cases. Hydrogen in the substrate 4030 or the film sometimes reacts with oxygen added to the substrate 4030 or the film, and is released from the substrate 4030 or the film as water ($H_2O$).

Figure 17B:
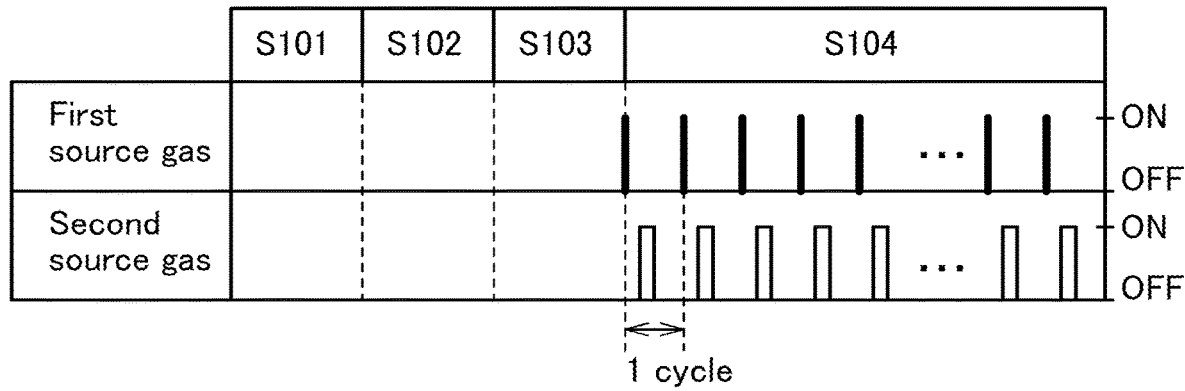

FIG. 17B shows a specific example of the above deposition sequence. In accordance with S101 to S103 described above, the substrate 4030 is set on the substrate holder 4026, the temperature of the heater 4027 is adjusted, and the substrate 4030 is held.

Next, precursors and reactants are alternately introduced to perform deposition over the substrate 4030 (S104). The introduction of the precursors and the introduction of the reactants are each performed in a pulsed form. In FIG. 17B, the introduction of the precursors and the introduction of the reactants are each shown by ON, and a period in which the source gases are not introduced is shown by OFF. In a period neither the precursors nor reactants are introduced, the purge is performed in the chamber 4020. The pulse time of introducing the precursors into the chamber 4020 is preferably longer than or equal to 0.1 seconds and shorter than or equal to 1 second, further preferably longer than or equal to 0.1 seconds and shorter than or equal to 0.5 seconds. The period during which the precursors are not introduced, that is, the time for performing the purge in the chamber 4020, is longer than or equal to 0.05 seconds and shorter than or equal to 30 seconds, preferably longer than or equal to 1 second and shorter than or equal to 20 seconds. The pulse time of introducing the reactants into the chamber 4020 is preferably longer than or equal to 0.1 seconds and shorter than or equal to 30 seconds, further preferably longer than or equal to 0.3 seconds and shorter than or equal to 15 seconds. The period during which the reactants are not introduced, that is, the time for evacuating the chamber 4020, is longer than or equal to 0.05 seconds and shorter than or equal to 30 seconds, preferably longer than or equal to 1 second and shorter than or equal to 20 seconds.

The introduction of the precursors, the evacuation of the precursors, the introduction of the reactants, and the evacuation of the reactants are regarded as one cycle of the deposition, and the cycle is repeated, so that a film having a favorable thickness is formed.

In the case where treatment for setting the inside of the chamber 4020 in an oxygen atmosphere is performed between S103 and S104, the reactants may be introduced into the chamber 4020. It is preferable that one or more selected from ozone ($O_3$), oxygen ($O_2$), and water ($H_2O$), which function as an oxidizer, be introduced as the reactants. In this embodiment, ozone ($O_3$) and oxygen ($O_2$) are used as the reactants. In that case, the reactants are preferably introduced in a pulsed form in a manner similar to that in S104; however, the present invention is not limited thereto. The reactants may be introduced successively. In the period during which the reactants are not introduced, the purge is performed in the chamber 4020. The pulse time of introducing the reactants into the chamber 4020 is preferably longer than or equal to 0.1 seconds and shorter than or equal to 30 seconds, further preferably longer than or equal to 0.3 seconds and shorter than or equal to 15 seconds. The period during which the reactants are not introduced, that is, the time for performing the purge in the chamber 4020, is longer than or equal to 1 second and shorter than or equal to 30 seconds, preferably longer than or equal to 1 second and shorter than or equal to 20 seconds. When the reactants such as an oxidizer are introduced into the chamber 4020, the substrate 4030 or the film provided over the substrate 4030 is exposed to the reactants such as an oxidizer.

Note that after setting the substrate 4030 (S101), adjusting the temperature of the heater 4027 may be omitted if not needed. Moreover, after holding the substrate 4030 (S103), setting the inside of the chamber 4020 in an oxygen atmosphere may be omitted if not needed.

When the insulating film 250A is deposited using the above ALD apparatus, the insulating film 250A can be deposited using the model as shown in FIG. 2 and FIG. 3. Thus, the hydrogen concentration in the insulating film 250A, the insulator 280, and the oxide 230 can be lowered. The carrier concentration in the oxide 230 can be lower than or equal to $1.0 \times 10^{16}$/cm$^3$, preferably lower than $1.0 \times 10^{13}$/cm$^3$. A transistor using such an oxide 230 can have normally-off characteristics, and thus a semiconductor device having favorable electrical characteristics and reliability can be formed.

Next, a conductive film 260Aa and a conductive film 260Ab are deposited. The conductive film 260Aa and the conductive film 260Ab can be deposited by a sputtering method, a CVD method, an MBE method, a PLD method, an ALD method, or the like. A CVD method is preferably used, for example. In this embodiment, the conductive film 260Aa is deposited by an ALD method, and the conductive film 260Ab is deposited by a CVD method (see FIG. 12).

Figure 13A:
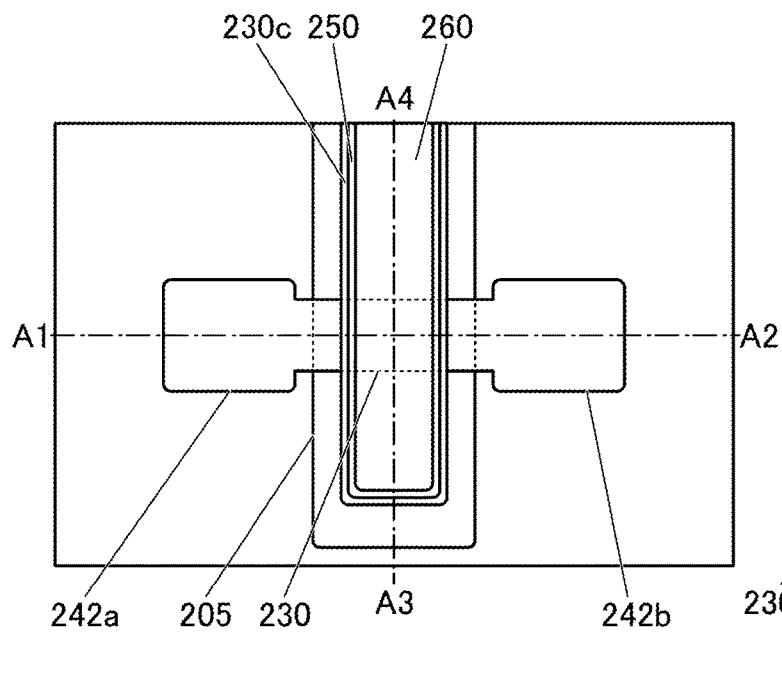
FIG. 13A is a top view illustrating a manufacturing method of a semiconductor device of one embodiment of the present invention.
Figure 13C:
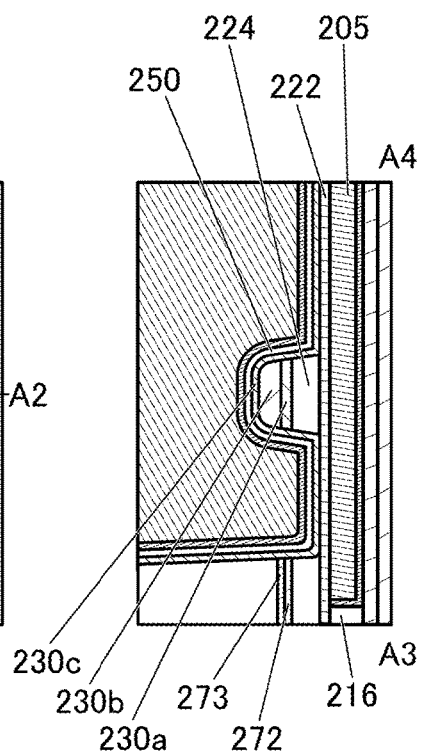
FIG. 13B and FIG. 13C are cross-sectional views illustrating a manufacturing method of a semiconductor device of one embodiment of the present invention.
Figure 13B:
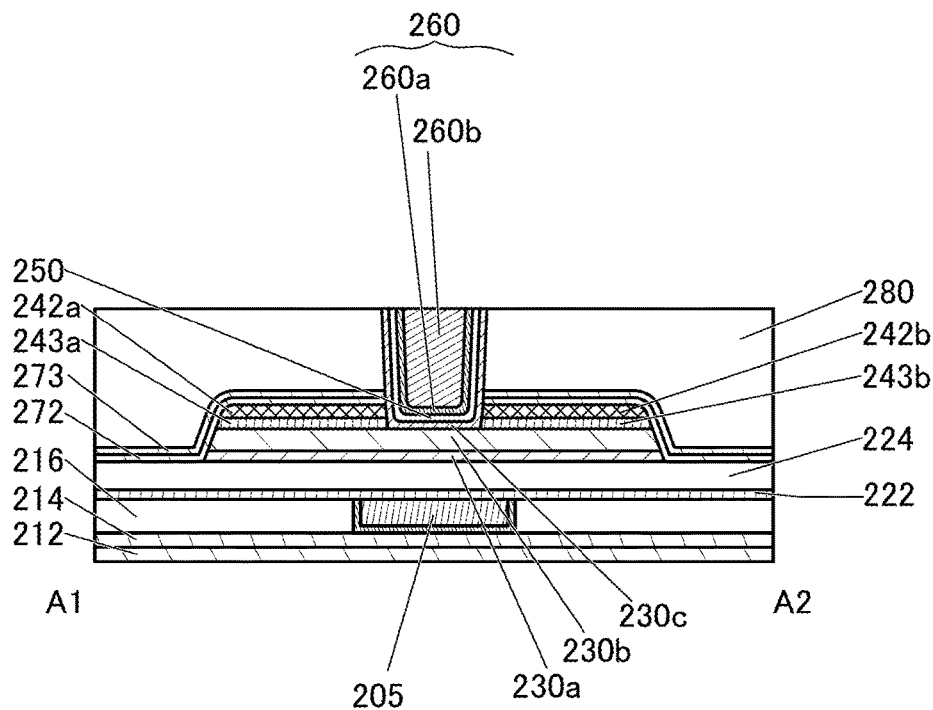

Then, the oxide film 230C, the insulating film 250A, the conductive film 260Aa, and the conductive film 260Ab are polished by CMP treatment until the insulator 280 is exposed, so that the oxide 230c, the insulator 250, and the conductor 260 (the conductor 260a and the conductor 260b) are formed (see FIG. 13).

Next, heat treatment may be performed. In this embodiment, treatment is performed at 400° C. in a nitrogen atmosphere for one hour. The heat treatment can reduce the moisture concentration and the hydrogen concentration of the insulator 250 and the insulator 280.

Next, the insulator 282 is formed over the conductor 260, the oxide 230c, the insulator 250, and the insulator 280. The insulator 282 can be deposited by a sputtering method, a CVD method, an MBE method, a PLD method, an ALD method, or the like (see FIG. 14). As an insulating film to be the insulator 282, aluminum oxide is preferably deposited by a sputtering method, for example. The insulator 282 is deposited by a sputtering method in an oxygen-containing atmosphere, whereby oxygen can be added to the insulator 280 during the deposition. At this time, the insulator 280 is preferably formed while the substrate is being heated. It is preferable to form the insulator 282 in contact with the top surface of the conductor 260 because oxygen contained in the insulator 280 can be inhibited from being absorbed into the conductor 260 in a later heat treatment.

Figure 14A:
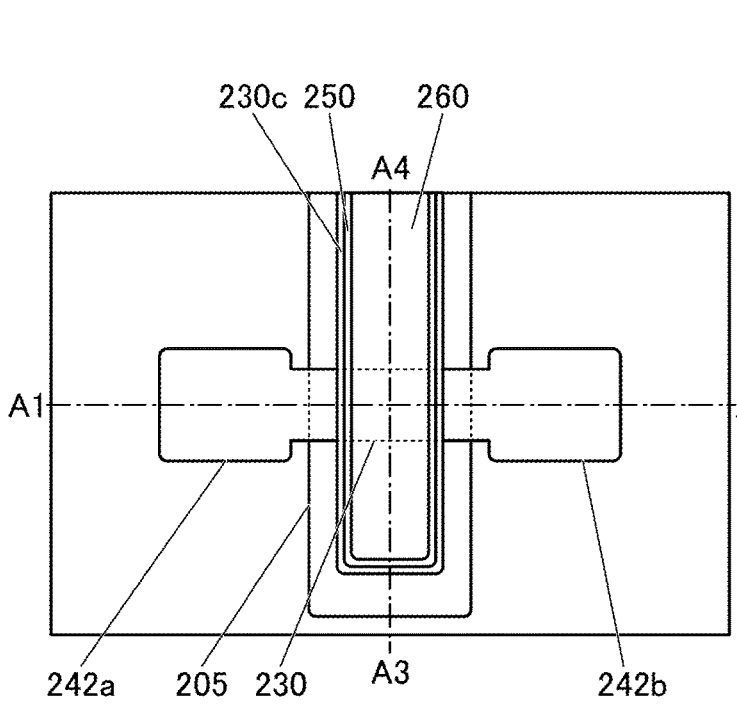
FIG. 14A is a top view illustrating a manufacturing method of a semiconductor device of one embodiment of the present invention.
Figure 14C:
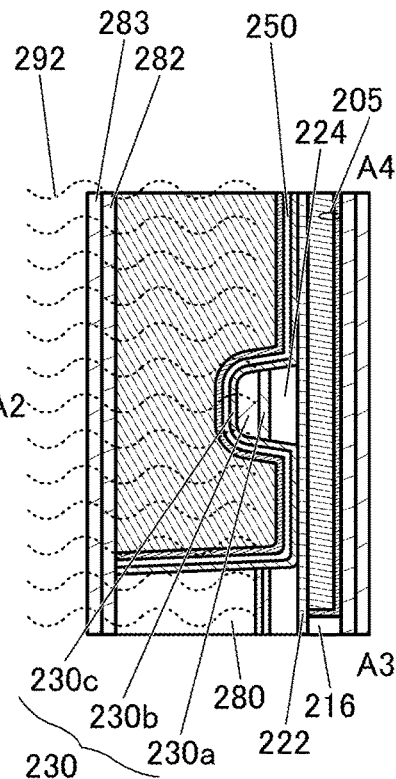
FIG. 14B and FIG. 14C are cross-sectional views illustrating a manufacturing method of a semiconductor device of one embodiment of the present invention.
Figure 14B:
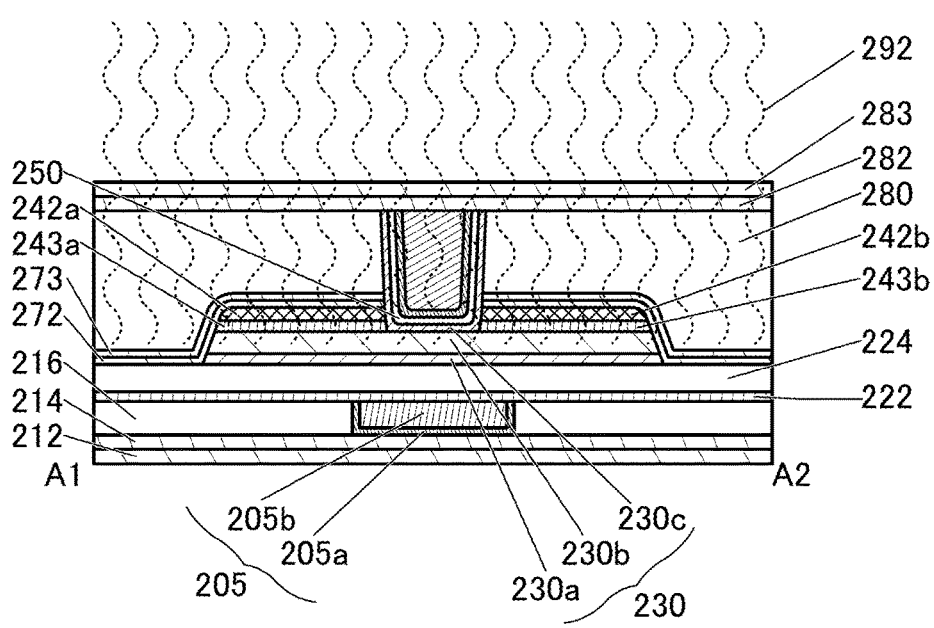

Next, the insulator 283 is deposited over the insulator 282 (see FIG. 14). Like the insulator 250, the insulator 283 is preferably deposited also by a PEALD method. As the insulator 283, silicon nitride or silicon nitride oxide is preferably deposited. For the deposition of the insulator 283, a method similar to that shown in each of FIG. 2 and FIG. 3 is used; however, nitrogen radicals are used as the reactants 20. Nitrogen radicals can be obtained by making a nitrogen gas into a plasma state. Note that in nitrogen plasma, nitrogen is contained in a state of molecules, radicals, ions, or the like. For example, by applying a high-frequency wave such as RF or a microwave to a nitrogen gas, nitrogen plasma containing nitrogen radicals can be generated. At this time, the reactants 20 preferably do not contain hydrogen.

Next, heat treatment may be performed. In this embodiment, treatment is performed at 400° C. in a nitrogen atmosphere for one hour. By the heat treatment, oxygen added by the deposition of the insulator 282 is diffused to the insulator 280 and can be supplied to the oxide 230a and the oxide 230b through the oxide 230c. Note that the heat treatment is not necessarily performed after the deposition of the insulator 283 and may be performed after the deposition of the insulator 282.

Here, as shown in FIG. 3, the oxide 230, the insulator 250, the insulator 280, the insulator 282, and the insulator 283 may be irradiated with an electromagnetic wave 292 (see FIG. 14). Here, as the electromagnetic wave 292, a microwave or a high-frequency wave such as RF may be used. The emitted electromagnetic wave 292 penetrates the oxide 230, the insulator 250, and the insulator 280 so that $V_O H$ in these is removed. Some hydrogen generated at this time is bonded to oxygen to be $H_2O$, and removed from the oxide 230 and the insulator 280, in some cases. Some hydrogen may be gettered by the conductor 242. At the time of the irradiation with the electromagnetic wave 292, an oxygen gas is made to be in a plasma state by the electromagnetic wave 292 to form oxygen radicals. That is, plasma treatment may be performed on the oxide 230, the insulator 250, the insulator 280, the insulator 282, and the insulator 283a in an atmosphere containing oxygen. The hydrogen concentration in the oxide 230, the insulator 250, and the insulator 280 can be lowered as described above.

Note that the irradiation of the electromagnetic wave 292 is not limited to being performed after the deposition of the insulator 283. For example, the irradiation of the electromagnetic wave 292 may be performed right after the formation of the conductor 260 or after the deposition of the insulator 282. As another example, the irradiation of the electromagnetic wave 292 may be performed in a step of introducing the reactants, which are shown in FIG. 2 and FIG. 3, for the deposition of the insulator 283.

Next, the insulator 274 may be deposited over the insulator 283. The insulator 274 can be deposited by a sputtering method, a CVD method, an MBE method, a PLD method, an ALD method, or the like.

Next, the insulator 281 may be deposited over the insulator 274. The insulator 281 can be deposited by a sputtering method, a CVD method, an MBE method, a PLD method, an ALD method, or the like. Silicon nitride is preferably deposited as the insulator 281 by a sputtering method, for example.

Next, openings reaching the conductor 242a and the conductor 242b are formed in the insulator 272, the insulator 273, the insulator 280, the insulator 282, the insulator 283, the insulator 274, and the insulator 281. The openings are formed by a lithography method.

Subsequently, an insulating film to be the insulator 241 is deposited and the insulating film is subjected to anisotropic etching, so that the insulator 241 is formed. The insulating film can be deposited by a sputtering method, a CVD method, an MBE method, a PLD method, an ALD method, or the like. As the insulating film to be the insulator 241, an insulating film having a function of inhibiting passage of oxygen is preferably used. For example, as in the deposition of the insulator 283, silicon nitride is preferably deposited by a PEALD method. Silicon nitride is preferable because it has high blocking property against hydrogen.

As an anisotropic etching for the insulating film to be the insulator 241, a dry etching method may be performed, for example. When the insulator 241 is provided on the side wall portions of the openings, transmission of oxygen from the outside can be inhibited and oxidation of the conductor 240a and the conductor 240b to be formed next can be prevented. Furthermore, impurities such as water and hydrogen can be prevented from diffusing from the conductor 240a and the conductor 240b to the outside.

Next, a conductive film to be the conductor 240a and the conductor 240b is deposited. The conductive film to be the conductor 240a and the conductor 240b preferably has a stacked-layer structure that includes a conductor having a function of inhibiting transmission of impurities such as water and hydrogen. For example, a stacked layer of tantalum nitride, titanium nitride, or the like and tungsten, molybdenum, copper, or the like can be employed. The conductive film to be the conductor 240 can be deposited by a sputtering method, a CVD method, an MBE method, a PLD method, an ALD method, or the like.

Then, CMP treatment is performed, thereby removing part of the conductive film to be the conductor 240a and the conductor 240b to expose the insulator 281. As a result, the conductive film remains only in the openings, so that the conductor 240a and the conductor 240b having planar top surfaces can be formed (see FIG. 1). Note that the insulator 281 is partly removed by the CMP treatment in some cases.

Next, a conductive film to be the conductor 246 is deposited. The conductive film to be the conductor 246 can be deposited by a sputtering method, a CVD method, an MBE method, a PLD method, an ALD method, or the like.

Next, the conductive film to be the conductor 246 is processed by a lithography method to form the conductor 246a in contact with the top surface of the conductor 240a and the conductor 246b in contact with the top surface of the conductor 240b (see FIG. 1).

Through the above process, the semiconductor device including the transistor 200 illustrated in FIG. 1 can be manufactured. As illustrated in FIG. 5 to FIG. 14, with the use of the method of manufacturing the semiconductor device described in this embodiment, the transistor 200 can be manufactured.

According to one embodiment of the present invention, a semiconductor device having favorable electrical characteristics can be provided. Another embodiment of the present invention can provide a semiconductor device having normally-off electrical characteristics. Alternatively, according to one embodiment of the present invention, a semiconductor device having favorable reliability can be provided. According to one embodiment of the present invention, a semiconductor device having a high on-state current can be provided. Alternatively, according to one embodiment of the present invention, a semiconductor device having excellent frequency characteristics can be provided. Alternatively, according to one embodiment of the present invention, a semiconductor device that can be miniaturized or highly integrated can be provided. Alternatively, according to one embodiment of the present invention, a semiconductor device having a low off-state current can be provided. Alternatively, according to one embodiment of the present invention, a semiconductor device with reduced power consumption can be provided. Alternatively, according to one embodiment of the present invention, a semiconductor device with high productivity can be provided.

The structures, methods, and the like described in this embodiment can be used in combination as appropriate with the structures, configurations, methods, and the like described in the other embodiments and other examples.

Embodiment 2

In this embodiment, one embodiment of a semiconductor device is described with reference to FIG. 18 and FIG. 19.

[Memory Device 1]

Figure 18:
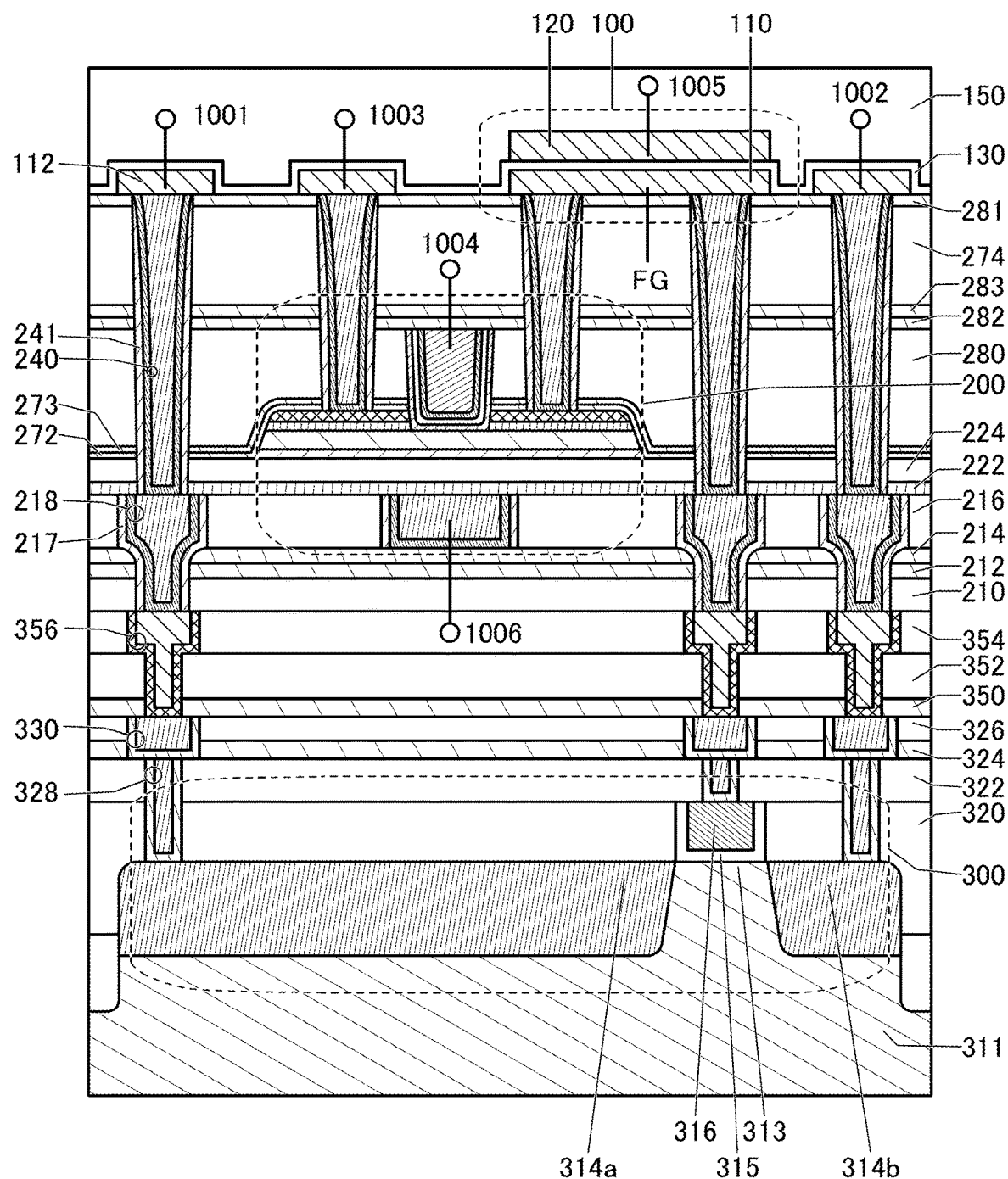
FIG. 18 is a cross-sectional view illustrating a structure of a memory device of one embodiment of the present invention.

FIG. 18 illustrates an example of a semiconductor device (a memory device) using a capacitor of one embodiment of the present invention. In the semiconductor device of one embodiment of the present invention, the transistor 200 is provided above a transistor 300, and a capacitor 100 is provided above the transistor 300 and the transistor 200. Note that the transistor 200 described in the above embodiment can be used as the transistor 200.

The transistor 200 is a transistor whose channel is formed in a semiconductor layer including an oxide semiconductor. Since the transistor 200 has a low off-state current, a memory device including the transistor 200 can retain stored data for a long time. In other words, such a memory device does not require refresh operation or has an extremely low frequency of the refresh operation, which leads to a sufficient reduction in power consumption of the memory device.

In the semiconductor device illustrated in FIG. 18, a wiring 1001 is electrically connected to a source of the transistor 300, and a wiring 1002 is electrically connected to a drain of the transistor 300. A wiring 1003 is electrically connected to one of the source and the drain of the transistor 200. A wiring 1004 is electrically connected to a first gate of the transistor 200. A wiring 1006 is electrically connected to a second gate of the transistor 200. A gate of the transistor 300 and the other of the source and the drain of the transistor 200 are electrically connected to one electrode of the capacitor 100. A wiring 1005 is electrically connected to the other electrode of the capacitor 100.

The memory devices illustrated in FIG. 18 can form a memory cell array when arranged in a matrix.

<Transistor 300>

The transistor 300 is provided over a substrate 311 and includes a conductor 316 functioning as a gate, an insulator 315 functioning as a gate insulator, a semiconductor region 313 formed of a part of the substrate 311, and a low-resistance region 314*a* and a low-resistance region 314*b* functioning as the source region and the drain region. The transistor 300 may be a p-channel type or an n-channel type.

Here, in the transistor 300 illustrated in FIG. 18, the semiconductor region 313 (part of the substrate 311) in which a channel is formed has a convex shape. Furthermore, the conductor 316 is provided to cover top and side surfaces of the semiconductor region 313 with the insulator 315 therebetween. Note that a material adjusting the work function may be used for the conductor 316. The transistor 300 having such a structure is also referred to as a FIN transistor because the projecting portion of the semiconductor substrate is utilized. An insulator functioning as a mask for forming the projecting portion may be included in contact with the top surface of the projecting portion. Although the case where the projecting portion is formed by processing part of the semiconductor substrate is described here, a semiconductor film having a projecting shape may be formed by processing an SOI substrate.

Note that the transistor 300 illustrated in FIG. 18 is an example and the structure is not limited thereto; an appropriate transistor is used in accordance with a circuit configuration or a driving method.

<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric.

For example, a conductor 112 and the conductor 110 over the conductor 240 can be formed at the same time. Note that the conductor 112 functions as a plug or a wiring that is electrically connected to the capacitor 100, the transistor 200, or the transistor 300.

Although the conductor 112 and the conductor 110 having a single-layer structure are illustrated in FIG. 18, the structure is not limited thereto; a stacked-layer structure of two or more layers may be employed. For example, between a conductor having a barrier property and a conductor having high conductivity, a conductor which is highly adhesive to the conductor having a barrier property and the conductor having high conductivity may be formed.

For the insulator 130, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like is used, and a stacked layer or a single layer can be provided.

For example, for the insulator 130, a stacked-layer structure using a material with high dielectric strength such as silicon oxynitride and a high permittivity (high-k) material is preferably used. In the capacitor 100 having such a structure, a sufficient capacitance can be ensured owing to the high permittivity (high-k) insulator, and the dielectric strength can be increased owing to the insulator with high dielectric strength, so that the electrostatic breakdown of the capacitor 100 can be inhibited.

As the insulator of a high permittivity (high-k) material (a material having a high relative permittivity), gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, or the like can be given.

As the material having a high dielectric strength (a material having a low relative permittivity), silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like can be given.

<Wiring Layers>

Wiring layers provided with an interlayer film, a wiring, a plug, and the like may be provided between the structure bodies. A plurality of wiring layers can be provided in accordance with the design. Here, a plurality of conductors functioning as plugs or wirings are collectively denoted by the same reference numeral in some cases. Furthermore, in this specification and the like, a wiring and a plug electrically connected to the wiring may be a single component. That is, part of a conductor functions as a wiring in some cases and part of a conductor functions as a plug in other cases.

For example, an insulator 320, an insulator 322, an insulator 324, and an insulator 326 are stacked over the transistor 300 in this order as interlayer films. A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 each function as a plug or a wiring.

The insulator functioning as an interlayer film may function as a planarization film that covers a roughness thereunder. For example, a top surface of the insulator 322 may be planarized by planarization treatment using a chemical mechanical polishing (CMP) method or the like to improve planarity.

A wiring layer may be provided over the insulator 326 and the conductor 330. For example, in FIG. 18, an insulator 350, an insulator 352, and an insulator 354 are stacked sequentially. Furthermore, a conductor 356 is formed in the insulator 350, the insulator 352, and the insulator 354. The conductor 356 functions as a plug or a wiring.

Similarly, a conductor 218, a conductor (conductor 205) included in the transistor 200, and the like are embedded in an insulator 210, the insulator 212, the insulator 214, and the insulator 216. Note that the conductor 218 functions as a plug or a wiring that is electrically connected to the capacitor 100 or the transistor 300. In addition, an insulator 150 is provided over the conductor 120 and the insulator 130.

Here, like the insulator 241 described in the above embodiment, an insulator 217 is provided in contact with the side surface of the conductor 218 functioning as a plug. The insulator 217 is provided in contact with the inner wall of the opening formed in the insulator 210, the insulator 212, the insulator 214, and the insulator 216. That is, the insulator 217 is provided between the conductor 218 and the insulator 210, the insulator 212, the insulator 214, and the insulator 216. Note that the conductor 205 and the conductor 218 can be formed in parallel; thus, the insulator 217 is sometimes formed in contact with the side surface of the conductor 205.

As the insulator 217, an insulator such as silicon nitride, aluminum oxide, or silicon nitride oxide may be used. Since the insulator 217 is provided in contact with the insulator 212, the insulator 214, and the insulator 222, the entry of impurities such as water and hydrogen into the oxide 230 through the conductor 218 from the insulator 210, the insulator 216, or the like can be inhibited. Silicon nitride is particularly preferable because of its high blocking property against hydrogen. Moreover, oxygen contained in the insulator 210 or the insulator 216 can be prevented from being absorbed into the conductor 218.

The insulator 217 can be formed in a manner similar to that of the insulator 241. For example, silicon nitride is deposited by a PEALD method and an opening reaching the conductor 356 is formed by anisotropic etching.

As an insulator that can be used as an interlayer film, an insulating oxide, an insulating nitride, an insulating oxynitride, an insulating nitride oxide, an insulating metal oxide, an insulating metal oxynitride, an insulating metal nitride oxide, or the like is given.

For example, when a material having a low relative permittivity is used for the insulator functioning as an interlayer film, the parasitic capacitance between wirings can be reduced. Accordingly, a material is preferably selected in accordance with the function of an insulator.

For example, for the insulator 150, the insulator 210, the insulator 352, the insulator 354, or the like, an insulator having a low relative permittivity is preferably used. For example, the insulator preferably includes silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. Because silicon oxide and silicon oxynitride have thermal stability, a combination of silicon oxide or silicon oxynitride with a resin allows the stacked-layer structure to be thermally stable and have a low relative permittivity. Examples of the resin include polyester, polyolefin, polyamide (e.g., nylon and aramid), polyimide, polycarbonate, and acrylic.

When the transistor using an oxide semiconductor is surrounded by an insulator having a function of inhibiting transmission of oxygen and impurities such as hydrogen, the electrical characteristics of the transistor can be stabilized. Thus, the insulator having a function of inhibiting transmission of oxygen and impurities such as hydrogen can be used for the insulator 214, the insulator 212, the insulator 350, and the like.

The insulator having a function of inhibiting transmission of oxygen and impurities such as hydrogen can have, for example, a single-layer structure or a stacked-layer structure of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

For the conductors that can be used for wirings or plugs, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Alternatively, a semiconductor having a high electric conductivity typified by polycrystalline silicon containing an impurity element such as phosphorus, or silicide such as nickel silicide may be used.

For example, for the conductor 328, the conductor 330, the conductor 356, the conductor 218, the conductor 112, and the like, a single-layer structure or a stacked-layer structure using a conductive material such as a metal material, an alloy material, a metal nitride material, or a metal oxide material that is formed using the above materials can be used. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

<Wirings or Plugs in Layer Provided with Oxide Semiconductor>

In the case where an oxide semiconductor is used in the transistor 200, an insulator containing an excess oxygen region is provided in the vicinity of the oxide semiconductor in some cases. In that case, an insulator having a barrier property is preferably provided between the insulator containing the excess oxygen region and the conductor provided in the insulator containing the excess oxygen region.

For example, the insulator 241 is preferably provided between the conductor 240 and the insulator 224 and the insulator 280 that include excess oxygen in FIG. 18. Since the insulator 241 is provided in contact with the insulator 222, the insulator 272, and the insulator 273, the insulator 224 and the transistor 200 can be sealed by the insulators having a barrier property. It is preferable that the insulator 241 be also in contact with part of the insulator 280. When the insulator 241 extends to the insulator 274, diffusion of oxygen and impurities can be further inhibited.

That is, the insulator 241 can inhibit excess oxygen contained in the insulator 224 and the insulator 280 from being absorbed by the conductor 240. In addition, the insulator 241 can inhibit diffusion of hydrogen, which is an impurity, into the transistor 200 through the conductor 240.

The insulator 241 is preferably formed using an insulating material having a function of inhibiting diffusion of an impurity such as water or hydrogen and oxygen. For example, silicon nitride, silicon nitride oxide, aluminum oxide, hafnium oxide, or the like is preferably used. In particular, silicon nitride is preferably used because silicon nitride has a high blocking property against hydrogen. Other than that, a metal oxide such as magnesium oxide, gallium oxide, germanium oxide, yttrium oxide, zirconium oxide, lanthanum oxide, neodymium oxide, or tantalum oxide can be used, for example.

The above is the description of the structure example. With the use of the structure, a semiconductor device using a transistor including an oxide semiconductor can have a small variation in electrical characteristics and higher reliability. Alternatively, a transistor including an oxide semiconductor with a high on-state current can be provided. Alternatively, a transistor including an oxide semiconductor with low off-state current can be provided. Alternatively, a semiconductor device with low power consumption can be provided.

[Memory Device 2]

Figure 19:
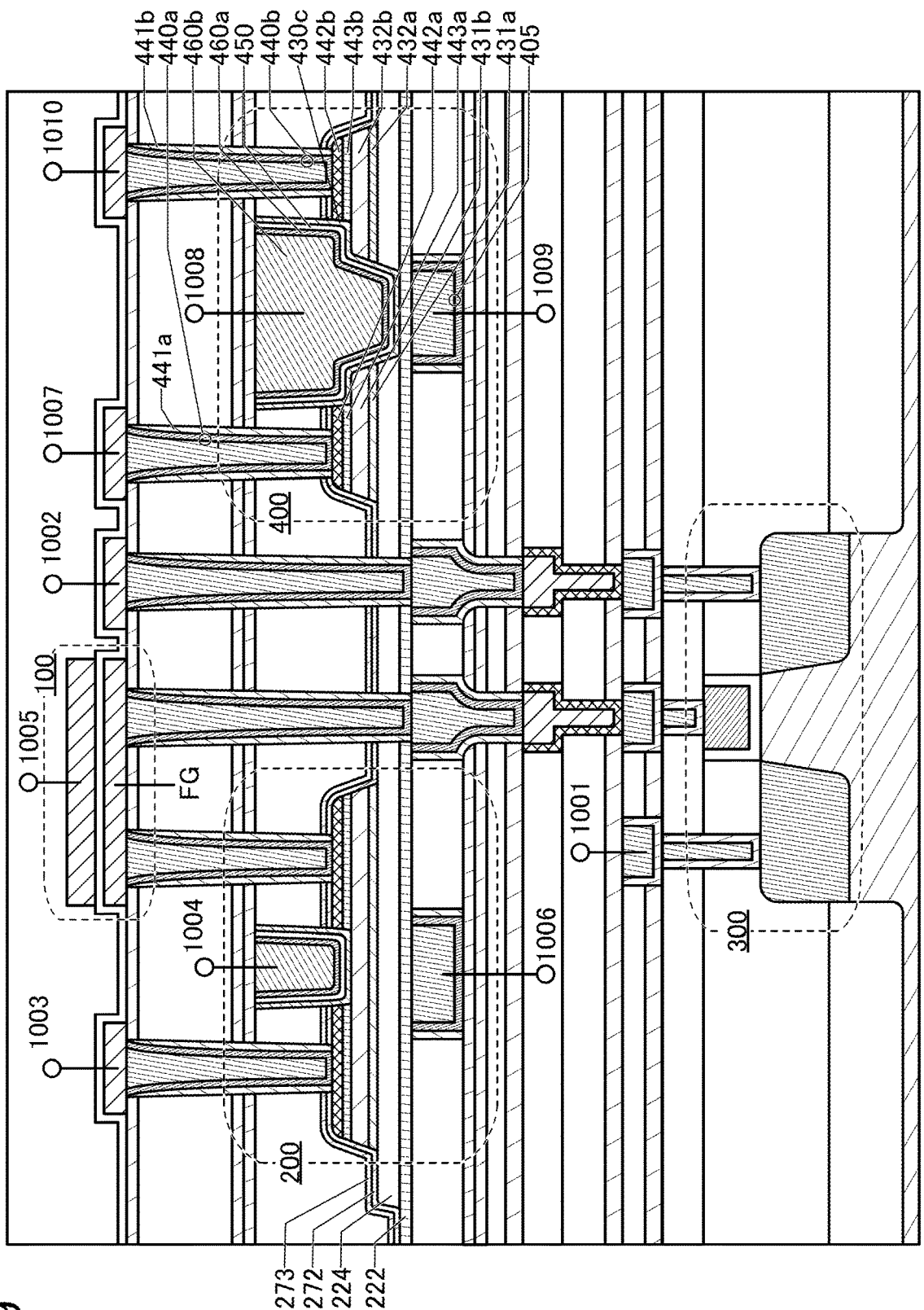
FIG. 19 is a cross-sectional view illustrating a structure of a memory device of one embodiment of the present invention.

FIG. 19 illustrates an example of a memory device using the semiconductor device of one embodiment of the present invention. The memory device illustrated in FIG. 19 includes a transistor 400 in addition to the semiconductor device including the transistor 200, the transistor 300, and the capacitor 100 illustrated in FIG. 18.

The transistor 400 can change a second gate voltage of the transistor 200. For example, a first gate and a second gate of the transistor 400 are diode-connected to a source, and the source of the transistor 400 is connected to the second gate of the transistor 200. When a negative potential of the second gate of the transistor 200 is held in this structure, a first gate-source voltage and a second gate-source voltage of the transistor 400 are 0 V. In the transistor 400, a drain current when the second gate voltage and the first gate voltage are 0 V is extremely low; thus, the negative potential of the second gate of the transistor 200 can be held for a long time even without power supply to the transistor 200 and the transistor 400. Accordingly, the memory device including the transistor 200 and the transistor 400 can retain stored data for a long time.

In FIG. 19, the wiring 1001 is electrically connected to the source of the transistor 300, and the wiring 1002 is electrically connected to the drain of the transistor 300. The wiring 1003 is electrically connected to one of the source and the drain of the transistor 200, the wiring 1004 is electrically connected to the gate of the transistor 200, and the wiring 1006 is electrically connected to a back gate of the transistor 200. The gate of the transistor 300 and the other of the source and the drain of the transistor 200 are electrically connected to one electrode of the capacitor 100. The wiring 1005 is electrically connected to the other electrode of the capacitor 100. A wiring 1007 is electrically connected to the source of the transistor 400. A wiring 1008 is electrically connected to a gate of the transistor 400. A wiring 1009 is electrically connected to a back gate of the transistor 400. A wiring 1010 is electrically connected to the drain of the transistor 400. The wiring 1006, the wiring 1007, the wiring 1008, and the wiring 1009 are electrically connected to each other.

When the memory device illustrated in FIG. 19 are arranged in a matrix like the memory device illustrated in FIG. 18, a memory cell array can be formed. Note that one transistor 400 can change second gate voltages of a plurality of transistors 200. For this reason, the number of transistors 400 is preferably smaller than the number of transistors 200.

<Transistor 400>

The transistor 400 and the transistors 200 are formed in the same layer and thus can be fabricated in parallel. The transistor 400 includes a conductor 460 (a conductor 460a and a conductor 460b) functioning as a first gate; a conductor 405 (a conductor 405a and a conductor 405b) functioning as a second gate; the insulator 222 and an insulator 450 each functioning as a gate insulating layer; an oxide 430c including a channel formation region; a conductor 442a, an oxide 443a, an oxide 431a, and an oxide 431b functioning as a source; a conductor 442b, an oxide 443b, an oxide 432a, and an oxide 432b functioning as a drain; a conductor 440 (a conductor 440a and a conductor 440b) functioning as a plug; and an insulator 441 (an insulator 441a and an insulator 441b) functioning as a barrier insulating film of the conductor 440.

In the transistor 400, the conductor 405 is in the same layer as the conductor 205. The oxide 431a and the oxide 432a are in the same layer as the oxide 230a, and the oxide 431b and the oxide 432b are in the same layer as the oxide 230b. The conductor 442 is in the same layer as the conductor 242. The oxide 443 is in the same layer as the oxide 243. The oxide 430c is in the same layer as the oxide 230c. The insulator 450 is in the same layer as the insulator 250. The conductor 460 is in the same layer as the conductor 260. The conductor 440 is in the same layer as the conductor 240. The insulator 441 is in the same layer as the insulator 241.

Note that the structure body in the same layer can be formed at the same time. For example, the oxide 430c can be formed by processing an oxide film to be the oxide 230c.

In the oxide 430c functioning as an active layer of the transistor 400, oxygen vacancies are reduced and impurities such as hydrogen or water are reduced, as in the oxide 230 or the like. Accordingly, the threshold voltage of the transistor 400 can be higher than 0 V, an off-state current can be reduced, and the drain current when the second gate voltage and the first gate voltage are 0 V can be extremely low.

<Dicing Line>

A dicing line (referred to as a scribe line, a dividing line, or a cutting line in some cases) which is provided when a large-sized substrate is divided into semiconductor elements so that a plurality of semiconductor devices are each formed in a chip form is described below. Examples of a dividing method include the case where a groove (a dicing line) for dividing the semiconductor elements is formed on the substrate, and then the substrate is cut along the dicing line to divide (split) it into a plurality of semiconductor devices.

Here, for example, as illustrated in FIG. 19, it is preferable that a region in which the insulator 272 and the insulator 222 are in contact with each other be the dicing line. That is, an opening is provided in the insulator 224 in the vicinity of the region to be the dicing line that is provided in an outer edge of the transistor 400 and the memory cell including a plurality of transistors 200. The insulator 272 is provided to cover the side surface of the insulator 224.

That is, in the opening provided in the insulator 224, the insulator 222 is in contact with the insulator 272. For example, the insulator 222 and the insulator 272 may be formed using the same material and the same method. When the insulator 222 and the insulator 272 are formed using the same material and the same method, the adhesion therebetween can be increased. For example, aluminum oxide is preferably used.

With such a structure, the insulator 224, the transistor 200, and the transistor 400 can be enclosed with the insulator 222 and the insulator 272. Since the insulator 222 and the insulator 272 have a function of inhibiting diffusion of oxygen, hydrogen, and water even when the substrate is divided into circuit regions each of which is provided with the semiconductor elements in this embodiment to form a plurality of chips, the mixing and diffusion of impurities such as hydrogen or water from the direction of a side surface of the divided substrate to the transistor 200 or the transistor 400 can be inhibited.

In the structure, excess oxygen in the insulator 224 can be inhibited from diffusing to the outside through the insulator 272 and the insulator 222. Accordingly, excess oxygen in the insulator 224 is efficiently supplied to the oxide where the channel is formed in the transistor 200 or the transistor 400. The oxygen can reduce oxygen vacancies in the oxide where the channel is formed in the transistor 200 or the transistor 400. Thus, the oxide where the channel is formed in the transistor 200 or the transistor 400 can be an oxide semiconductor with a low density of defect states and stable characteristics. That is, the transistor 200 or the transistor 400 can have a small variation in the electrical characteristics and higher reliability.

The structures, methods, and the like described in this embodiment can be used in combination as appropriate with the structures, configurations, methods, and the like described in the other embodiments and other examples.

Embodiment 3

In this embodiment, a memory device of one embodiment of the present invention including a transistor in which an oxide is used for a semiconductor (hereinafter referred to as an OS transistor in some cases) and a capacitor (hereinafter referred to as an OS memory device in some cases), is described with reference to FIG. 20 and FIG. 21. The OS memory device includes at least a capacitor and an OS transistor that controls the charging and discharging of the capacitor. Since the OS transistor has an extremely low off-state current, the OS memory device has excellent retention characteristics and thus can function as a nonvolatile memory.

<Structure Example of Memory Device>

Figure 20A:
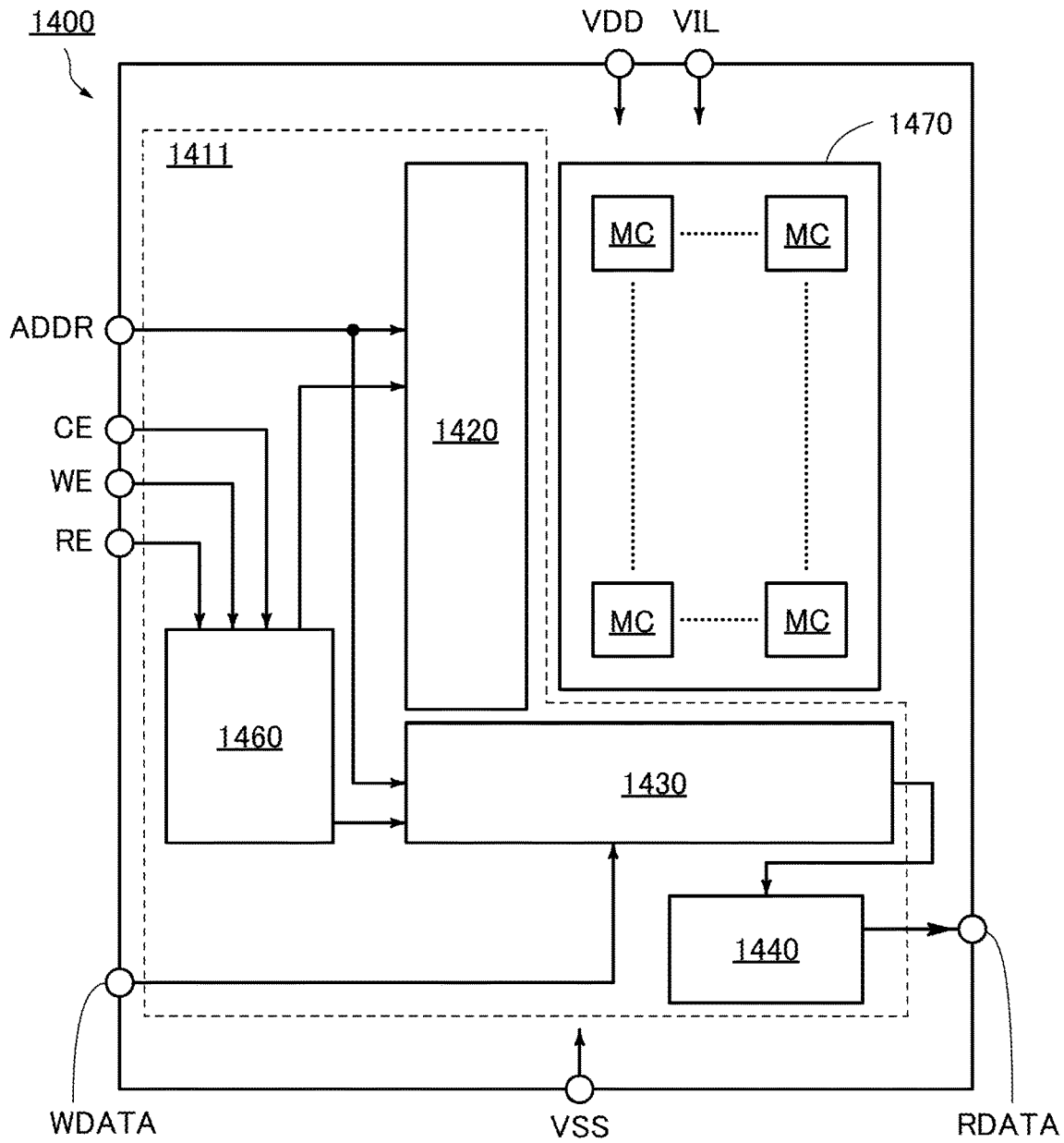
FIG. 20A is a block diagram illustrating a configuration example of a memory device of one embodiment of the present invention.

FIG. 20A illustrates a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and are described later in detail. The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and WDATA is input to the write circuit.

The control logic circuit 1460 processes the input signals (CE, WE, and RE) input from the outside, and generates control signals for the row decoder and the column decoder. CE is a chip enable signal, WE is a write enable signal, and RE is a read enable signal. Signals processed by the control logic circuit 1460 are not limited thereto, and other control signals may be input as necessary.

The memory cell array 1470 includes a plurality of memory cells MC arranged in a matrix and a plurality of wirings. Note that the number of the wirings that connect the memory cell array 1470 to the row circuit 1420 depends on the structure of the memory cell MC, the number of the memory cells MC in a column, and the like. The number of the wirings that connect the memory cell array 1470 to the column circuit 1430 depends on the structure of the memory cell MC, the number of the memory cells MC in a row, and the like.

Figure 20B:
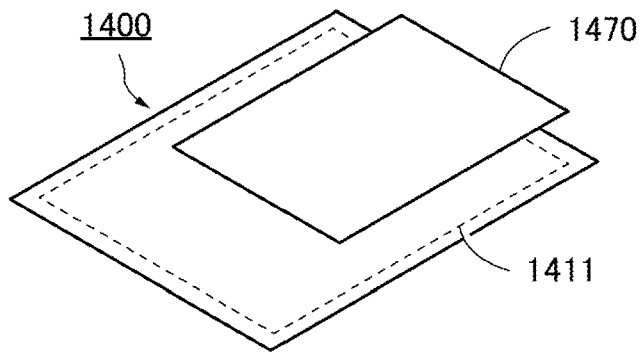
FIG. 20B is a schematic diagram illustrating a configuration example of a memory device of one embodiment of the present invention.

Note that FIG. 20A illustrates an example in which the peripheral circuit 1411 and the memory cell array 1470 are formed on the same plane; however, this embodiment is not limited thereto. For example, as illustrated in FIG. 20B, the memory cell array 1470 may be provided to overlap part of the peripheral circuit 1411. For example, the sense amplifier may be provided below the memory cell array 1470 so that they overlap with each other.

FIG. 21 illustrates structure examples of a memory cell applicable to the memory cell MC.

[DOSRAM]

Figure 21A:
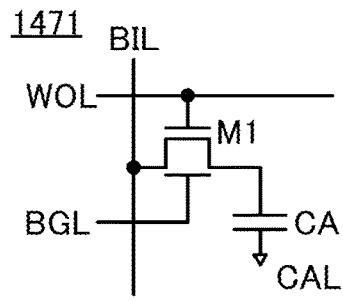
FIG. 21A to FIG. 21H are circuit diagrams illustrating configuration examples of a memory device of one embodiment of the present invention.
Figure 21B:
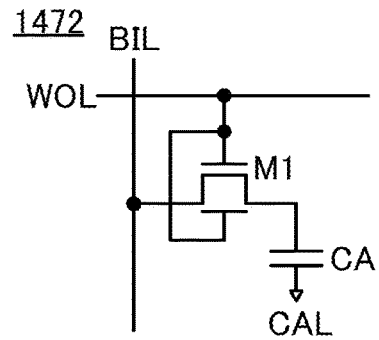
Figure 21C:
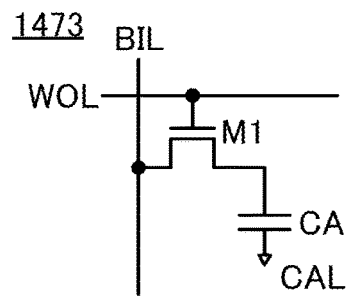
Figure 21D:
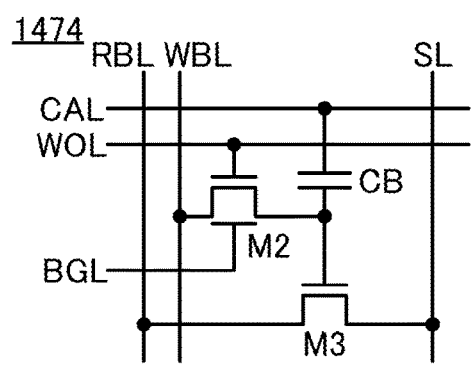
Figure 21E:
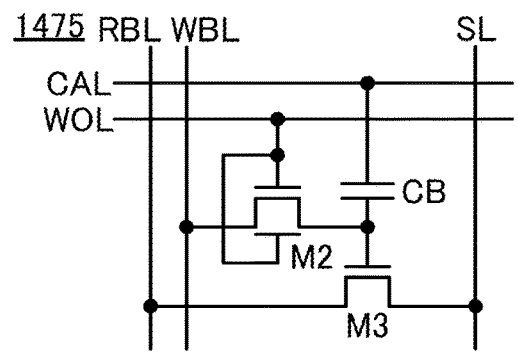
Figure 21F:
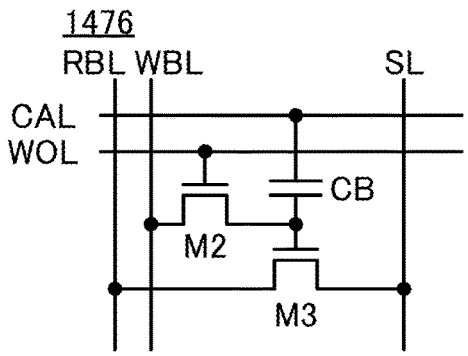
Figure 21G:
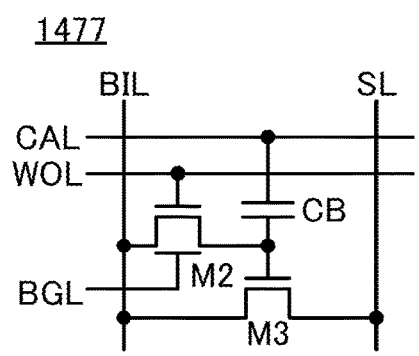

FIG. 21A to FIG. 21C each illustrate a circuit structure example of a memory cell of a DRAM. In this specification and the like, a DRAM using a memory cell including one OS transistor and one capacitor is referred to as DOSRAM (Dynamic Oxide Semiconductor Random Access Memory) in some cases. A memory cell 1471 illustrated in FIG. 21A includes a transistor MI and a capacitor CA. Note that the transistor MI includes a gate (also referred to as a front gate in some cases) and a back gate.

A first terminal of the transistor MI is connected to a first terminal of the capacitor CA. A second terminal of the transistor MI is connected to a wiring BIL. The gate of the transistor MI is connected to a wiring WOL. The back gate of the transistor MI is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a low-level potential is preferably applied to the wiring CAL. The wiring BGL functions as a wiring for applying a potential to the back gate of the transistor MI. Applying a given potential to the wiring BGL can increase or decrease the threshold voltage of the transistor M1.

The memory cell MC is not limited to the memory cell 1471, and the circuit structure can be changed. For example, as in a memory cell 1472 illustrated in FIG. 21B, the back gate of the transistor MI may be connected not to the wiring BGL but to the wiring WOL in the memory cell MC. Alternatively, for example, the memory cell MC may be a memory cell including a single-gate transistor, that is, the transistor MI not including a back gate, as in a memory cell 1473 illustrated in FIG. 21C.

In the case where the semiconductor device described in any of the above embodiments is used in the memory cell 1471 and the like, the transistor 200 can be used as the transistor MI, and the capacitor 100 can be used as the capacitor CA. When an OS transistor is used as the transistor M1, the leakage current of the transistor MI can be extremely low. That is, with the use of the transistor MI, written data can be retained for a long time, and thus the frequency of the refresh operation for the memory cell can be decreased. In addition, refresh operation of the memory cell can be unnecessary. In addition, since the transistor MI has an extremely low leakage current, multi-level data or analog data can be retained in the memory cell 1471, the memory cell 1472, and the memory cell 1473.

In the DOSRAM, when the sense amplifier is provided below the memory cell array 1470 so that they overlap with each other as described above, the bit line can be shortened. Thus, the bit line capacitance can be small, and the storage capacitance of the memory cell can be reduced.

[NOSRAM]

FIG. 21D to FIG. 21H each illustrate a circuit structure example of a gain-cell memory cell including two transistors and one capacitor. A memory cell 1474 illustrated in FIG. 21D includes a transistor M2, a transistor M3, and a capacitor CB. Note that the transistor M2 includes a front gate (simply referred to as a gate in some cases) and a back gate. In this specification and the like, a memory device including a gain-cell memory cell using an OS transistor as the transistor M2 is referred to as NOSRAM (Nonvolatile Oxide Semiconductor RAM) in some cases.

A first terminal of the transistor M2 is connected to a first terminal of the capacitor CB. A second terminal of the transistor M2 is connected to a wiring WBL. A gate of the transistor M2 is connected to the wiring WOL. A back gate of the transistor M2 is connected to the wiring BGL. A second terminal of the capacitor CB is connected to the wiring CAL. A first terminal of the transistor M3 is connected to a wiring RBL. A second terminal of the transistor M3 is connected to a wiring SL. A gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In the time of data writing, data retaining, and data reading, a low-level potential is preferably applied to the wiring CAL. The wiring BGL functions as a wiring for applying a potential to the back gate of the transistor M2. By application of a given potential to the wiring BGL, the threshold voltage of the transistor M2 can be increased or decreased.

The memory cell MC is not limited to the memory cell 1474, and the circuit structure can be changed as appropriate. For example, as in a memory cell 1475 illustrated in FIG. 21E, the back gate of the transistor M2 may be connected not to the wiring BGL but to the wiring WOL in the memory cell MC. Alternatively, for example, the memory cell MC may be a memory cell including a single-gate transistor, that is, the transistor M2 not including a back gate, as in a memory cell 1476 illustrated in FIG. 21F. Alternatively, for example, as in a memory cell 1477 illustrated in FIG. 21G, the wiring WBL and the wiring RBL may be combined into one wiring BIL in the memory cell MC.

In the case where the semiconductor device described in any of the above embodiments is used in the memory cell 1474 and the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. That is, with the use of the transistor M2, written data can be retained for a long time, and thus the frequency of the refresh operation for the memory cell can be decreased. Alternatively, refresh operation of the memory cell can be unnecessary. In addition, since the transistor M2 has an extremely low leakage current, multi-level data or analog data can be retained in the memory cell 1474. The same applies to the memory cells 1475 to 1477.

Note that the transistor M3 may be a transistor containing silicon in a channel formation region (hereinafter also referred to as a Si transistor in some cases). The conductivity type of the Si transistor may be of either an n-channel type or a p-channel type. The Si transistor has higher field-effect mobility than the OS transistor in some cases. Therefore, a Si transistor may be used as the transistor M3 functioning as a reading transistor. Furthermore, the transistor M2 can be provided to be stacked over the transistor M3 when a Si transistor is used as the transistor M3; therefore, the area occupied by the memory cell can be reduced, leading to high integration of the memory device.

Alternatively, the transistor M3 may be an OS transistor. When an OS transistor is used as each of the transistors M2 and M3, the circuit of the memory cell array 1470 can be formed using only n-channel transistors.

Figure 21H:
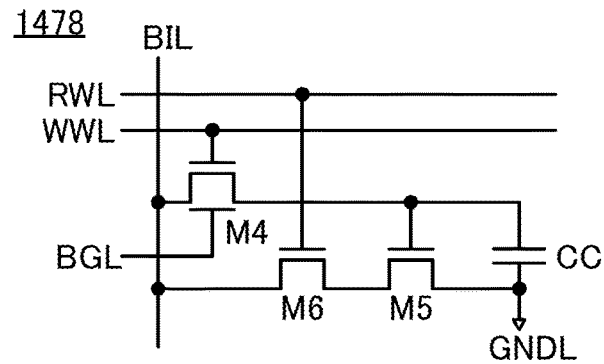

FIG. 21H illustrates an example of a gain-cell memory cell including three transistors and one capacitor. A memory cell 1478 illustrated in FIG. 21H includes transistors M4 to M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wirings RBL and WBL instead of the wiring BIL.

The transistor M4 is an OS transistor including a back gate that is electrically connected to the wiring BGL. Note that the back gate and the gate of the transistor M4 may be electrically connected to each other. Alternatively, the transistor M4 does not necessarily include the back gate.

Note that each of the transistors M5 and M6 may be an n-channel Si transistor or a p-channel Si transistor. Alternatively, the transistors M4 to M6 may be OS transistors, in which case the circuit of the memory cell array 1470 can be formed using only n-channel transistors.

In the case where the semiconductor device described in any of the above embodiments is used in the memory cell 1478, the transistor 200 can be used as the transistor M4, the transistor 300 can be used as the transistors M5 and M6, and the capacitor 100 can be used as the capacitor CC. When an OS transistor is used as the transistor M4, the leakage current of the transistor M4 can be extremely low.

Note that the structures of the peripheral circuit 1411, the memory cell array 1470, and the like described in this embodiment are not limited to the above. Positions and functions of these circuits, wirings connected to the circuits, circuit elements, and the like can be changed, deleted, or added as needed.

The structures, methods, and the like described in this embodiment can be used in combination as appropriate with the structures, configurations, methods, and the like described in the other embodiments and other examples.

Embodiment 4

In this embodiment, an example of a chip 1200 on which the semiconductor device of the present invention is mounted is described with reference to FIG. 22. A plurality of circuits (systems) are mounted on the chip 1200. The technique for integrating a plurality of circuits (systems) on one chip as described above is referred to as system on chip (SoC) in some cases.

Figure 22A:
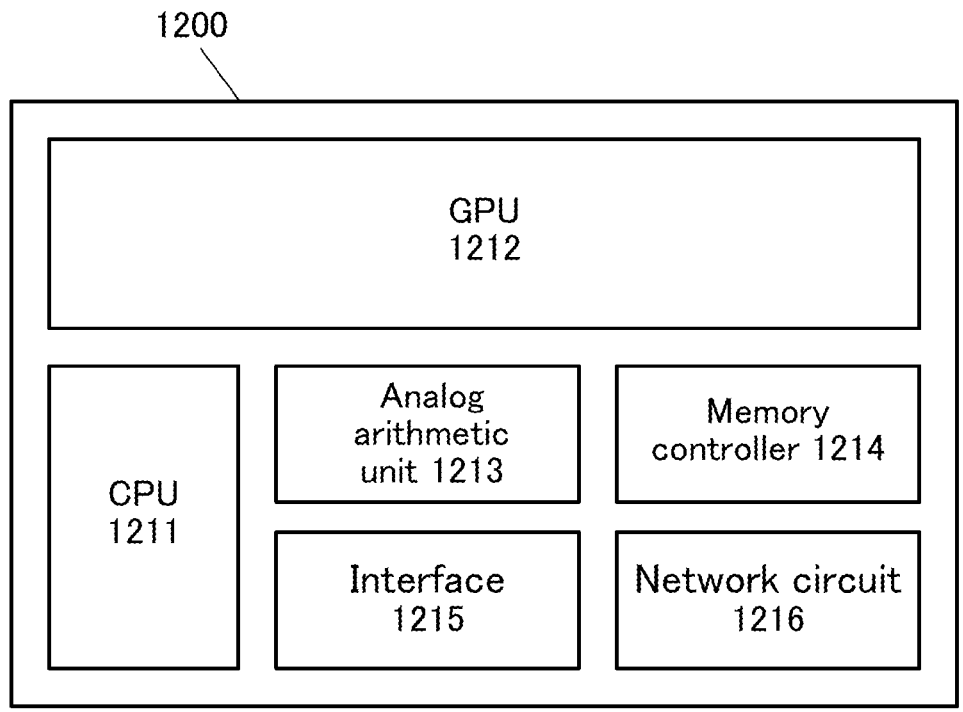
FIG. 22A and FIG. 22B are schematic diagrams of a semiconductor device of one embodiment of the present invention.

As illustrated in FIG. 22A, the chip 1200 includes a CPU (Central Processing Unit) 1211, a GPU (Graphics Processing Unit) 1212, one or more of analog arithmetic units 1213, one or more of memory controllers 1214, one or more of interfaces 1215, one or more of network circuits 1216, and the like.

Figure 22B:
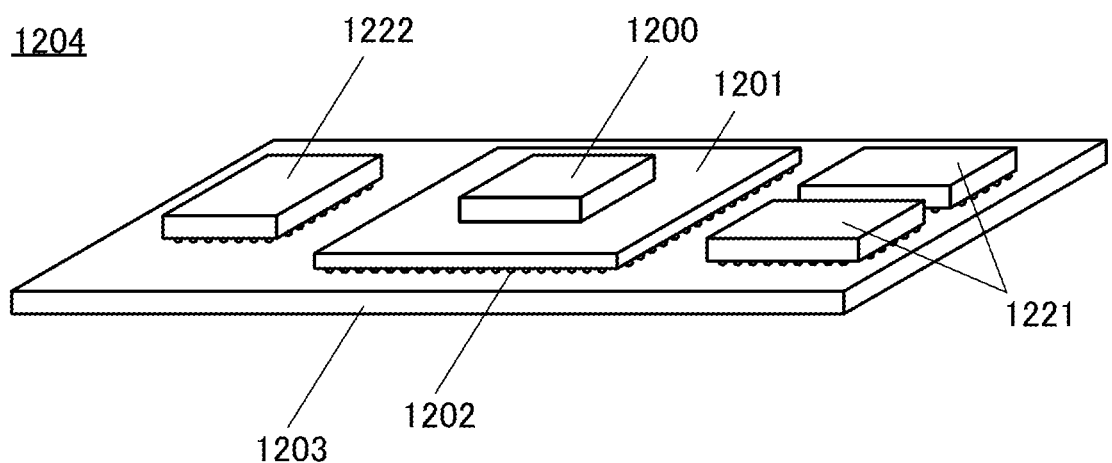

A bump (not illustrated) is provided on the chip 1200, and as illustrated in FIG. 22B, the chip 1200 is connected to a first surface of a printed circuit board (PCB) 1201. A plurality of bumps 1202 are provided on the rear side of the first surface of the PCB 1201, and the PCB 1201 is connected to a motherboard 1203.

A memory device such as a DRAM 1221 or a flash memory 1222 may be provided over the motherboard 1203. For example, the DOSRAM described in the above embodiment can be used as the DRAM 1221. For example, the NOSRAM described in the above embodiment can be used as the flash memory 1222.

The CPU 1211 preferably includes a plurality of CPU cores. Furthermore, the GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. The NOSRAM or the DOSRAM described above can be used as the memory. The GPU 1212 is suitable for parallel computation of a number of data and thus can be used for image processing or product-sum operation. When an image processing circuit or a product-sum operation circuit including an oxide semiconductor of the present invention is provided in the GPU 1212, image processing and product-sum operation can be performed with low power consumption.

In addition, since the CPU 1211 and the GPU 1212 are provided in the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the analog arithmetic unit 1213 may include the above-described product-sum operation circuit.

The memory controller 1214 includes a circuit functioning as a controller of the DRAM 1221 and a circuit functioning as the interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, USB (Universal Serial Bus), HDMI (registered trademark) (High-Definition Multimedia Interface), or the like can be used.

The network circuit 1216 includes a network circuit such as a LAN (Local Area Network). Furthermore, the network circuit 1216 may include a circuit for network security.

The circuits (systems) can be formed in the chip 1200 in the same manufacturing process. Therefore, even when the number of circuits needed for the chip 1200 is increased, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 formed using the SoC technology, and thus can have a small size. Furthermore, the GPU module 1204 is excellent in image processing, and thus is suitably used in a portable electronic device such as a smartphone, a tablet terminal, a laptop PC, or a portable (mobile) game console. Furthermore, the product-sum operation circuit using the GPU 1212 can implement an arithmetic operation such as a deep neural network (DNN), a convolutional neural network (CNN), a recurrent neural network (RNN), an autoencoder, a deep Boltzmann machine (DBM), or a deep belief network (DBN); thus, the chip 1200 can be used as an AI chip or the GPU module 1204 can be used as an AI system module.

The structures, methods, and the like described in this embodiment can be used in combination as appropriate with the structures, configurations, methods, and the like described in the other embodiments and other examples.

Embodiment 5

In this embodiment, application examples of the memory device using the semiconductor device described in the above embodiment are described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to removable memory devices such as memory cards (e.g., SD cards), USB memories, and SSDs (solid state drives). FIG. 23 schematically illustrates some structure examples of removable memory devices. The semiconductor device described in the above embodiment is processed into a packaged memory chip and used in a variety of storage devices and removable memories, for example.

Figure 23A:
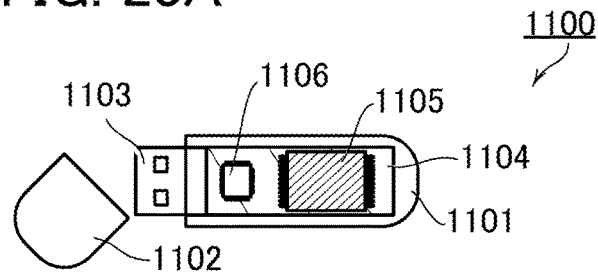
FIG. 23A and FIG. 23E are schematic diagrams of memory devices of one embodiment of the present invention.

FIG. 23A is a schematic view of a USB memory. A USB memory 1100 includes a housing 1101, a cap 1102, a USB connector 1103, and a substrate 1104. The substrate 1104 is held in the housing 1101. For example, a memory chip 1105 and a controller chip 1106 are attached to the substrate 1104. The semiconductor device described in the above embodiment can be incorporated in the memory chip 1105 or the like on the substrate 1104.

Figures 23B, 23C:
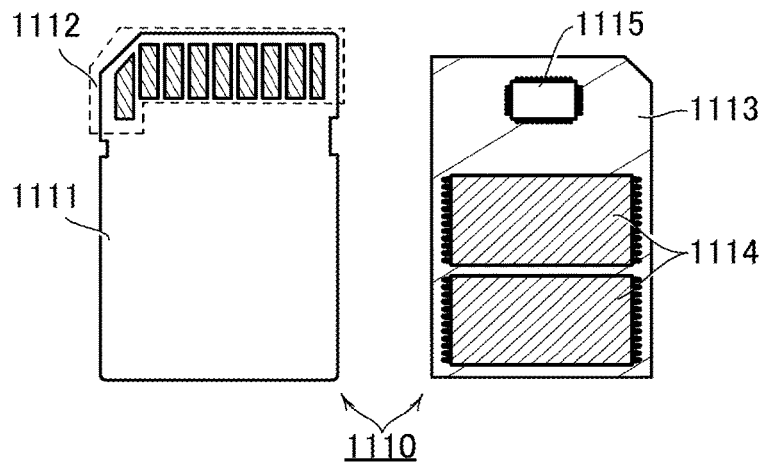

FIG. 23B is a schematic external view of an SD card, and FIG. 23C is a schematic view of the internal structure of the SD card. An SD card 1110 includes a housing 1111, a connector 1112, and a substrate 1113. The substrate 1113 is held in the housing 1111. For example, a memory chip 1114 and a controller chip 1115 are attached to the substrate 1113. When the memory chip 1114 is also provided on the rear surface side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like on the substrate 1113.

Figures 23D, 23E:
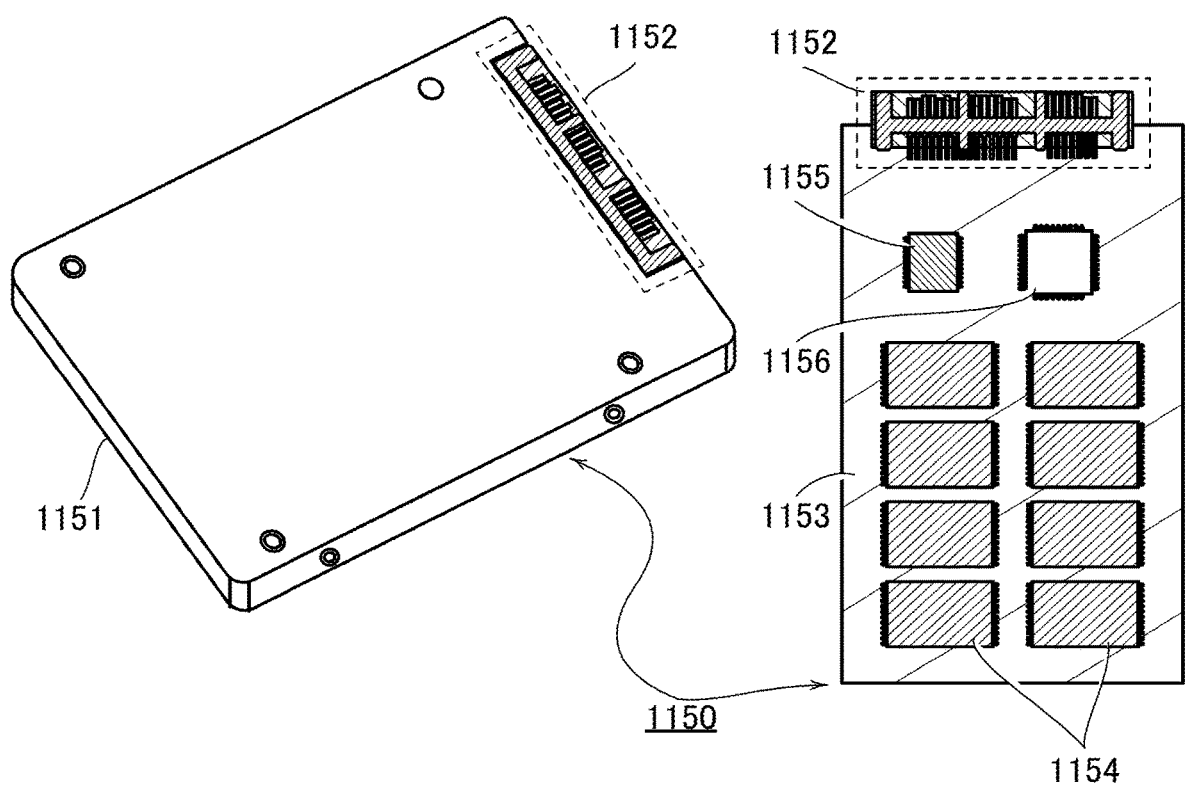

FIG. 23D is a schematic external view of an SSD, and FIG. 23E is a schematic view of the internal structure of the SSD. An SSD 1150 includes a housing 1151, a connector 1152, and a substrate 1153. The substrate 1153 is held in the housing 1151. For example, a memory chip 1154, a memory chip 1155, and a controller chip 1156 are attached to the substrate 1153. The memory chip 1155 is a work memory for the controller chip 1156, and a DOSRAM chip may be used, for example. When the memory chip 1154 is also provided on the rear surface side of the substrate 1153, the capacity of the SSD 1150 can be increased. The semiconductor device described in the above embodiment can be incorporated in the memory chip 1154 or the like on the substrate 1153.

The structures, methods, and the like described in this embodiment can be used in combination as appropriate with the structures, configurations, methods, and the like described in the other embodiments and other examples.

Embodiment 6

In this embodiment, specific examples of electronic devices to which the semiconductor device of one embodiment of the present invention can be applied are described with reference to FIG. 24.

Specifically, the semiconductor device of one embodiment of the present invention can be used for a processor such as a CPU and a GPU or a chip. FIG. 24 illustrates specific examples of electronic devices including a processor such as a CPU and a GPU or a chip of one embodiment of the present invention.

<Electronic Device and System>

The GPU or the chip of one embodiment of the present invention can be mounted on a variety of electronic devices. Examples of electronic devices include a digital camera, a digital video camera, a digital photo frame, a mobile phone, a portable game console, a portable information terminal, and an audio reproducing device in addition to electronic devices provided with a relatively large screen, such as a television device, a desktop or laptop personal computer, a monitor for a computer and the like, digital signage, and a large game machine like a pachinko machine. In addition, when the integrated circuit or the chip of one embodiment of the present invention is provided in the electronic device, the electronic device can include artificial intelligence.

The electronic device of one embodiment of the present invention may include an antenna. When a signal is received by the antenna, a video, data, or the like can be displayed on a display portion. When the electronic device includes the antenna and a secondary battery, the antenna may be used for contactless power transmission.

The electronic device of one embodiment of the present invention may include a sensor (a sensor having a function of measuring force, displacement, a position, speed, acceleration, angular velocity, rotational frequency, distance, light, liquid, magnetism, temperature, a chemical substance, sound, time, hardness, an electric field, current, voltage, electric power, radioactive rays, a flow rate, humidity, gradient, oscillation, a smell, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 24 illustrates examples of the electronic device.

[Mobile Phone]

Figure 24A:
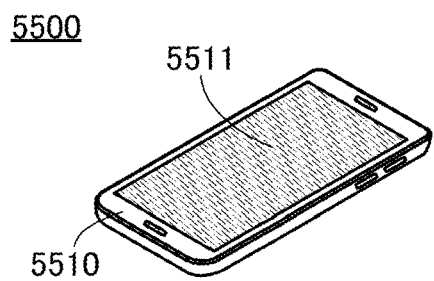

FIG. 24A illustrates a mobile phone (smartphone) which is a type of an information terminal. An information terminal 5500 includes a housing 5510 and a display portion 5511, and as input interfaces, a touch panel is provided in the display portion 5511 and a button is provided in the housing 5510.

The information terminal 5500 can execute an application utilizing artificial intelligence with the use of the chip of one embodiment of the present invention. Examples of the application utilizing artificial intelligence include an application for recognizing a conversation and displaying the contents of the conversation on the display portion 5511; an application for recognizing letters, figures, and the like input to the touch panel of the display portion 5511 by a user and displaying them on the display portion 5511; and an application for performing biometric authentication using fingerprints, voice prints, or the like.

[Information Terminal 1]

Figure 24B:
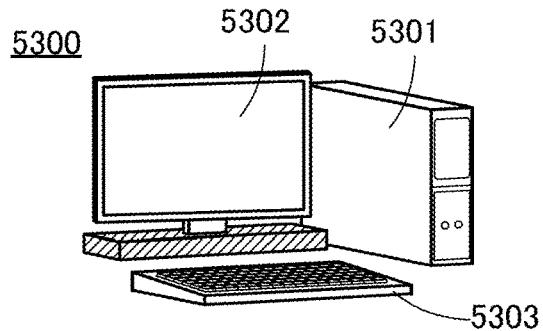

FIG. 24B illustrates a desktop information terminal 5300. The desktop information terminal 5300 includes a main body 5301 of the information terminal, a display 5302, and a keyboard 5303.

The desktop information terminal 5300 can execute an application utilizing artificial intelligence with the use of the chip of one embodiment of the present invention as the information terminal 5500 described above. Examples of the application utilizing artificial intelligence include design-support software, text correction software, and software for automatic menu generation. Furthermore, with the use of the desktop information terminal 5300, novel artificial intelligence can be developed.

Note that in the above description, although the smartphone and the desktop information terminal are respectively illustrated in FIG. 24A and FIG. 24B as examples of the electronic device, one embodiment of the present invention can also be applied to an information terminal other than the smartphone and the desktop information terminal. Examples of an information terminal other than a smartphone and a desktop information terminal include a PDA (Personal Digital Assistant), a laptop information terminal, and a workstation.

[Electronic Device]

Figure 24C:
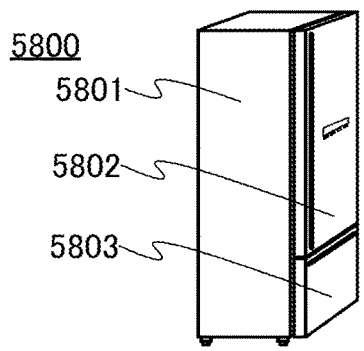

FIG. 24C illustrates an electric refrigerator-freezer 5800 which is an example of an electronic device. The electric refrigerator-freezer 5800 includes a housing 5801, a refrigerator door 5802, a freezer door 5803, and the like.

When the chip of one embodiment of the present invention is applied to the electric refrigerator-freezer 5800, the electric refrigerator-freezer 5800 including artificial intelligence can be obtained. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting the temperature to be appropriate for the foods stored in the electric refrigerator-freezer 5800, and the like.

Although the electric refrigerator-freezer is described as an electronic device in the example, other examples of the electronic device include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

[Game Console]

Figure 24D:
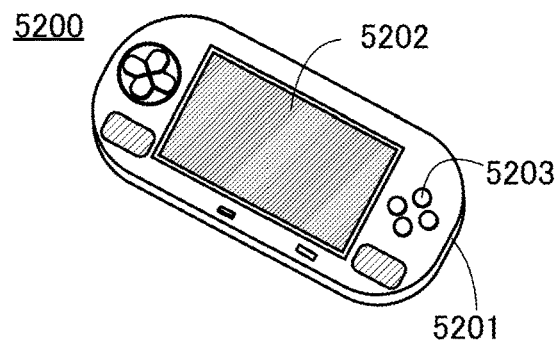
Figure 24D:
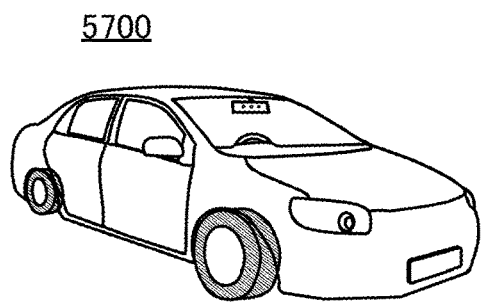
Figure 24D:
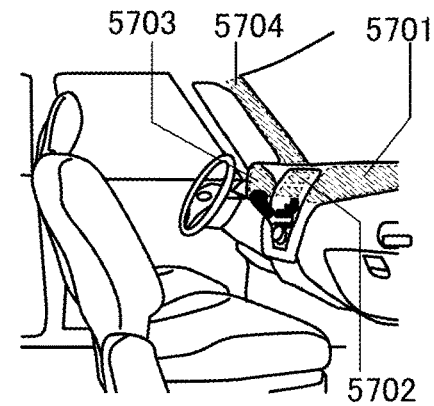

FIG. 24D illustrates a portable game console 5200 which is an example of a game console. The portable game console includes a housing 5201, a display portion 5202, a button 5203, and the like.

With the use of the GPU or the chip of one embodiment of the present invention in the portable game console 5200, the portable game console 5200 with low power consumption can be obtained. Furthermore, heat generation from a circuit can be reduced owing to low power consumption; thus, the influence of heat generation on the circuit itself, the peripheral circuit, and the module can be reduced.

Moreover, with the use of the GPU or the chip of one embodiment of the present invention in the portable game console 5200, the portable game console 5200 including artificial intelligence can be obtained.

Basically, the progress of a game, the actions and words of game characters, and expressions of a phenomenon or the like that occurs in the game are determined by a program of the game; however, the use of artificial intelligence in the portable game console 5200 enables expressions not limited by the program of the game. For example, expressions are possible in which questions posed by the player, the progress of the game, time, and the actions and words of game characters are changed.

When a game requiring a plurality of players is played on the portable game console 5200, the artificial intelligence can create a virtual game player; thus, the game can be played alone with the game player created by the artificial intelligence as an opponent.

Although the portable game console is illustrated in FIG. 24D as an example of a game machine, the game machine using the GPU or the chip of one embodiment of the present invention is not limited thereto. Examples of the game machine using the GPU or the chip of one embodiment of the present invention include a home stationary game machine, an arcade game machine installed in entertainment facilities (a game center, an amusement park, and the like), a throwing machine for batting practice installed in sports facilities, and the like.

[Moving Vehicle]

The GPU or the chip of one embodiment of the present invention can be used in an automobile, which is a moving vehicle, and around a driver's seat in the automobile.

FIG. 24E1 illustrates an automobile 5700 which is an example of a moving vehicle, and FIG. 24E2 illustrates the periphery of a windshield inside the automobile. FIG. 24E2 illustrates a display panel 5701, a display panel 5702, and a display panel 5703 that are attached to a dashboard and a display panel 5704 that is attached to a pillar.

The display panel 5701 to the display panel 5703 can display a variety of kinds of information by displaying a speedometer, a tachometer, a mileage, a fuel meter, a gearshift indicator, air-condition setting, and the like. The content, layout, or the like of the display on the display panels can be changed appropriately to suit the user's preferences, so that the design can be improved. The display panel 5701 to the display panel 5703 can also be used as lighting devices.

The display panel 5704 displays an image taken by an imaging device (not illustrated) provided for the automobile 5700, whereby the view obstructed by the pillar (blind areas) can be complemented. That is, display of an image taken by an imaging device provided on the outside of the automobile 5700 can fill in blind areas and improve safety. In addition, display of an image that complements the area that cannot be seen makes it possible to confirm safety more naturally and comfortably. The display panel 5704 can also be used as a lighting device.

Because the GPU or the chip of one embodiment of the present invention can be used as a component of artificial intelligence, the chip can be used in an automatic driving system of the automobile 5700, for example. The chip can also be used for a system for navigation, risk prediction, or the like. The display panel 5701 to the display panel 5704 may display information regarding navigation, risk prediction, and the like.

Although an automobile is described above as an example of a moving vehicle, moving vehicles are not limited to an automobile. Examples of a moving vehicle include a train, a monorail train, a ship, and a flying object (a helicopter, an unmanned aircraft (a drone), an airplane, and a rocket), and these moving vehicles can include a system utilizing artificial intelligence when equipped with the chip of one embodiment of the present invention.

[Broadcasting System]

The GPU or the chip of one embodiment of the present invention can be used in a broadcasting system.

Figure 24F:
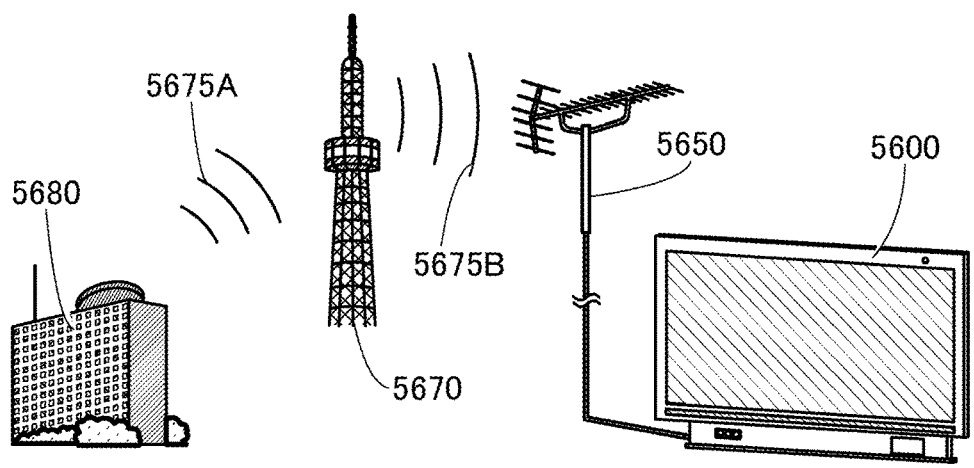

FIG. 24F schematically illustrates data transmission in a broadcasting system. Specifically, FIG. 24F illustrates a path in which a radio wave (a broadcasting signal) transmitted from a broadcast station 5680 reaches a television receiver (TV) 5600 of each household. The TV 5600 includes a receiving device (not illustrated), and the broadcast signal received by an antenna 5650 is transmitted to the TV 5600 through the receiving device.

Although an UHF (Ultra High Frequency) antenna is illustrated as the antenna 5650 in FIG. 24F, a BS/110° C. S antenna, a CS antenna, or the like can also be used as the antenna 5650.

A radio wave 5675A and a radio wave 5675B are broadcast signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting illustrated in FIG. 24F and may be satellite broadcasting using an artificial satellite, data broadcasting using an optical line, or the like.

The above-described broadcasting system may be a broadcasting system utilizing artificial intelligence by including the chip of one embodiment of the present invention. When the broadcast data is transmitted from the broadcast station 5680 to the TV 5600 of each household, the broadcast data is compressed by an encoder. The antenna 5650 receives the compressed broadcast data, and then the broadcast data is decompressed by a decoder of the receiving device in the TV 5600. Utilizing the artificial intelligence enables, for example, recognition of a display pattern included in a displayed image in motion compensation prediction, which is one of the compressing methods for the encoder. In addition, in-frame prediction or the like can also be performed utilizing the artificial intelligence. Furthermore, for example, when the broadcast data with low resolution is received and the broadcast data is displayed on the TV 5600 with high resolution, image interpolation processing such as upconversion can be performed in the broadcast data decompression by the decoder.

The above-described broadcasting system utilizing artificial intelligence is suitable for ultra-high definition television (UHDTV: 4K and 8K) broadcasting, which needs a large amount of broadcast data.

As the application of artificial intelligence in the TV 5600, a recording device with artificial intelligence may be provided in the TV 5600, for example. With such a structure, the artificial intelligence can learn the user's preference, so that TV programs that suit the user's preference can be recorded automatically in the recording device.

The electronic device and the functions of the electronic device, the application example of the artificial intelligence and its effects, and the like described in this embodiment can be combined as appropriate with the description of another electronic device.

The structures, methods, and the like described in this embodiment can be used in combination as appropriate with the structures, configurations, methods, and the like described in the other embodiments and other examples.

EXAMPLE

In this example, Sample 1A to Sample 1I corresponding to the oxide 230a, the oxide 230b, the oxide 230c, and the insulator 250 illustrated in FIG. 1 were formed, and the results of measurement of the carrier concentration of these samples are described.

First, a method for forming Sample 1A to Sample 1I is described.

As each of Sample 1A to Sample 1I, a quartz substrate was prepared, and an In—Ga—Zn oxide film (hereinafter referred to as an IGZO film) was deposited to a target thickness of 5 nm over the quartz substrate by a DC sputtering method. A target with In:Ga:Zn=1:3:4 [atomic ratio] was used for the deposition of the IGZO film (hereinafter, the IGZO film is referred to as an IGZO film (134)). An oxygen gas at 45 sccm was used as a deposition gas; the deposition pressure was 0.7 Pa (measured with Miniature Gauge MG-2 manufactured by CANON ANELVA CORPORATION); the deposition power was 500 W; the substrate temperature was 200° C.; and the target-substrate distance was 60 mm. The IGZO film (134) corresponds to the oxide 230a.

Furthermore, an IGZO film was deposited to a target thickness of 35 nm over the IGZO film (134) by a DC sputtering method without exposure to the air. Note that a target with In:Ga:Zn=4:2:4.1 [atomic ratio] was used for the deposition of the IGZO film (hereinafter, the IGZO film is referred to as an IGZO film (423)). An oxygen gas at 45 sccm was used as a deposition gas; the deposition pressure was 0.7 Pa (measured with Miniature Gauge MG-2 manufactured by CANON ANELVA CORPORATION); the deposition power was 500 W; the substrate temperature was 200° C.; and the target-substrate distance was 60 mm. The IGZO film (423) corresponds to the oxide 230b.

Next, Sample 1A to Sample 1I were subjected to heat treatment at 400° C. in a nitrogen atmosphere for an hour and further subjected to heat treatment at 400° C. in an oxygen atmosphere for an hour.

Next, in each of Sample 1A to Sample 1I, a 25-nm-thick tantalum nitride film was deposited over the IGZO film (423) by a sputtering method. Then, the tantalum nitride film was removed by dry etching treatment. In the dry etching treatment, $CF_4$ and $Cl_2$ were used as the etching gas. The deposition and removal of the tantalum nitride film correspond to the steps of forming the conductor layer 242B and removing part of the conductor layer 242B described in the above embodiment with reference to FIG. 5 and FIG. 8.

Next, Sample 1A to Sample 1I were washed with an aqueous solution in which hydrofluoric acid was diluted with pure water.

Next, each of Sample 1A to Sample 1I was subjected to heat treatment at 350° C. in a nitrogen atmosphere for an hour and further subjected to heat treatment at 350° C. in an oxygen atmosphere for an hour.

Next, an IGZO film (134) was deposited to a target thickness of 5 nm over the IGZO film (423) by a DC sputtering method. The deposition of the IGZO film (134) was performed with conditions similar to those of the above-described IGZO film (134). The IGZO film (134) deposited in this step corresponds to the oxide 230c.

Next, in each of Sample 1B to Sample 1E, a silicon oxide film was deposited to a target thickness of 10 nm by a PEALD method. The silicon oxide film corresponds to the insulator 250. As one cycle of the PEALD, a gas of an aminosilane compound was introduced as precursors for 0.5 seconds, a purge was performed for 18 seconds, an oxygen gas was introduced as reactants for 1.4 seconds, the flow rate was stabilized, and then output of an RF plasma generator was set to 2800 W and irradiation with oxygen plasma was performed for 18 seconds, and a purge was performed for 8 seconds. During the deposition by PEALD, a nitrogen gas at 550 sccm and an argon gas at 50 sccm were continuously introduced as the carrier gas. During the deposition by PEALD, the substrate temperature of Sample 1B was 200° C., the substrate temperature of Sample 1C was 300° C., the substrate temperature of Sample 1D was 350° C., and the substrate temperature of Sample 1E was 400° C.

In each of Sample 1F to Sample 1I, a silicon oxide film was deposited to a target thickness of 10 nm by a thermal ALD method. The silicon oxide film corresponds to the insulator 250. As one cycle of the thermal ALD, a gas of an aminosilane compound was introduced as precursors for 0.5 seconds, a purge was performed for 18 seconds, a mixed gas of ozone and oxygen was introduced as reactants for 18 seconds, and a purge was performed for 8 seconds. During the deposition by thermal ALD, a nitrogen gas at 550 sccm and an argon gas at 50 sccm were continuously introduced as the carrier gas. During the deposition by thermal ALD, the substrate temperature of Sample 1F was 200° C., the substrate temperature of Sample 1G was 300° C., the substrate temperature of Sample 1H was 350° C., and the substrate temperature of Sample 1I was 400° C.

Next, in each of Sample 1B to Sample 1I, part of the silicon oxide film was removed by dry etching treatment to form an opening reaching the IGZO film. In the dry etching treatment, $CF_4$ was used as the etching gas.

Furthermore, a Ti—Al alloy film functioning as an electrode was formed in the opening to be in contact with the IGZO film.

Figure 25A:
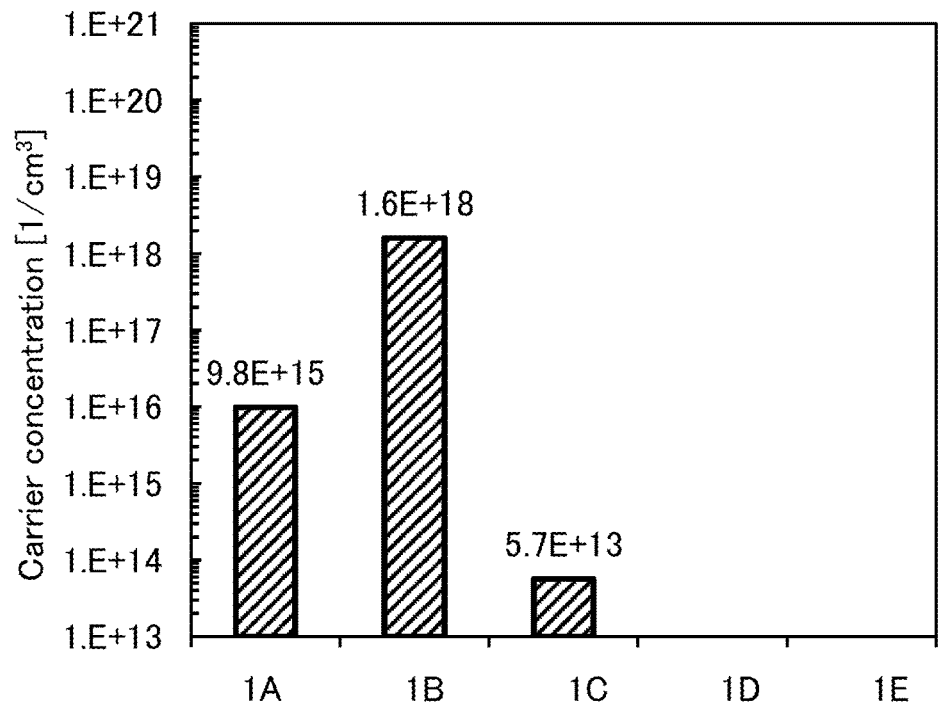
FIG. 25A and FIG. 25B are graphs showing the carrier concentration of oxide in Example.
Figure 25B:
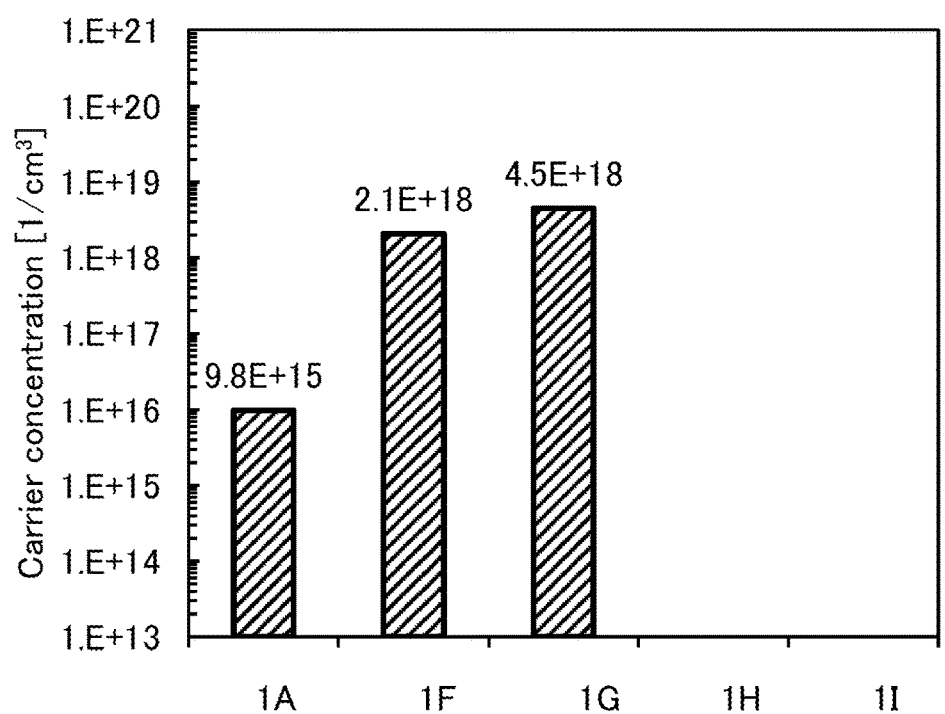

The sheet resistance of each of Sample 1A to Sample 1I formed as described above was measured using a Hall effect measurement equipment "ResiTest 8400 series" manufactured by TOYO Corporation to calculate the carrier concentration. FIG. 25A shows the carrier concentration [$1/cm^3$] of Sample 1A to Sample 1E, and FIG. 25B shows the carrier concentration [$1/cm^3$] of Sample 1 A and Sample 1F to Sample 1I.

As shown in FIG. 25A, Sample 1C, Sample 1D, and Sample 1E that were formed by a PEALD method at a substrate temperature of higher than or equal to 300° C. had an extremely lower carrier concentration of the IGZO films than Sample 1A in which the silicon oxide film was not formed. As shown in FIG. 25B, Sample 1H and Sample 1I that were formed by a thermal ALD method at a substrate temperature of higher than or equal to 350° C. also had an extremely lower carrier concentration of the IGZO films than Sample 1A in which the silicon oxide film was not formed.

Moreover, the sheet resistance of the IGZO films of each of Sample 1D, Sample 1E, Sample 1H, and Sample 1I deposited by a PEALD method or a thermal ALD method at a substrate temperature of higher than or equal to 350° C. was higher than or equal to the measurement upper limit of the Hall effect measurement equipment. Accordingly, the carrier concentration of the IGZO films of each of Sample 1D, Sample 1E, Sample 1H, and Sample 1I was probably lower than $1\times10^{13}/cm^3$.

Next, Sample 2A to Sample 2I corresponding to Sample 1A to Sample 1I were formed, and the IGZO films of each sample were analyzed by SIMS. Here, although Sample 2A to Sample 2I are different from Sample 1A to Sample 1I in that a silicon substrate on which a 100-nm-thick thermal oxide film (Thermal SiOx) was formed was used instead of the quartz substrate and the Ti—Al alloy film functioning as an electrode was not formed, other structures of Sample 2A to Sample 2I are similar to those of Sample 1 A to Sample 1I.

Figure 26A:
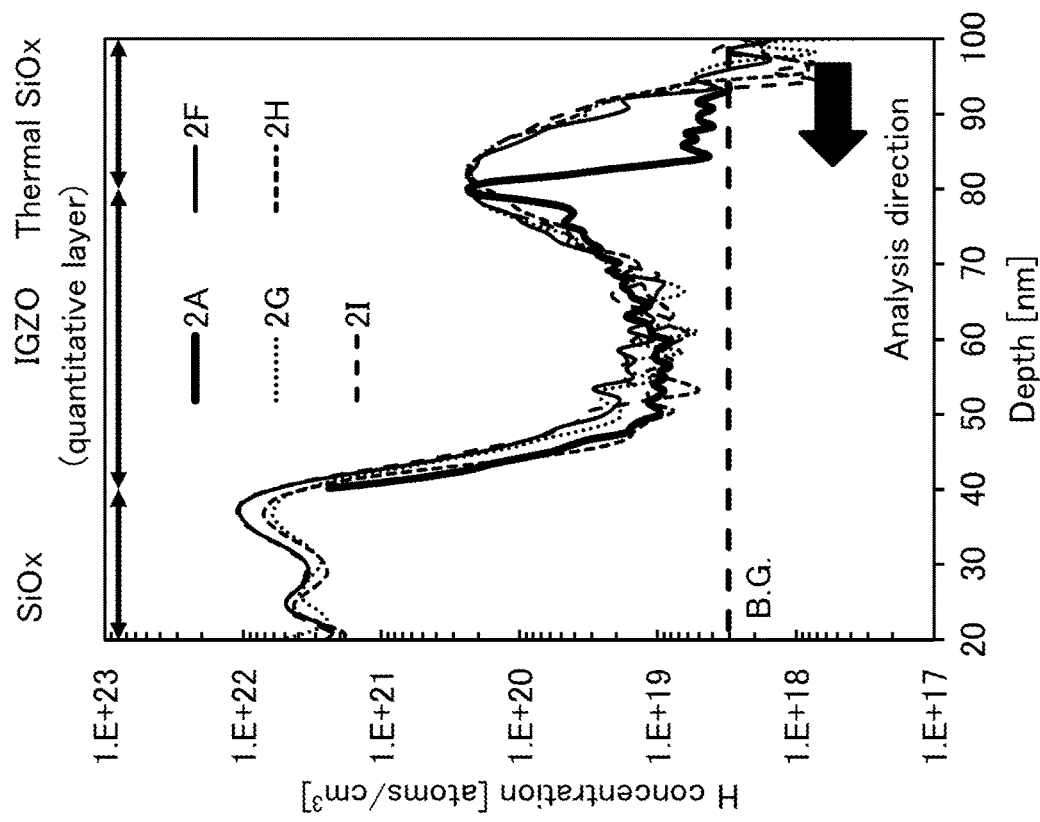
FIG. 26A and FIG. 26B are graphs showing the hydrogen concentration of oxide in Example.
Figure 26B:
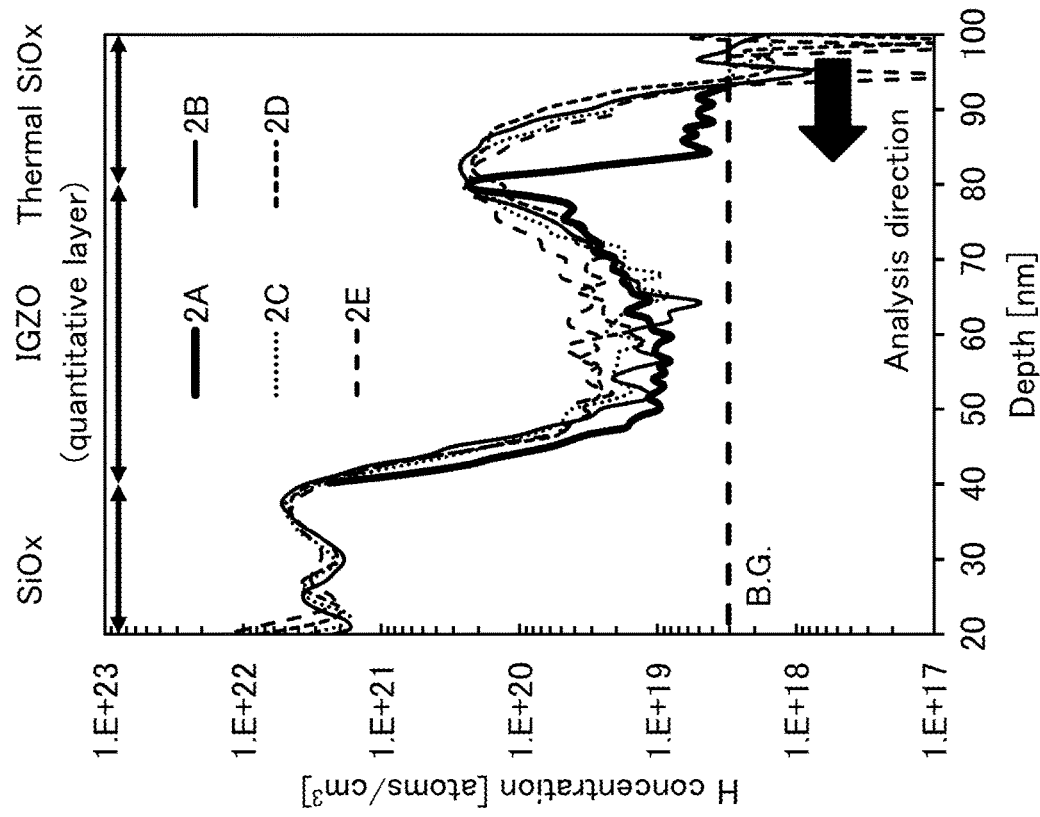

FIG. 26A shows the hydrogen concentration [atoms/cm$^3$] of Sample 2A to Sample 2E, and FIG. 26B shows the hydrogen concentration [atoms/cm$^3$] of Sample 2A and Sample 2F to Sample 2I. In each of FIG. 26A and FIG. 26B, the horizontal axis represents the depth [nm] of the sample. Note that the analysis direction was the direction from the rear side of the sample to the surface of the sample, and the IGZO film was regarded as a quantitative range (quantitative layer) of hydrogen.

As shown in FIG. 26B, each of Sample 2F to Sample 2I that were deposited by a thermal ALD method had a hydrogen concentration profile similar to that of Sample 2A in which silicon oxide was not deposited. Moreover, as shown in FIG. 26A, although each of Sample 2D and Sample 2E in which the substrate temperature was high had a slightly high hydrogen concentration, each of Sample 2B to Sample 2E that were deposited by a PEALD method had a hydrogen concentration profile substantially similar to that of Sample 2A in which silicon oxide was not deposited.

As described above, by depositing the silicon oxide film by a PEALD method or a thermal ALD method while the substrate was heated, an increase in hydrogen concentration was able to be inhibited and the carrier concentration was able to be lowered in the IGZO films under the silicon oxide film. By using such IGZO films in the transistor, the transistor can have normally-off characteristics, so that a semiconductor device having favorable electrical characteristics and reliability can be formed.

REFERENCE NUMERALS

10: precursor, 20: reactant, 30: electromagnetic wave, 200: transistor, 205: conductor, 205a: conductor, 205b: conductor, 210: insulator, 212: insulator, 214: insulator, 216: insulator, 217: insulator, 218: conductor, 222: insulator, 224: insulator, 224A: insulating film, 230: oxide, 230a: oxide, 230A: oxide film, 230b: oxide, 230B: oxide film, 230c: oxide, 230C: oxide film, 240: conductor, 240a: conductor, 240b: conductor, 241: insulator, 241a: insulator, 241b: insulator, 242: conductor, 242a: conductor, 242A: conductive film, 242b: conductor, 242B: conductor layer, 243: oxide, 243a: oxide, 243A: oxide film, 243b: oxide, 243B: oxide layer, 246: conductor, 246a: conductor, 246b: conductor, 250: insulator, 250A: insulating film, 260: conductor, 260a: conductor, 260Aa: conductive film, 260Ab: conductive film, 260b: conductor, 272: insulator, 272A: insulating film, 273: insulator, 273A: insulating film, 274: insulator, 280: insulator, 281: insulator, 282: insulator, 283: insulator, 283a: insulator, 290: electromagnetic wave, 292: electromagnetic wave

The invention claimed is:

1. A manufacturing method of a semiconductor device comprising a first conductor, first and second insulators, and first to third oxides, comprising the steps of:
   forming the first oxide over a substrate;
   forming the second oxide over the first oxide;
   depositing the first insulator over the second oxide;
   forming an opening reaching the first oxide in the first insulator and the second oxide;
   depositing a first oxide film in contact with the first oxide, the second oxide, and the first insulator in the opening;
   depositing a first insulating film over the first oxide film by a PEALD method;
   depositing a first conductive film over the first insulating film; and
   removing part of the first oxide film, part of the first insulating film, and part of the first conductive film until a top surface of the first insulator is exposed to form the third oxide, the second insulator, and the first conductor,
   wherein the second oxide does not overlap with the third oxide, the second insulator, and the first conductor.

2. The manufacturing method of a semiconductor device according to claim 1,
   wherein after the third oxide, the second insulator, and the first conductor are formed, a third insulator is further deposited over the first insulator, the third oxide, the second insulator, and the first conductor, and
   wherein a silicon nitride film is deposited over the third insulator by a PEALD method.

3. The manufacturing method of a semiconductor device according to claim 1,
   wherein the deposition of the first insulating film is performed while the substrate is heated to higher than or equal to 300° C.

4. A manufacturing method of a semiconductor device comprising a first conductor, first and second insulators, and first and second oxides, comprising the steps of:
   forming the first oxide over a substrate;
   forming the second oxide over the first oxide;
   depositing the first insulator over the second oxide;
   forming an opening reaching the first oxide in the first insulator and the second oxide;
   depositing a first insulating film in contact with the first oxide, the second oxide, and the first insulator in the opening by a PEALD method;
   depositing a first conductive film over the first insulating film; and
   removing part of the first insulating film and part of the first conductive film until a top surface of the first insulator is exposed to form the second insulator and the first conductor,
   wherein the second oxide does not overlap with the second insulator and the first conductor.

5. The manufacturing method of a semiconductor device according to claim 4,
   wherein after the second insulator and the first conductor are formed, a third insulator is further deposited over the first insulator, the second insulator, and the first conductor, and
   wherein a silicon nitride film is deposited over the third insulator by a PEALD method.

6. The manufacturing method of a semiconductor device according to claim 4,
   wherein the deposition of the first insulating film is performed while the substrate is heated to higher than or equal to 300° C.

7. A manufacturing method of a semiconductor device comprising a first conductor, first and second insulators, and a first oxide, comprising the steps of:

forming the first oxide over a substrate;

depositing the first insulator over the first oxide;

forming an opening reaching the first oxide in the first insulator;

depositing a first insulating film in contact with the first oxide and the first insulator in the opening by a PEALD method using a first gas containing silicon and a second gas containing at least one of ozone and oxygen;

depositing a first conductive film over the first insulating film; and removing part of the first insulating film and part of the first conductive film until a top surface of the first insulator is exposed to form the second insulator and the first conductor, wherein the first oxide and the first insulator are irradiated with a microwave before the first insulating film is deposited.

8. The manufacturing method of a semiconductor device according to claim 7, wherein after the second insulator and the first conductor are formed, a third insulator is further deposited over the first insulator, the second insulator, and the first conductor, and wherein a silicon nitride film is deposited over the third insulator by a PEALD method.

9. The manufacturing method of a semiconductor device according to claim 7, wherein the deposition of the first insulating film is performed while the substrate is heated to higher than or equal to 300° C.

10. The manufacturing method of a semiconductor device according to claim 7, wherein the first oxide and the first insulator are irradiated with the microwave before the first insulating film is deposited so that hydrogen concentrations in the first oxide and the first insulator are reduced.

11. The manufacturing method of a semiconductor device according to claim 7, wherein the second gas does not contain hydrogen.

* * * * *